US009768207B2

(12) United States Patent
Tsubuku et al.

(10) Patent No.: US 9,768,207 B2
(45) Date of Patent: Sep. 19, 2017

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Atsugi (JP); Shuhei Yoshitomi, Ayase (JP); Takahiro Tsuji, Atsugi (JP); Miyuki Hosoba, Isehara (JP); Junichiro Sakata, Atsugi (JP); Hiroyuki Tomatsu, Atsugi (JP); Masahiko Hayakawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/217,177

(22) Filed: Jul. 22, 2016

(65) Prior Publication Data
US 2016/0329359 A1    Nov. 10, 2016

Related U.S. Application Data

(60) Continuation of application No. 14/521,710, filed on Oct. 23, 2014, now Pat. No. 9,530,806, which is a
(Continued)

(30) Foreign Application Priority Data

Sep. 4, 2009  (JP) .................................. 2009-205328
Sep. 7, 2009  (JP) .................................. 2009-206490

(51) Int. Cl.
*H01L 21/84*    (2006.01)
*H01L 27/12*    (2006.01)
(Continued)

(52) U.S. Cl.
CPC .... *H01L 27/1262* (2013.01); *H01L 21/02554* (2013.01); *H01L 21/02565* (2013.01);
(Continued)

(58) Field of Classification Search
CPC .......... H01L 29/7869; H01L 29/66969; H01L 21/02565; H01L 21/02554;
(Continued)

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

CN    101897031 A    11/2010
EP      1624333 A     2/2006
(Continued)

OTHER PUBLICATIONS

Dembo.H et al., "RFCPUS on Glass and Plastic Substrates Fabricated by TFT Transfer Technology", IEDM 05: Technical Digest of International Electronic Devices Meeting, Dec. 5, 2005, pp. 1067-1069.
(Continued)

*Primary Examiner* — Luan C Thai
(74) *Attorney, Agent, or Firm* — Robinson Intellectual Property Law Office; Eric J. Robinson

(57) ABSTRACT

It is an object to provide a manufacturing method of a structure of a thin film transistor including an oxide semiconductor film, in which threshold voltage at which a channel is formed is positive and as close to 0 V as possible. A protective insulating layer is formed to cover a thin film transistor including an oxide semiconductor layer that is dehydrated or dehydrogenated by first heat treatment, and second heat treatment at a temperature that is lower than that
(Continued)

of the first heat treatment, in which the increase and decrease in temperature are repeated plural times, is performed, whereby a thin film transistor including an oxide semiconductor layer, in which threshold voltage at which a channel is formed is positive and as close to 0 V as possible without depending on the channel length, can be manufactured.

15 Claims, 37 Drawing Sheets

Related U.S. Application Data continuation of application No. 13/917,012, filed on Jun. 13, 2013, now Pat. No. 8,889,496, which is a continuation of application No. 13/558,368, filed on Jul. 26, 2012, now Pat. No. 8,466,014, which is a division of application No. 12/871,122, filed on Aug. 30, 2010, now Pat. No. 8,236,627.

(51) Int. Cl.
    *H01L 21/02*     (2006.01)
    *H01L 29/786*    (2006.01)
    *H01L 29/66*     (2006.01)

(52) U.S. Cl.
    CPC ...... *H01L 21/02631* (2013.01); *H01L 27/127* (2013.01); *H01L 27/1248* (2013.01); *H01L 29/66765* (2013.01); *H01L 29/66969* (2013.01); *H01L 29/7869* (2013.01); *H01L 21/02595* (2013.01); *H01L 21/02667* (2013.01)

(58) Field of Classification Search
    CPC .............. H01L 21/02631; H01L 27/127; H01L 27/1248; H01L 27/1262
    USPC ........................................................ 438/149
    See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,365,805 B2 | 4/2008 | Maekawa et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,058 B2 | 7/2009 | Yamazaki et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,749,825 B2 | 7/2010 | Honda |
| 7,968,383 B2 | 6/2011 | Honda et al. |
| 7,994,508 B2 | 8/2011 | Ye |
| 8,093,589 B2 | 1/2012 | Sugihara et al. |
| 8,207,014 B2 | 6/2012 | Sasaki et al. |
| 8,222,098 B2 | 7/2012 | Honda |
| 8,236,627 B2 | 8/2012 | Tsubuku et al. |
| 8,294,148 B2 | 10/2012 | Ye |
| 8,384,077 B2 | 2/2013 | Yano et al. |
| 8,466,014 B2 | 6/2013 | Tsubuku et al. |
| 8,502,217 B2 | 8/2013 | Sato et al. |
| 8,557,641 B2 | 10/2013 | Sasaki et al. |
| 8,785,240 B2 | 7/2014 | Watanabe |
| 8,785,990 B2 | 7/2014 | Honda |
| 8,786,090 B2 | 7/2014 | Gotou et al. |
| 8,889,496 B2 | 11/2014 | Tsubuku et al. |
| 8,981,369 B2 | 3/2015 | Yano et al. |
| 9,252,279 B2 | 2/2016 | Watanabe et al. |
| 9,530,806 B2 * | 12/2016 | Tsubuku ............ H01L 27/1262 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0160283 A1 | 8/2003 | Tanaka et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0262318 A1 | 11/2007 | Shoji et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0081178 A1 | 4/2008 | Hinotsu et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |

(56) References Cited

U.S. PATENT DOCUMENTS

| | | |
|---|---|---|
| 2008/0277663 A1 | 11/2008 | Kang et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0050884 A1 | 2/2009 | Ye |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0134407 A1 | 5/2009 | Inoue et al. |
| 2009/0152506 A1 | 6/2009 | Umeda et al. |
| 2009/0152541 A1 | 6/2009 | Maekawa et al. |
| 2009/0159880 A1 | 6/2009 | Honda et al. |
| 2009/0173938 A1 | 7/2009 | Honda et al. |
| 2009/0189155 A1 | 7/2009 | Akimoto |
| 2009/0189156 A1 | 7/2009 | Akimoto |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0184253 A1 | 7/2010 | Hirai et al. |
| 2010/0203673 A1 | 8/2010 | Hayashi et al. |
| 2010/0283049 A1 | 11/2010 | Sato et al. |
| 2011/0049511 A1 | 3/2011 | Yano et al. |
| 2011/0168994 A1 | 7/2011 | Kawashima et al. |
| 2013/0146452 A1 | 6/2013 | Yano et al. |
| 2014/0326998 A1 | 11/2014 | Honda |
| 2016/0079433 A1 | 3/2016 | Watanabe et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-029293 A | 1/2003 |
| JP | 2003-086000 A | 3/2003 |
| JP | 2003-086808 A | 3/2003 |
| JP | 2003-324201 A | 11/2003 |
| JP | 2004-103957 A | 4/2004 |
| JP | 2004-273614 A | 9/2004 |
| JP | 2004-273732 A | 9/2004 |
| JP | 2006-080494 A | 3/2006 |
| JP | 2007-081362 A | 3/2007 |
| JP | 2007-096055 A | 4/2007 |
| JP | 2007-123861 A | 5/2007 |
| JP | 2007-134687 A | 5/2007 |
| JP | 2007-163467 A | 6/2007 |
| JP | 2007-171932 A | 7/2007 |
| JP | 2008-160058 A | 7/2008 |
| JP | 2008-281988 A | 11/2008 |
| JP | 2009-141002 A | 6/2009 |
| JP | 2009-265271 A | 11/2009 |
| JP | 2010-045263 A | 2/2010 |
| JP | 2010-098280 A | 4/2010 |
| JP | 2010-535431 | 11/2010 |
| JP | 2011-077514 A | 4/2011 |
| JP | 2013-065843 A | 4/2013 |
| KR | 2008-0099084 A | 11/2008 |
| TW | 200910468 | 3/2009 |
| WO | WO-2004/114391 | 12/2004 |
| WO | WO-2007/043493 | 4/2007 |
| WO | WO-2008/126879 | 10/2008 |
| WO | WO-2009/018509 | 2/2009 |
| WO | WO-2009/041713 | 4/2009 |
| WO | WO-2009/072532 | 6/2009 |
| WO | WO-2009/075281 | 6/2009 |
| WO | WO-2011/027715 | 3/2011 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGa_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanded Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15,4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

International Search Report (Application No. PCT/JP2010/064544) Dated Sep. 21, 2010.

Written Opinion (Application No. PCT/JP2010/064544) Dated Sep. 21, 2010.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Nakamura.M, "Synthesis of Homologous Compound with New Long-Period Structure", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al,, "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201080039723.2) Dated May 6, 2014.

Taiwanese Office Action (Application No. 099129353) Dated Jan. 20, 2015.

Taiwanese Office Action (Application No. 105110572) Dated Oct. 20, 2016.

Chinese Office Action (Application No. 2015101213932.9) dated May 3, 2017.

\* cited by examiner

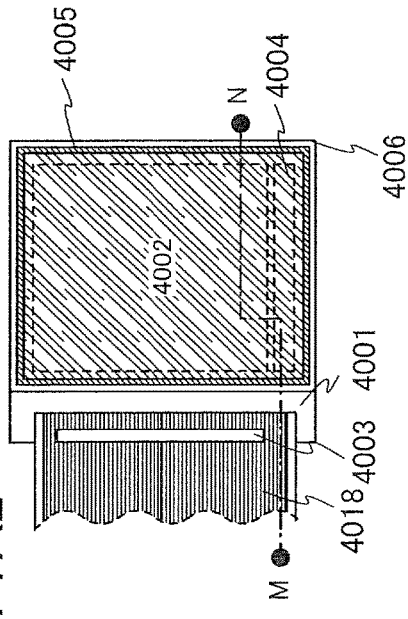
FIG. 7A1
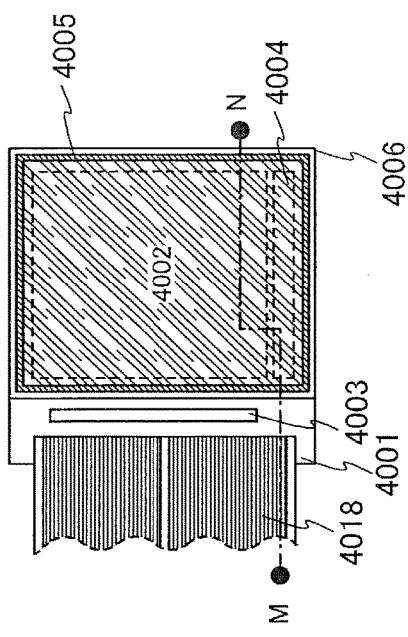
FIG. 7A2
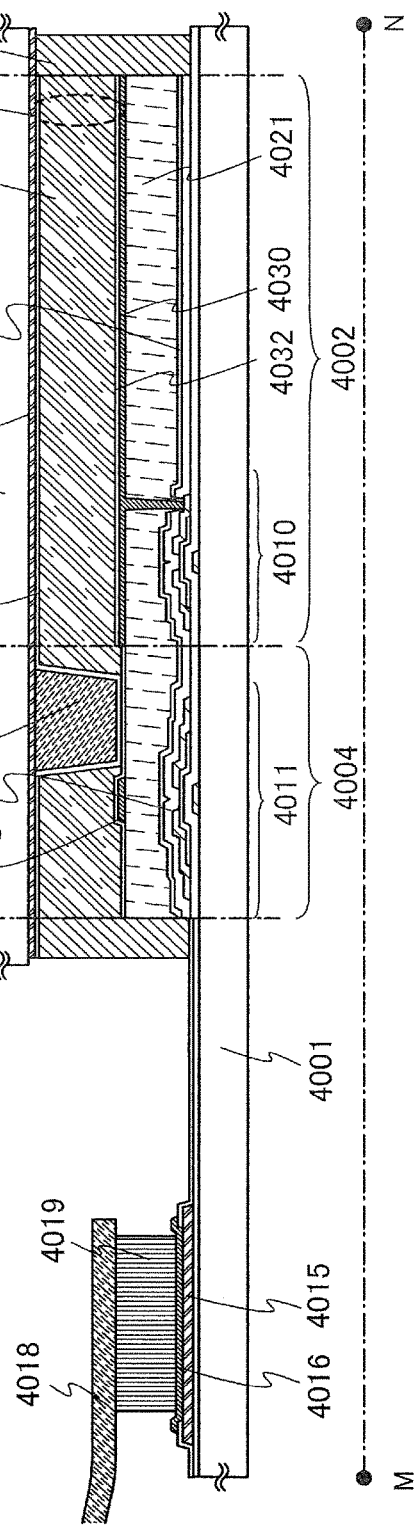
FIG. 7B

MANUFACTURING METHOD OF SEMICONDUCTOR DEVICE

TECHNICAL FIELD

The present invention relates to a manufacturing method of a semiconductor device including an oxide semiconductor.

In this specification, a semiconductor device means all types of devices which can function by utilizing semiconductor characteristics, and an electrooptic device, a semiconductor circuit, and electronic equipment are all semiconductor devices.

BACKGROUND ART

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as ICs and electro-optical devices, and thin film transistors that are used as switching elements in image display devices are, in particular, urgently developed. There exists a wide variety of metal oxides and such metal oxides are used for various applications. Indium oxide is a well-known material and is used as a transparent electrode material which is necessary for liquid crystal displays and the like.

Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861
[Patent Document 2] Japanese Published Patent Application No. 2007-96055

DISCLOSURE OF INVENTION

In an active matrix display device, electric characteristics of thin film transistors included in a circuit are important, and performance of the display device depends on the electric characteristics. Among the electric characteristics of thin film transistors, threshold voltage ($V_{th}$) is particularly important. Even when the field effect mobility is high, if the threshold voltage value is high or is on the minus side, it is difficult to control the circuit. When a thin film transistor has a large threshold voltage value and a large absolute value of the threshold voltage, the thin film transistor cannot perform the switching function as a TFT and may be a load when the transistor is driven at low voltage. Further, when the threshold voltage value is on the minus side, current tends to flow between the source and drain electrodes even if the gate voltage is 0 V, that is, the transistor tends to be normally on.

In the case of an n-channel thin film transistor, it is preferable that after application of the positive voltage as gate voltage, a channel be formed and drain current begin to flow. A transistor in which a channel is not formed unless the driving voltage is increased and a transistor in which a channel is formed and drain current flows even in the case of the negative voltage state are unsuitable for a thin film transistor used in a circuit.

It is an object to provide a manufacturing method of a structure of a thin film transistor including an oxide semiconductor film, in which threshold voltage at which a channel is formed is positive and as close to 0 V as possible.

The channel length of a thin film transistor may be shortened for higher speed operation and lower power consumption of the thin film transistor. However, there is a problem of a so-called short channel effect that the threshold voltage is likely to shift to the minus side particularly in a thin film transistor having a short channel length.

Another object is to reduce variation in threshold voltage of thin film transistors including an oxide semiconductor film. In particular, in a liquid crystal display device, in the case where there is a large variation between elements, display unevenness due to variation in the threshold voltage might be caused.

According to an embodiment of the present invention disclosed in this specification, in a manufacturing method of a semiconductor device, a protective insulating layer is formed to cover a thin film transistor including an oxide semiconductor layer that is dehydrated or dehydrogenated by first heat treatment, and second heat treatment at a temperature that is lower than that of the first heat treatment, in which the increase and decrease in temperature are repeated plural times, is performed.

According to an embodiment of the present invention disclosed in this specification, in a manufacturing method of a semiconductor device, a protective insulating layer is formed to cover a thin film transistor including an oxide semiconductor layer that is dehydrated or dehydrogenated by first heat treatment, and second heat treatment is performed continuously for a time longer than that of the first heat treatment at a temperature that is lower than that of the first heat treatment.

An embodiment of the present invention disclosed in this specification is a manufacturing method of a semiconductor device which includes the steps of forming a gate electrode layer over a substrate having an insulating surface; forming a gate insulating layer over the gate electrode layer; forming an oxide semiconductor layer over the gate insulating layer; performing first heat treatment after the oxide semiconductor layer is formed; forming a source electrode layer and a drain electrode layer over the oxide semiconductor layer; forming a protective insulating layer which is in contact with part of the oxide semiconductor layer, over the gate insulating layer, the oxide semiconductor layer, the source electrode layer, and the drain electrode layer; and performing second heat treatment in which increase and decrease in temperature are repeated plural times, after the protective insulating layer is formed. The second heat treatment is performed at a temperature that is lower than a temperature of the first heat treatment.

Note that the channel length of the oxide semiconductor layer is preferably 20 μm or less. The first heat treatment is preferably performed in a nitrogen atmosphere or a rare gas atmosphere. The first heat treatment is preferably performed at a temperature higher than or equal to 350° C. and lower than or equal to 750° C. The second heat treatment is preferably performed in an air atmosphere, an oxygen atmosphere, a nitrogen atmosphere, or a rare gas atmosphere. In the second heat treatment, the temperature is preferably increased to a temperature higher than or equal to 100° C. and lower than or equal to 300° C. In the second heat treatment, the temperature is preferably decreased to room temperature after the increase in temperature. The second heat treatment preferably includes a high temperature maintenance period between the increase and the decrease in temperature and a low temperature maintenance period between the decrease and the increase in temperature, and lengths of time of the high temperature maintenance period and the low temperature maintenance period are preferably each more than or equal to 1 minute and less than or equal to 60 minutes. In the second heat treatment, the increase and decrease in temperature are preferably repeated 3 times to 50 times.

With the above structure, at least one of the above objects is achieved.

An embodiment of the present invention disclosed in this specification is a manufacturing method of a semiconductor device which includes the steps of forming a gate electrode layer over a substrate having an insulating surface; forming a gate insulating layer over the gate electrode layer; forming an oxide semiconductor layer over the gate insulating layer; performing first heat treatment after the oxide semiconductor layer is formed; forming a source electrode layer and a drain electrode layer over the oxide semiconductor layer; forming a protective insulating layer which is in contact with part of the oxide semiconductor layer, over the gate insulating layer, the oxide semiconductor layer, the source electrode layer, and the drain electrode layer; and then performing second heat treatment in which a temperature is kept for a time longer than that of the first heat treatment after an increase in temperature. The second heat treatment is performed at a temperature that is lower than a temperature of the first heat treatment.

Note that the channel length of the oxide semiconductor layer is preferably 20 μm or less. The first heat treatment is preferably performed in a nitrogen atmosphere or a rare gas atmosphere. The first heat treatment is preferably performed at a temperature higher than or equal to 350° C. and lower than or equal to 750° C. The second heat treatment is preferably performed in an air atmosphere, an oxygen atmosphere, a nitrogen atmosphere, or a rare gas atmosphere. In the second heat treatment, the temperature is preferably increased to a temperature higher than or equal to 100° C. and lower than or equal to 300° C. The length of time of the second heat treatment is preferably more than or equal to 1 hour and less than or equal to 50 hours.

The oxide semiconductor used in this specification is formed into a thin film represented by $InMO_3(ZnO)_m$ (m>0), and a thin film transistor whose oxide semiconductor layer is formed using the thin film is manufactured. Note that m is not always an integer. M represents one or more metal elements selected from Ga, Fe, Ni, Mn, and Co. For example, M may be Ga or may include the above metal element in addition to Ga; for example, M may be Ga and Ni or Ga and Fe. Moreover, in the above oxide semiconductor, in some cases, a transition metal element such as Fe or Ni or an oxide of the transition metal is included as an impurity element in addition to a metal element included as M. In this specification, among the oxide semiconductor layers whose composition formulae are represented by $InMO_3 (ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based thin film.

As the oxide semiconductor applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be included in the oxide semiconductor layer. Addition of silicon oxide ($SiO_x$ (x>0)) which hinders crystallization into the oxide semiconductor layer can suppress crystallization of the oxide semiconductor layer at the time when heat treatment is performed after the formation of the oxide semiconductor layer in the manufacturing process. Note that the preferable state of the oxide semiconductor layer is amorphous, or partial crystallization thereof is acceptable.

Depending on conditions of the heat treatment and the material of the oxide semiconductor layer, the oxide semiconductor layer in an amorphous state may crystallize to be a microcrystalline film or a polycrystalline film. Even when the oxide semiconductor layer is a microcrystalline film or a polycrystalline film, switching characteristics as a TFT can be obtained.

Note that ordinal numbers such as "first" and "second" in this specification are used for convenience. Therefore, they do not denote the order of steps, the stacking order of layers, and particular names which specify the invention.

A protective insulating layer is formed to cover a thin film transistor including an oxide semiconductor layer that is dehydrated or dehydrogenated by first heat treatment, and second heat treatment at a temperature that is lower than that of the first heat treatment, in which the increase and decrease in temperature are repeated plural times, is performed, whereby a thin film transistor including an oxide semiconductor layer in which threshold voltage at which a channel is formed is positive and as close to 0 V as possible without depending on the channel length can be manufactured.

BRIEF DESCRIPTION OF DRAWINGS

In the accompanying drawings:

FIGS. 7A1, 7A2, and 7B each illustrate a semiconductor device;

BEST MODE FOR CARRYING OUT THE INVENTION

Figure 1A:
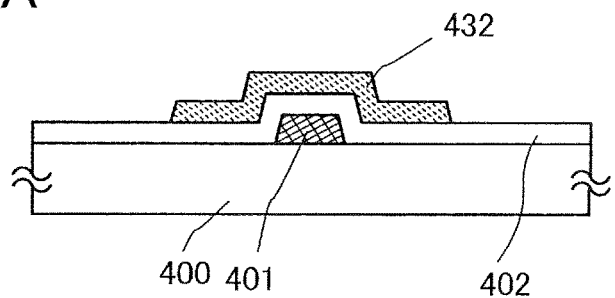
FIGS. 1A to 1E are cross-sectional views illustrating a manufacturing process of an embodiment of the present invention.

Hereinafter, embodiments of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments below.

Embodiment 1

In this embodiment, an embodiment of a manufacturing method of a thin film transistor 461 illustrated in FIG. 1E will be described with reference to FIGS. 1A to 1E which are cross-sectional views of the manufacturing process of the thin film transistor. Here, the thin film transistor 461 illustrated in FIG. 1E has a bottom-gate structure called a channel-etched structure.

First, a gate electrode layer 401 is provided over a substrate 400 having an insulating surface, using a photolithography process with the use of a photomask. Note that a resist mask may be formed by an inkjet method. A photomask is not used when the resist mask is formed by an inkjet method, which results in a reduction of manufacturing costs.

As the substrate 400, a substrate whose strain point is higher than or equal to 730° C. may be used when the temperature of the heat treatment to be performed later is high. In the case of using a glass substrate as the substrate 400, for example, a glass material such as aluminosilicate glass, aluminoborosilicate glass, or barium borosilicate glass is used. Note that by containing a larger amount of barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator such as a ceramic substrate, a quartz glass substrate, a quartz substrate, or a sapphire substrate may be used instead of the glass substrate. Alternatively, crystallized glass or the like may be used.

Further, an insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

A metal conductive film can be used as the gate electrode layer 401. As a material of the metal conductive film, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive film may have a single-layer structure, a two-layer structure, or a stacked-layer structure of four or more layers.

Next, a gate insulating layer 402 is formed over the gate electrode layer 401.

The gate insulating layer 402 can be formed to have a single-layer structure of a silicon oxide layer, a silicon nitride layer, a silicon oxynitride layer, or a silicon nitride oxide layer or a stacked-layer structure thereof by a plasma CVD method, a sputtering method, or the like. For example, a silicon oxynitride layer may be formed by a plasma CVD method using $SiH_4$, oxygen, and nitrogen as deposition gases. The gate insulating layer 402 has a thickness from 100 nm to 500 nm inclusive. In the case of a stacked-layer structure, a first gate insulating layer having a thickness from 50 nm to 200 nm inclusive and a second gate insulating layer having a thickness from 5 nm to 300 nm inclusive are stacked in this order, for example.

In this embodiment, the gate insulating layer 402 is a silicon oxide film having a thickness of 100 nm formed by a plasma CVD method.

Before the formation of an oxide semiconductor film, heat treatment (higher than or equal to 400° C. and lower than the strain point of the substrate) may be performed in an inert gas atmosphere (such as a nitrogen atmosphere, a helium atmosphere, a neon atmosphere, or an argon atmosphere) to remove impurities such as hydrogen and water contained in the gate insulating layer 402.

Next, over the gate insulating layer 402, an oxide semiconductor film is formed to a thickness greater than or equal to 5 nm and less than or equal to 200 nm, preferably greater than or equal to 10 nm and less than or equal to 50 nm. The preferable thickness is 50 nm or less, in order that the oxide semiconductor film can have an amorphous structure even when heat treatment for dehydration or dehydrogenation is performed after the formation of the oxide semiconductor film. Thin thickness of the oxide semiconductor film can suppress crystallization of an oxide semiconductor layer when heat treatment is performed after the oxide semiconductor layer is formed.

Note that before the oxide semiconductor film is formed by a sputtering method, dust on a surface of the gate insulating layer 402 is preferably removed by reverse sputtering in which an argon gas is introduced and plasma is generated. The reverse sputtering is a method in which, without application of a voltage to a target side, a voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, or the like may be used.

The oxide semiconductor film is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed by a sputtering method with the use of an In—Ga—Zn—O-based oxide semiconductor target for film formation. Further, the oxide semiconductor film 130 can be formed by a sputtering method in a rare gas (typically argon) atmosphere, an oxygen atmosphere, or an atmosphere of a rare gas (typically argon) and oxygen. In the case of using a sputtering method, it is preferable that deposition is performed with the use of a target containing $SiO_2$ at greater than or equal to 2 wt % and less than or equal to 10 wt %, so that $SiO_x$ (x>0) which hinders crystallization is contained in the oxide semiconductor film; in this way, the oxide semiconductor film can be prevented from being crystallized in heat treatment for dehydration or dehydrogenation to be performed later.

The relative density of the oxide semiconductor in the oxide semiconductor target for film formation is preferably 99% or more, which results in a reduction of the impurity concentration in the formed oxide semiconductor film; thus, a thin film transistor having high electric characteristics or reliability can be obtained. In this embodiment, an oxide semiconductor target having a relative density of oxide semiconductor of 97% is used.

Here, the oxide semiconductor film is formed in an atmosphere of argon and oxygen (argon:oxygen=30 sccm:20 sccm and the oxygen flow ratio is 40%), with the use of an oxide semiconductor target containing In, Ga, and Zn ($In_2O_3$:$Ga_2O_3$:ZnO=1:1:1 [molar ratio] and In:Ga:Zn=1:1:0.5 [atomic ratio]), under conditions as follows: the distance between the substrate and the target is 100 mm; the pressure is 0.2 Pa; and the direct current (DC) power source is 0.5 kW. Note that a pulse direct current (DC) power source is preferable because powder substances (also referred to as particles or dust) generated in film formation can be reduced and the film thickness can be uniform. The In—Ga—Zn—O-based thin film is formed to a thickness of 5 nm to 200 nm. In this embodiment, as the oxide semiconductor film, a 20-nm-thick In—Ga—Zn—O-based thin film is formed by a sputtering method with the use of an In—Ga—Zn—O-based oxide semiconductor target for film formation.

Examples of a sputtering method include an RF sputtering method in which a high-frequency power source is used as a sputtering power source, a DC sputtering method in which a direct-current power source is used, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in one chamber, or a film of plural kinds of materials can be formed by electric discharge at the same time in one chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is applied to a substrate as well during deposition.

The gate insulating layer 402 and the oxide semiconductor film may be formed successively without exposure to the air. Film formation without exposure to the air makes it possible to obtain an interface between the stacked layers, which is not contaminated by atmospheric components or impurity elements floating in the air such as water or hydrocarbon. Therefore, variation in characteristics of the thin film transistors can be reduced.

Next, the oxide semiconductor film is processed into an island-shaped oxide semiconductor layer 432 by a photolithography step (see FIG. 1A). A resist mask for forming the island-shaped oxide semiconductor layer 432 may be formed by an ink jet method. A photomask is not used when the resist mask is formed by an inkjet method, which results in a reduction of manufacturing costs.

Then, first heat treatment is performed to dehydrate or dehydrogenate the oxide semiconductor layer 432. The temperature of the first heat treatment for dehydration or dehydrogenation is set to higher than or equal to 350° C. and lower than or equal to 750° C., preferably greater than or equal to 425° C. Note that in the case where the temperature is 425° C. or higher, the heat treatment time may be one hour or shorter, whereas in the case where the temperature is lower than 425° C., the heat treatment time is set to longer than one hour. Here, the substrate is introduced into an electric furnace which is one example of a heat treatment apparatus, and the oxide semiconductor layer is subjected to heat treatment under a nitrogen atmosphere. Then, the oxide semiconductor layer is not exposed to the air, and water and hydrogen can be prevented from being contained again in the oxide semiconductor layer. In this manner, the oxide semiconductor layer 432 is formed. In this embodiment, slow cooling is performed from a heating temperature Tat which the dehydration or dehydrogenation is performed on the oxide semiconductor layer 432 to such a temperature that water is not contained again, specifically, to a temperature that is lower than the heating temperature T by 100° C. or more, with use of the same furnace under a nitrogen atmosphere. The dehydration or dehydrogenation may be performed under a rare gas (e.g., helium, neon, or argon) atmosphere or the like without limitation to a nitrogen atmosphere.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have a purity of 6N (99.9999%) or more, more preferably, 7N (99.99999%) or more; that is, an impurity concentration is preferably set to 1 ppm or lower, more preferably, 0.1 ppm or lower.

The first heat treatment can be performed using a heating method with the use of an electric furnace. However, the apparatus for the first heat treatment is not limited to the electric furnace and may be the one provided with a device for heating a process object using heat conduction or heat radiation from a heating element such as a resistance heating element. For example, an RTA (rapid thermal annaling) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

Depending on the conditions of the first heat treatment and the material of the oxide semiconductor layer, the oxide semiconductor layer may crystallize to be microcrystalline or polycrystalline. For example, the oxide semiconductor layer may crystallize to become a microcrystalline semiconductor having a degree of crystallization of 80% or more, or 90% or more. Further, depending on the material of the oxide semiconductor layer, the oxide semiconductor layer may be an oxide semiconductor containing no crystal.

The first heat treatment may be performed on the oxide semiconductor film before being processed into the island-shaped oxide semiconductor layer 432, instead of on the island-shaped oxide semiconductor layer 432. In that case, after the first heat treatment, the substrate is taken out of the heating apparatus and a photolithography step is performed.

Next, a conductive film for forming a source electrode layer and a drain electrode layer is formed over the gate insulating layer 402 and the oxide semiconductor layer 432.

The conductive film for forming a source electrode layer and a drain electrode layer can be formed using a metal conductive film in a manner similar to that of the gate electrode layer 401. As a material of the metal conductive film, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive film may have a single-layer structure, a two-layer structure, or a stacked-layer structure of four or more layers.

Figure 1B:
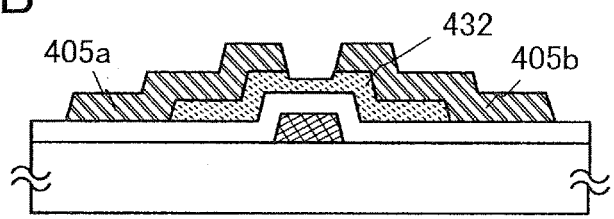

The conductive film for forming a source electrode layer and a drain electrode layer is subjected to a photolithography step using a photomask, so that a source electrode layer 405a and a drain electrode layer 405b are formed (see FIG. 1B). At this time, part of the oxide semiconductor layer 432 is also etched, whereby the oxide semiconductor layer 432 having a groove (depression) is formed. Note that the channel length of the thin film transistor is defined as the distance between the source electrode layer 405a and the drain electrode layer 405b.

Note that a resist mask used for forming the source and drain electrode layers 405a and 405b may be formed by an inkjet method. A photomask is not used when the resist mask is formed by an inkjet method, which results in a reduction of manufacturing costs.

Figure 1C:
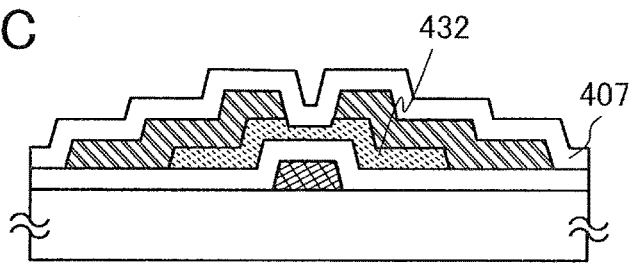

Next, a protective insulating layer 407 which covers the gate insulating layer 402, the oxide semiconductor layer 432, the source electrode layer 405a, and the drain electrode layer 405b and which is in contact with part of the oxide semiconductor layer 432 is formed (see FIG. 1C). The protective insulating layer 407 can be formed to a thickness of at least 1 nm or more using a method by which impurities such as water and hydrogen are prevented from being mixed to the protective insulating layer 407, such as a sputtering method as appropriate. Here, the protective insulating layer 407 is formed by a sputtering method. The protective insulating layer 407 which is in contact with part of the oxide semiconductor layer 432 does not include impurities such as moisture, hydrogen ions, and OH$^-$ and is formed using an inorganic insulating film which prevents entry of these from the outside. A silicon oxide film is preferably used, and alternatively a silicon nitride oxide film, a silicon nitride film, an aluminum oxide film, an aluminum oxynitride film, or an aluminum nitride film may be used.

Further alternatively, the protective insulating layer 407 may have such a structure that a silicon nitride film or an aluminum nitride film is stacked over a silicon oxide film, a silicon nitride oxide film, an aluminum oxide film, or an aluminum oxynitride film. In particular, the silicon nitride film is preferable because it does not contain an impurity such as moisture, a hydrogen ion, or OH$^-$ and prevents entry thereof from the outside.

Here, in the case where water or hydrogen enters the oxide semiconductor layer, there is a fear that the oxide semiconductor layer comes to have n-type conductivity and the thin film transistor becomes normally on. Further, in the case where water or hydrogen enters the oxide semiconductor layer, there is also a fear that reliability of the thin film transistor is reduced. Therefore, it is important to prevent entry of an impurity such as water or hydrogen into the oxide semiconductor layer 432 with the use of the protective insulating layer 407.

Furthermore, in the case where water or hydrogen enters the protective insulating layer 407, there is a fear that oxygen in the oxide semiconductor layer is extracted by water or hydrogen in the protective insulating layer 407, the oxide semiconductor layer comes to have n-type conductivity, and the thin film transistor becomes normally on. Further, in the case where water or hydrogen enters the protective insulating layer 407, there is also a fear that reliability of the thin film transistor is reduced. Therefore, it is important to prevent entry of an impurity such as water or hydrogen into the protective insulating layer 407.

In this embodiment, as the protective insulating layer 407, a 300-nm-thick silicon oxide film is formed. The substrate temperature in film formation may be from room temperature to 300° C. or lower and, in this embodiment, is 100° C. The silicon oxide film can be formed by a sputtering method under a rare gas (typically, argon) atmosphere, an oxygen atmosphere, or a mixed atmosphere of a rare gas (typically, argon) and oxygen. A silicon oxide target or a silicon target can be used as a target. For example, with the use of a silicon target, a silicon oxide film can be formed by a sputtering method in an atmosphere including oxygen and nitrogen.

Figure 1D:
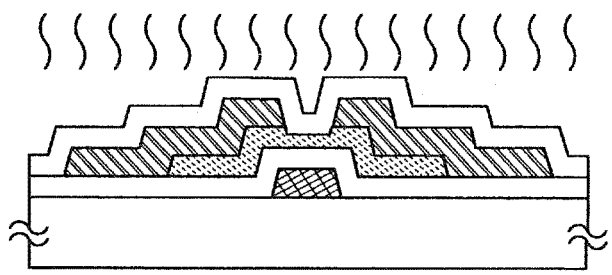
Figure 1E:
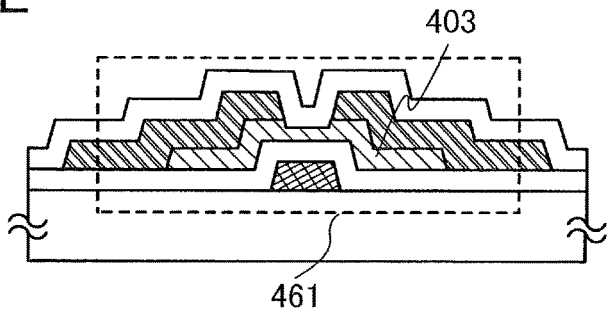

Next, second heat treatment in which the increase and decrease in temperature are repeated plural times under an air atmosphere, an oxygen atmosphere, a nitrogen atmosphere, or a rare gas (such as helium, neon, or argon) atmosphere is performed on the source electrode layer 405a, the drain electrode layer 405b, the gate insulating layer 402, and the oxide semiconductor layer 432, whereby an oxide semiconductor layer 403 is formed (see FIG. 1D and FIG. 1E). Here, the second heat treatment is performed at temperatures that are lower than that of the first heat treatment. In this embodiment, the substrate is introduced into an electric furnace which is one example of a heat treatment apparatus, and the oxide semiconductor layer is subjected to the second heat treatment under an oxygen atmosphere.

Figure 2:
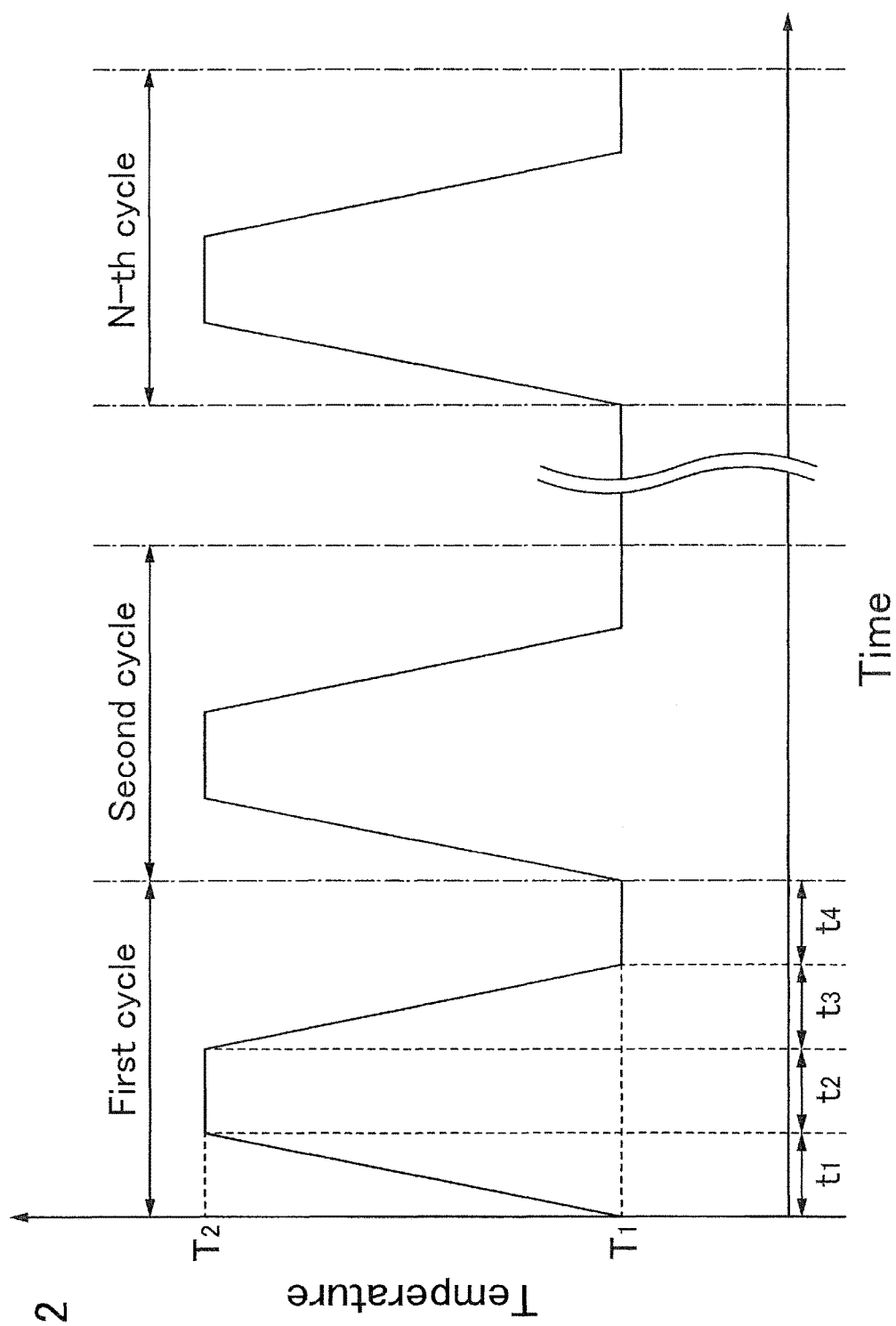
FIG. 2 is a graph showing a relationship between time and temperature of second heat treatment.

In the second heat treatment, a cycle consisting of a temperature increasing period, a high temperature maintenance period, a temperature decreasing period, and a low temperature maintenance period is repeated plural times. The second heat treatment step is shown in the graph of FIG. 2 where the vertical axis indicates temperature and the horizontal axis indicates time. As shown in FIG. 2, the cycle of the second heat treatment consists of a temperature increasing period in time $t_1$ where the temperature is increased from temperature $T_1$ to temperature $T_2$, a high temperature maintenance period in time $t_2$ where the temperature $T_2$ is maintained, a temperature decreasing period in time $t_3$ where the temperature is decreased from the temperature $T_2$ to the temperature $T_1$, and a low temperature maintenance period in time $t_4$ where the temperature $T_1$ is maintained. After the first cycle finishes, the second cycle starts similarly, and the cycle is repeated N times. Then, the second heat treatment finishes.

Here, the temperature $T_1$ is preferably about room temperature, and the temperature $T_2$ is preferably higher than or equal to 100° C. and lower than or equal to 300° C., more preferably higher than or equal to 125° C. and lower than or equal to 250° C. Further, it is preferable that the cycle of the second heat treatment is repeated 3 times to 50 times. In addition, the time $t_1$, the time $t_2$, the time $t_3$, and the time $t_4$ are each preferably 1 minute to 60 minutes approximately. It is needless to say that the time $t_1$, the time $t_2$, the time $t_3$, and the time $t_4$ may be set to different lengths of time as appropriate. Further, any two or more of the time $t_1$, the time $t_2$, the time $t_3$, and the time $t_4$ may have the same length of time. Note that the time $t_1$, the time $t_2$, the time $t_3$, and the time $t_4$ are each not necessarily within the range of 1 minute to 60 minutes approximately. For example, the time $t_2$ and the time $t_4$ may be set to less than 1 minute so that the increase and decrease in temperature are frequently repeated in the graph of FIG. 2 showing the second heat treatment.

Further, it is not necessary that completely the same cycle is repeated plural times in the second heat treatment. For example, every cycle may have different temperatures of the temperature $T_1$ and the temperature $T_2$ and different lengths of time of the times $t_1$ to $t_4$.

In the temperature decreasing period, a cooled gas may be blown in order to decrease the substrate temperature. The substrate temperature can be decreased more rapidly by a blow of a cooled gas than by natural cooling.

Here, a dangling bond formed at an interface between the gate insulating layer 402 and the oxide semiconductor layer 432 and an interface between the oxide semiconductor layer 432 and the protective insulating layer 407 or a space produced in the oxide semiconductor layer 432 by dehydration or dehydrogenation of the first heat treatment can be thought as a reason why the threshold voltage of the thin film transistor is far away from 0 V or a reason why variation in threshold voltage of plural thin film transistors over one substrate is caused.

However, the second heat treatment allows the dangling bond at the interface between the gate insulating layer 402 and the oxide semiconductor layer 432 and the interface between the oxide semiconductor layer 432 and the protective insulating layer 407 to be terminated or atoms in the periphery of the space in the oxide semiconductor layer 432 to be rearranged gradually; accordingly, the oxide semiconductor layer 403 in which the structures of the above-described portions are stabilized can be formed.

In the case where a silicon oxide film is used as the protective insulating layer 407, it is supposed that a hydrogen atom in a hydroxyl group which is bonded to a metal atom in the oxide semiconductor layer 432 is extracted by a dangling bond of an oxygen atom bonded to silicon in the silicon oxide film and, accordingly, a metal oxide and silicon to which the hydroxyl group is bonded are formed. This allows the oxide semiconductor layer 403 to be further dehydrogenated and reliability of the thin film transistor can be increased.

Therefore, in the thin film transistor including the oxide semiconductor layer 403, threshold voltage at which a channel is formed can be positive and as close to 0 V as possible. In particular, even in a thin film transistor in which the channel length is 20 μm or shorter, threshold voltage at which a channel is formed can be positive and as close to 0 V as possible in a similar manner. Further, field effect mobility can also be increased by this second heat treatment.

Further, even in the case where a plurality of thin film transistors including the oxide semiconductor layer 403 is formed over one substrate, the threshold voltage of the thin film transistors can be prevented from being varied.

In addition, the amount of shift in the threshold voltage can be reduced in a BT stress test (bias-temperature stress test); thus, a highly reliable thin film transistor can be obtained. In this specification, the BT stress test (bias-temperature stress test) refers to a test in which a high gate voltage is applied to a thin film transistor under a high-temperature atmosphere.

Therefore, in the case where a thin film transistor in a pixel portion of a display device is manufactured using a manufacturing method described in this embodiment, display unevenness due to variation in the threshold voltage of thin film transistors of respective pixels can be suppressed.

Further, in the case where a thin film transistor in a driver circuit portion of a display device is manufactured using a manufacturing method described in this embodiment, the channel length can be shortened without causing minus shift of the threshold voltage, whereby high speed operation and lower power consumption of the thin film transistor in the driver circuit portion can be achieved.

Note that in the second heat treatment, it is preferable that water, hydrogen, and the like be not contained in oxygen, nitrogen, or a rare gas such as helium, neon, or argon. Alternatively, it is preferable that nitrogen or a rare gas such as helium, neon, or argon introduced into a heat treatment apparatus have a purity of 6N (99.9999%) or more, more preferably, 7N (99.99999%) or more; that is, an impurity concentration is preferably set to 1 ppm or lower, more preferably, 0.1 ppm or lower.

The second heat treatment can be performed using a heating method with the use of an electric furnace.

Although the second heat treatment is performed right after the formation of the protective insulating layer 407 in this embodiment, the second heat treatment may be performed after formation of an interlayer film, a wiring layer, or the like over the protective insulating layer. In other words, the second heat treatment may be performed anytime as long as it is performed after the formation of the protective insulating layer 407. For example, in the case where a thin film transistor used in a pixel portion of a display device is manufactured, the second heat treatment may be performed after formation of a pixel electrode layer.

Further, before the second heat treatment, heat treatment (preferably at higher than or equal to 200° C. and lower than or equal to 400° C.) may be performed in an inert gas atmosphere or a nitrogen gas atmosphere. Here, this heat treatment is preferably performed at a temperature that is lower than the temperature of the first heat treatment and higher than the temperature of the second heat treatment. For example, this heat treatment may be performed at 250° C. in a nitrogen atmosphere for about 1 hour.

Through the above-described process, the channel-etched thin film transistor 461 having the following structure can be formed: the gate electrode layer 401 is provided over the substrate 400 that is a substrate having an insulating surface, the gate insulating layer 402 is provided over the gate electrode layer 401, the oxide semiconductor layer 403 is provided over the gate insulating layer 402, the source and drain electrode layers 405a and 405b are provided over the oxide semiconductor layer 403, and the protective insulating layer 407 which is in contact with part of the oxide semiconductor layer 403 and covers the gate insulating layer 402, the oxide semiconductor layer 403, and the source and drain electrode layers 405a and 405b is provided (see FIG. 1E).

Although a thin film transistor having a single-gate structure has been described as the thin film transistor 461, a thin film transistor having a multi-gate structure which includes a plurality of channel formation regions or a thin film transistor having a structure in which a second gate electrode layer is provided over the protective insulating layer 407 may be formed.

Figure 3A:
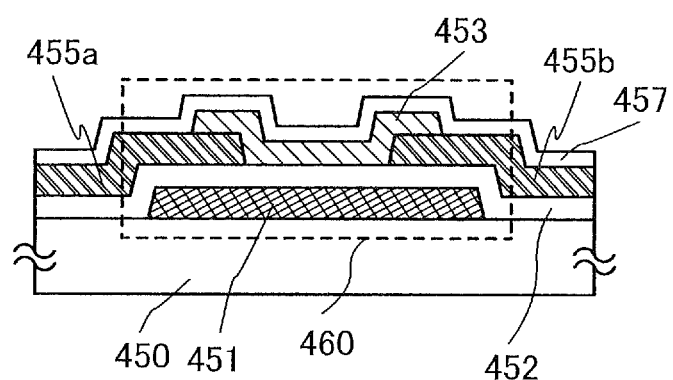
FIGS. 3A and 3B each illustrate a semiconductor device according to an embodiment of the present invention.
Figure 3B:
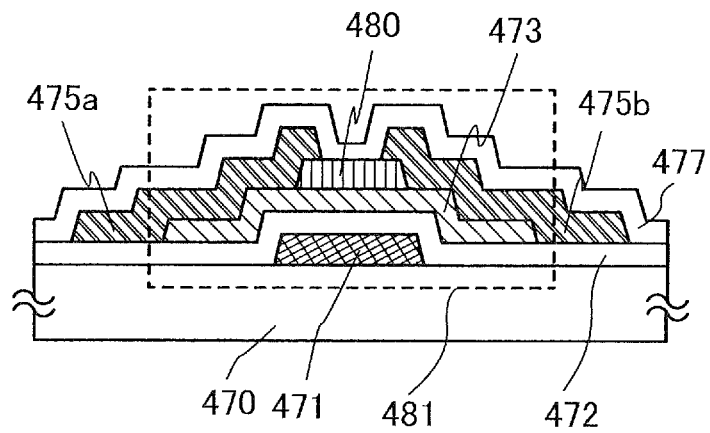

A manufacturing method of the channel-etched thin film transistor 461 has been described in this embodiment; however, the structure of this embodiment is not limited thereto. A thin film transistor 460 having a bottom-contact type (inverted-coplanar type) of a bottom-gate structure as illustrated in FIG. 3A and a thin film transistor 481 having a channel-stop type as illustrated in FIG. 3B can be formed using similar materials and similar methods.

Here, in the thin film transistor 460, a gate electrode layer 451 is provided over a substrate 450 that is a substrate having an insulating surface, a gate insulating layer 452 is provided over the gate electrode layer 451, source and drain electrode layers 455a and 455b are provided over the gate insulating layer 452, an oxide semiconductor layer 453 is provided over the source and drain electrode layers 455a and 455b and the gate insulating layer 452, and a protective insulating layer 457 which is in contact with part of the oxide semiconductor layer 453 and covers the gate insulating layer 452, the oxide semiconductor layer 453, and the source and drain electrode layers 455a and 455b is provided.

Note that the substrate 450, the gate electrode layer 451, the gate insulating layer 452, the source and drain electrode layers 455a and 455b, the oxide semiconductor layer 453, and the protective insulating layer 457 in the thin film transistor 460 correspond to the substrate 400, the gate electrode layer 401, the gate insulating layer 402, the source and drain electrode layers 405a and 405b, the oxide semiconductor layer 403, and the protective insulating layer 407 in the thin film transistor 461 illustrated in FIGS. 1A to 1E, respectively, and can be formed using similar materials and similar methods.

Further, in the thin film transistor 481, a gate electrode layer 471 is provided over a substrate 470 that is a substrate having an insulating surface, a gate insulating layer 472 is provided over the gate electrode layer 471, an oxide semiconductor layer 473 is provided over the gate insulating layer 472, a channel protective layer 480 is provided over the oxide semiconductor layer 473, source or drain electrode layers 475a and 475b are provided over the oxide semiconductor layer 473 and the channel protective layer 480, and a protective insulating layer 477 which is in contact with part of the channel protective layer 480 and covers the gate insulating layer 472, the oxide semiconductor layer 473, the channel protective layer 480, and the source or drain electrode layers 475a and 475b is provided.

The channel protective layer 480 is formed in such a manner that an insulating film is formed using a material and a method similar to those of the protective insulating layer 407 and the shape is processed by etching. For example, a silicon oxide film is formed over the oxide semiconductor layer 473 by a sputtering method and then etched with the use of a mask formed by photolithography, so that the channel protective layer 480 is formed. Alternatively, the channel protective layer 480 can be formed successively after the formation of the oxide semiconductor layer 473 without being exposed to the air. Accordingly, an interface between the stacked layers, which is not contaminated by atmospheric components or impurity elements floating in the air such as water or hydrocarbon, can be obtained.

Note that the substrate 470, the gate electrode layer 471, the gate insulating layer 472, the source or drain electrode layers 475a and 475b, the oxide semiconductor layer 473, and the protective insulating layer 477 in the thin film transistor 481 correspond to the substrate 400, the gate electrode layer 401, the gate insulating layer 402, the source and drain electrode layers 405a and 405b, the oxide semiconductor layer 403, and the protective insulating layer 407 in the thin film transistor 461, respectively, and can be formed using similar materials and similar methods.

In the above-described manner, a protective insulating layer is formed to cover a thin film transistor including an oxide semiconductor layer that is dehydrated or dehydrogenated by first heat treatment, and second heat treatment at a temperature that is lower than that of the first heat treatment, in which the increase and decrease in temperature are repeated plural times, is performed, whereby a thin film transistor including an oxide semiconductor layer, in which threshold voltage at which a channel is formed is positive and as close to 0 V as possible almost independently from the channel length, can be manufactured.

This embodiment can be implemented in appropriate combination with any of the structures described in the other embodiments.

Embodiment 2

In this embodiment, the second heat treatment is performed using a method different from that of Embodiment 1. In Embodiment 1, the second heat treatment is performed at a temperature that is lower than that of the first heat treatment in such a manner that the increase and decrease in temperature are repeated plural times. As the second heat treatment of this embodiment, heat treatment is performed continuously for a time longer than that of the first heat treatment keeping a temperature that is lower than that of the first heat treatment.

Up to the step right before the second heat treatment, a manufacturing process of a thin film transistor is similar to that in Embodiment 1 (see FIG. 1C).

The second heat treatment is performed on the source electrode layer 405a, the drain electrode layer 405b, the gate insulating layer 402, and the oxide semiconductor layer 432 continuously for a time longer than that of the first heat treatment keeping a temperature that is lower than that of the first heat treatment under an air atmosphere, an oxygen atmosphere, a nitrogen atmosphere, or a rare gas (such as helium, neon, or argon) atmosphere, whereby the oxide semiconductor layer 403 is formed (see FIG. 1D and FIG. 1E). In this embodiment, the substrate is introduced into an electric furnace which is one example of a heat treatment apparatus, and the oxide semiconductor layer is subjected to the second heat treatment under an oxygen atmosphere.

Figure 36:
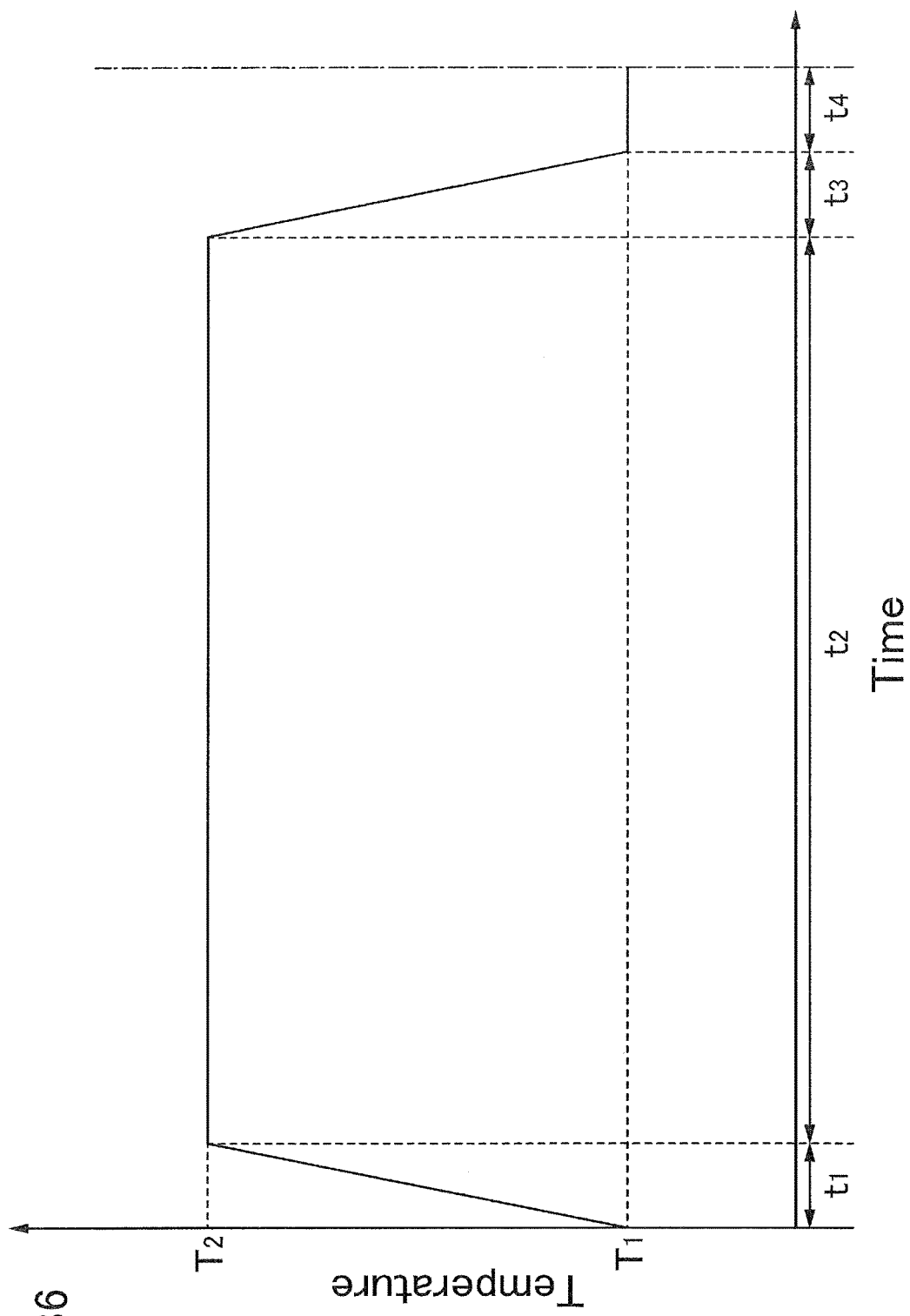
FIG. 36 is a graph showing a relationship between time and temperature of second heat treatment.

The second heat treatment of this embodiment consists of four periods of a temperature increasing period, a high temperature maintenance period, a temperature decreasing period, and a low temperature maintenance period; each period is conducted only once. In other words, until the second heat treatment is finished through the temperature decreasing period after the temperature is increased once, the high temperature maintenance period continues at the temperature $T_2$. The second heat treatment step is shown in the graph of FIG. 36 where the vertical axis indicates temperature and the horizontal axis indicates time. As shown in FIG. 36, the second heat treatment step consists of a temperature increasing period in time $t_1$ where the temperature is increased from a temperature $T_1$ to a temperature $T_2$, a high temperature maintenance period in time $t_2$ where the temperature $T_2$ is maintained, a temperature decreasing period in time $t_3$ where the temperature is decreased from the temperature $T_2$ to the temperature $T_1$, and a low temperature maintenance period in time $t_4$ where the temperature $T_1$ is maintained. Note that the low temperature maintenance period need not necessarily be performed.

Here, the temperature $T_1$ is preferably about room temperature, and the temperature $T_2$ is preferably higher than or equal to 100° C. and lower than or equal to 300° C., more preferably higher than or equal to 125° C. and lower than or equal to 250° C. In addition, the time $t_1$, the time $t_3$, and the time $t_4$ are each preferably 1 minute to 60 minutes approximately. The time $t_2$ is preferably 1 hour to 50 hours inclusive. The time $t_1$, the time $t_2$, the time $t_3$, and the time $t_4$ may be set to different lengths of time as appropriate as long as the following relation is satisfied: $t_2>t_1+t_3+t_4$.

In the temperature decreasing period, a cooled gas may be blown in order to decrease the substrate temperature. The substrate temperature can be decreased more rapidly by a blow of a cooled gas than by natural cooling.

In a manner similar to that of the second heat treatment in which the increase and decrease in temperature are repeated as described in Embodiment 1, the second heat treatment performed continuously for a time longer than that of the first heat treatment and at a temperature lower than that of the first heat treatment allows the dangling bond at the interface between the gate insulating layer 402 and the oxide semiconductor layer 432 and the interface between the oxide semiconductor layer 432 and the protective insulating layer 407 to be terminated or atoms in the periphery of the space in the oxide semiconductor layer 432 to be rearranged gradually; accordingly, the oxide semiconductor layer 403 in which the structures of the above-described portions are stabilized can be formed.

Therefore, in the thin film transistor including the oxide semiconductor layer 403, threshold voltage at which a channel is formed can be positive and as close to 0 V as possible. In particular, even in a thin film transistor in which the channel length is 20 μm or shorter, threshold voltage at which a channel is formed can be positive and as close to 0 V as possible in a similar manner. Further, field effect mobility can also be increased by this second heat treatment.

Further, even in the case where a plurality of thin film transistors including the oxide semiconductor layer 403 is formed over one substrate, the threshold voltage of the thin film transistors can be prevented from being varied.

In addition, the amount of shift in the threshold voltage can be reduced in a BT stress test (bias-temperature stress test); thus, a highly reliable thin film transistor can be obtained.

Therefore, in the case where a thin film transistor in a pixel portion of a display device is manufactured using a manufacturing method described in this embodiment, display unevenness due to variation in the threshold voltage of thin film transistors of respective pixels can be suppressed.

Further, in the case where a thin film transistor in a driver circuit portion of a display device is manufactured using a manufacturing method described in this embodiment, the channel length can be shortened causing almost no minus shift of the threshold voltage, whereby high speed operation and lower power consumption of the thin film transistor in the driver circuit portion can be achieved.

Note that in the second heat treatment, it is preferable that water, hydrogen, and the like be not contained in oxygen, nitrogen, or a rare gas such as helium, neon, or argon. Alternatively, it is preferable that nitrogen or a rare gas such as helium, neon, or argon introduced into a heat treatment apparatus have a purity of 6N (99.9999%) or more, more preferably, 7N (99.99999%) or more; that is, an impurity concentration is preferably set to 1 ppm or lower, more preferably, 0.1 ppm or lower.

The second heat treatment can be performed using a heating method with the use of an electric furnace.

Note that the second heat treatment need not necessarily be performed right after the formation of the protective insulating layer 407. The second heat treatment may be performed after formation of an interlayer film, a wiring layer, or the like over the protective insulating layer. In other words, the second heat treatment may be performed anytime as long as it is performed after the formation of the protective insulating layer 407. For example, in the case where a thin film transistor used in a pixel portion of a display device is manufactured, the second heat treatment may be performed after formation of a pixel electrode layer.

Further, before the second heat treatment, heat treatment (preferably at higher than or equal to 200° C. and lower than or equal to 400° C.) may be performed in an inert gas atmosphere or a nitrogen gas atmosphere. Here, this heat treatment is preferably performed at a temperature that is lower than the temperature of the first heat treatment and higher than the temperature of the second heat treatment. For example, this heat treatment may be performed at 250° C. in a nitrogen atmosphere for about 1 hour.

In a similar manner to that of Embodiment 1, through the above-described process, the channel-etched thin film transistor 461 having the following structure can be formed: the gate electrode layer 401 is provided over the substrate 400 that is a substrate having an insulating surface, the gate insulating layer 402 is provided over the gate electrode layer 401, the oxide semiconductor layer 403 is provided over the gate insulating layer 402, the source and drain electrode layers 405a and 405b are provided over the oxide semiconductor layer 403, and the protective insulating layer 407 which is in contact with part of the oxide semiconductor layer 403 and covers the gate insulating layer 402, the oxide semiconductor layer 403, and the source and drain electrode layers 405a and 405b is provided (see FIG. 1E).

A protective insulating layer is formed to cover a thin film transistor including an oxide semiconductor layer that is dehydrated or dehydrogenated by first heat treatment, and second heat treatment is performed continuously for a time longer than that of the first heat treatment keeping a temperature that is lower than that of the first heat treatment, whereby a thin film transistor including an oxide semiconductor layer, in which threshold voltage at which a channel is formed is positive and as close to 0 V as possible without depending on the channel length, can be manufactured.

This embodiment can be implemented in appropriate combination with any of the structures described in the other embodiments.

Embodiment 3

In this embodiment, a thin film transistor is manufactured using third heat treatment before the formation of the protective insulating layer 407 in a manner different from those of Embodiments 1 and 2.

Up to and including the step of forming the source and drain electrode layers 405a and 405b, a manufacturing process of a thin film transistor is similar to that in Embodiment 1 (see FIG. 1B).

Then, third heat treatment is performed to dehydrate or dehydrogenate an exposed region (back channel) of the oxide semiconductor layer 432, which is uncovered with the source and drain electrode layers 405a and 405b. The third heat treatment is preferably performed at a temperature of 100° C. to 300° C. under a vacuum, an oxygen atmosphere, a rare gas (such as helium, neon, or argon) atmosphere, or a reduced pressure. Further, the length of time of the third treatment is preferably more than or equal to 1 minute and less than or equal to 60 minutes.

The third heat treatment can remove excess carriers that are generated in the back channel due to entry of water or hydrogen. Accordingly, even if the length of time of the second heat treatment which is performed later and described in Embodiments 1 and 2 is shortened, a similar effect can be obtained.

Next, in a manner described in Embodiment 1, the protective insulating layer 407 which covers the gate insulating layer 402, the oxide semiconductor layer 432, the source electrode layer 405a, and the drain electrode layer 405b and which is in contact with part of the oxide semiconductor layer 432 is formed (see FIG. 1C). The protective insulating layer 407 can be formed to a thickness of at least 1 nm or more using a method by which impurities such as water or hydrogen are prevented from entering the protective insulating layer 407, such as a sputtering method as appropriate. Here, the protective insulating layer 407 is formed by a sputtering method at a film formation temperature higher than or equal to room temperature and lower than or equal to 100° C. in an oxygen atmosphere without exposure to the air. The protective insulating layer 407 which is formed in contact with part of the oxide semiconductor layer 432 is formed using an inorganic insulating film which does not contain an impurity such as moisture, a hydrogen ion, or $OH^-$ and prevents entry thereof from the outside, and a silicon oxide film is preferably used. A silicon oxide target or a silicon target can be used as a target.

Further, the protective insulating layer 407 may have a structure in which a silicon nitride film is stacked over a silicon oxide film. The silicon nitride film is preferable because it does not contain an impurity such as moisture, a hydrogen ion, or $OH^-$ and prevents entry thereof from the outside. It is important that the silicon nitride film be stacked without exposure to the air and entry of an impurity such as water or hydrogen into the protective insulating layer 407 is prevented.

Next, the second heat treatment in which the increase and decrease in temperature are repeated plural times at temperatures that are lower than that of the first heat treatment, which is described in Embodiment 1, or the second heat treatment performed continuously for a time longer than that of the first heat treatment keeping the temperature that is lower than that of the first heat treatment, which is described in Embodiment 2, is performed to form the oxide semiconductor layer 403; thus, the channel-etched thin film transistor 461 can be manufactured (see FIG. 1E).

In the case where the third heat treatment is performed before the second heat treatment, even if the length of time of the second heat treatment is shortened, a thin film transistor including the oxide semiconductor layer 403 in which threshold voltage at which a channel is formed is positive and as close to 0 V as possible can be manufactured. In particular, even in a thin film transistor in which the channel length is 20 µm or shorter, threshold voltage at which a channel is formed can be positive and as close to 0 V as possible in a similar manner. Further, field effect mobility can also be increased by this second heat treatment.

Further, with the third heat treatment performed before the second heat treatment, even in the case where the length of time of the second heat treatment is shortened and where a plurality of thin film transistors including the oxide semiconductor layer 403 is formed over one substrate, the threshold voltage of the thin film transistors can be prevented from being varied.

In addition, with the third heat treatment performed before the second heat treatment, even in the case where the length of time of the second heat treatment is shortened, the amount of shift in the threshold voltage can be reduced in a BT stress test (bias-temperature stress test); thus, a highly reliable thin film transistor can be obtained.

Therefore, in the case where a thin film transistor in a pixel portion of a display device is manufactured using a manufacturing method described in this embodiment, display unevenness due to variation in the threshold voltage of thin film transistors of respective pixels can be suppressed.

Further, in the case where a thin film transistor in a driver circuit portion of a display device is manufactured using a manufacturing method described in this embodiment, the channel length can be shortened without causing minus shift of the threshold voltage, whereby high speed operation and lower power consumption of the thin film transistor in the driver circuit portion can be achieved.

This embodiment can be implemented in appropriate combination with any of the structures described in the other embodiments.

Embodiment 4

In this embodiment, an example will be described below in which at least some of driver circuits and a thin film transistor disposed in a pixel portion are formed over one substrate.

The thin film transistor disposed in the pixel portion is formed in accordance with any of Embodiments 1 to 3. Since the thin film transistors described in Embodiments 1 to 3 are n-channel TFTs, some of driver circuits that can be constituted by n-channel TFTs among the driver circuits are formed over the substrate where the thin film transistor in the pixel portion is formed.

Figure 11A:
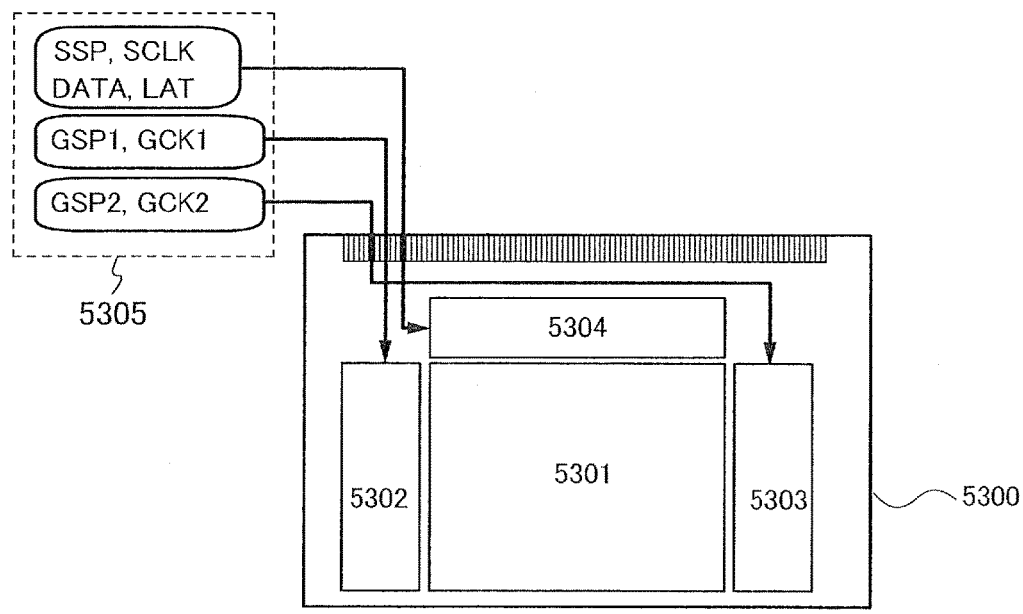
FIGS. 11A and 11B are each a block diagram of a semiconductor device.

FIG. 11A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that in cross regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

In FIG. 11A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that cost can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 11B:
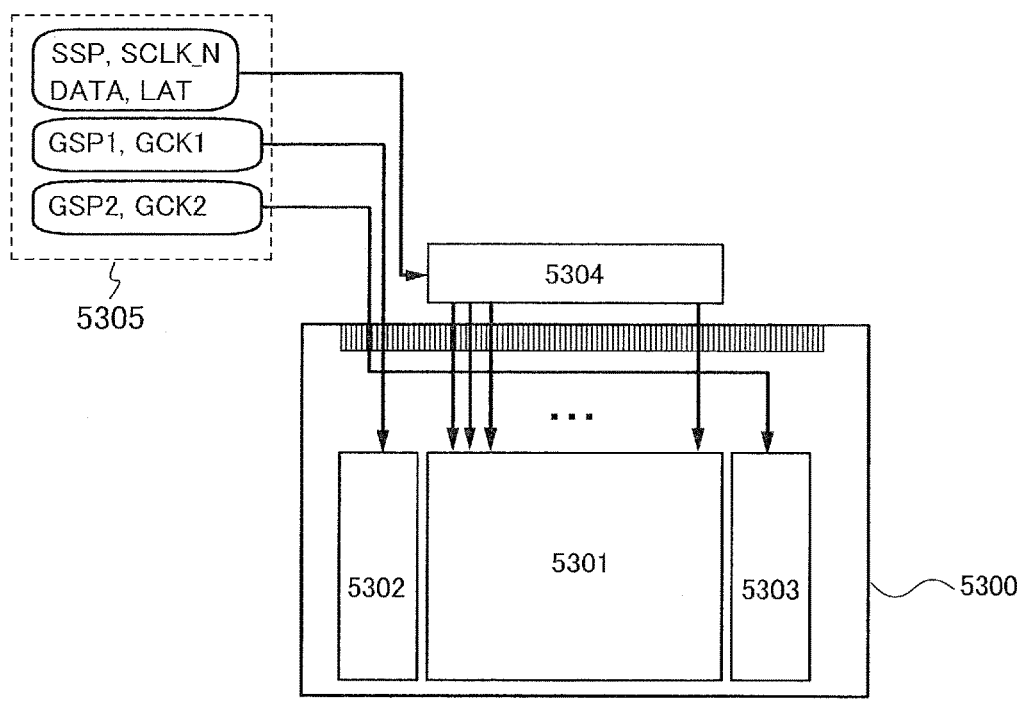

FIG. 11B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, increase in size of the display device, reduction in the number of steps, reduction in cost, improvement in yield, or the like can be achieved.

Figure 12A:
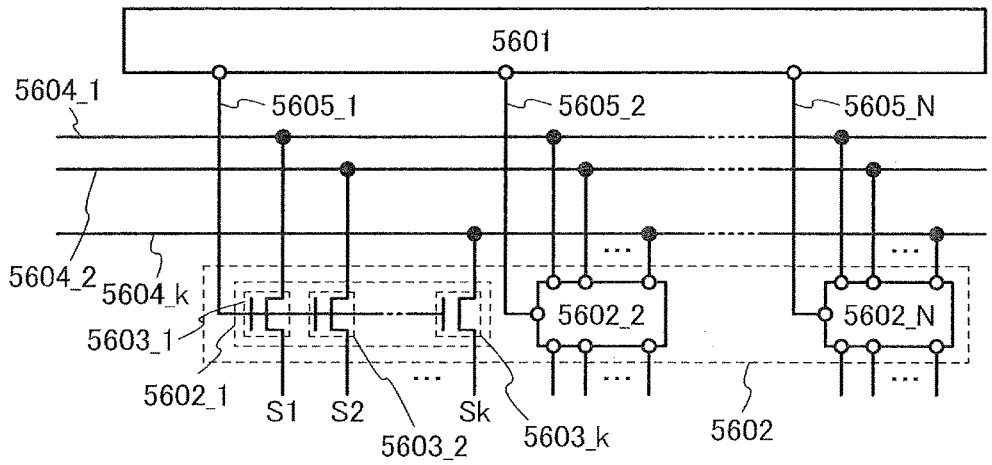
FIGS. 12A and 12B show a structure of a signal line driver circuit.
Figure 12B:
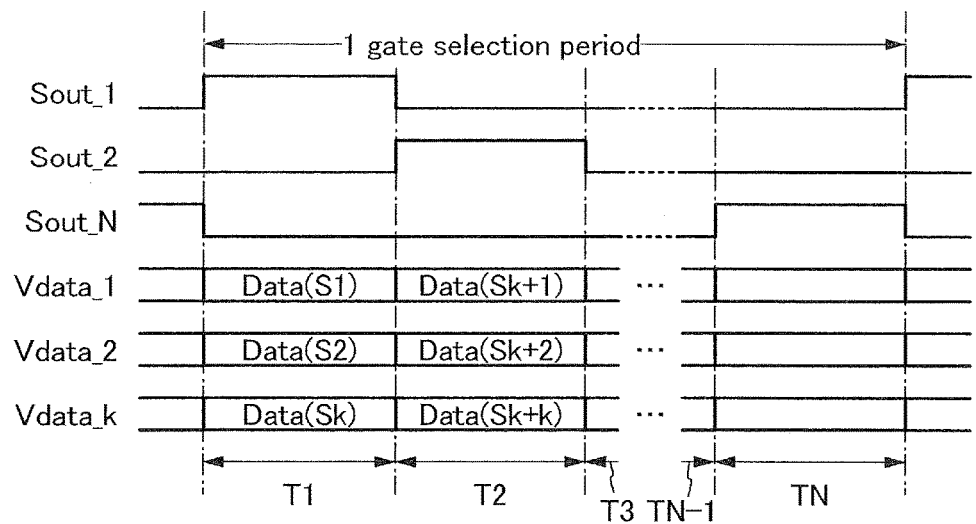

The thin film transistors described in Embodiment 1 to 3 are n-channel TFTs. FIGS. 12A and 12B illustrate an example of a configuration and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling electrical continuity between the wirings 5604_1 to 5604_$k$ and the signal lines S1 to Sk, respectively, that is, functions of supplying potentials of the wirings 5604_1 to 5604_$k$ to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal that corresponds to an image signal or image data.

Next, the operation of the signal line driver circuit in FIG. 12A is described with reference to a timing chart in FIG. 12B. FIG. 12B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively. The Data(S1) to Data(Sk) are written into pixels in a first to kth columns in the selected row through the thin film transistors 5603_1 to 5603_$k$, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when a video signal is written into pixels by a plurality of columns; thus, insufficient writing of a video signal can be prevented.

Note that any of the circuits constituted by the thin film transistor in any of Embodiments 1 to 3 can be used for the shift register 5601 and the switching circuit 5602. In that case, all the transistors included in the shift register 5601 can be only n-channel transistors or only p-channel transistors.

One embodiment of a shift register which is used for part of the scan line driver circuit and/or the signal line driver circuit is described with reference to FIGS. 13A to 13D and FIGS. 14A and 14B.

The scan line driver circuit includes a shift register. Additionally, the scan line driver circuit may include a level shifter, a buffer, or the like in some cases. In the scan line driver circuit, a clock signal (CK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply large current is used.

Figure 13A:
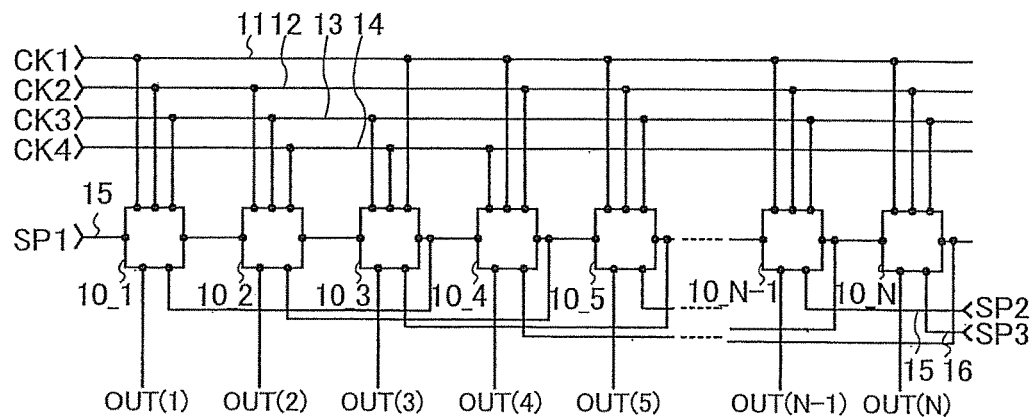
FIGS. 13A to 13D are circuit diagrams showing a structure of a shift register.

The shift register includes first to N-th pulse output circuits 10_1 to 10_N (N is a natural number greater than or equal to 3) (see FIG. 13A). In the shift register illustrated in FIG. 13A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) is input from a fifth wiring 15 to the first pulse output circuit 10_1. To the n-th pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2 and less than or equal to N) is input. In addition, a signal from the third pulse output circuit 10_3 is input to the first pulse output circuit 10_1 in the two stages before the third pulse output circuit 10_3. In a similar manner, a signal from the pulse output circuit 10_(n+2) in two stages after the n-th pulse output circuit 10_n (such a signal is referred to as a subsequent-stage signal OUT(n+2)) is input to the n-th pulse output circuit 10_n in the second or subsequent stage. Therefore, from the pulse output circuit in each stage, a first output signal (OUT(1)(SR) to OUT(N)(SR)) to be input to a pulse output circuit in the next stage and/or in two stages before the pulse output circuit and a second output signal (OUT(1) to OUT(N)) for electrical connection to another wiring or the like are output. Note that since the subsequent-stage signal OUT(n+2) is not input to the last two stages of the shift register as illustrated in FIG. 13A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are sequentially deviated by ¼ cycle. In this embodiment, driving or the like of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 13A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 13B:
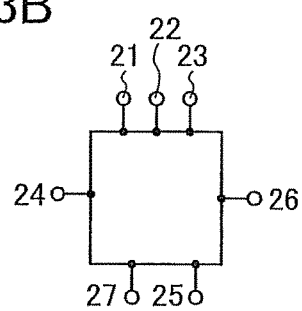

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 13B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

Figure 13C:
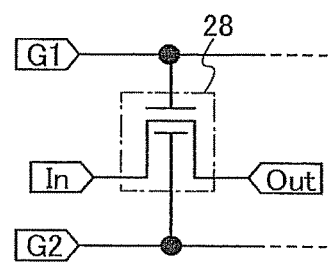

In the first to N-th pulse output circuits 10_1 to 10_N, the thin film transistor having four terminals can be used in addition to a thin film transistor having three terminals. FIG. 13C illustrates the symbol of a thin film transistor 28 having four terminals. The symbol of the thin film transistor 28 illustrated in FIG. 13C represents the thin film transistor having four terminals and is used in the drawings and the like below. The thin film transistor 28 is an element which can control electric current between an IN terminal and an OUT terminal with a first control signal G1 which is input to a first gate electrode and a second control signal G2 which is input to a second gate electrode.

The threshold voltage of the thin film transistor 28 illustrated in FIG. 13C can be controlled to a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or a potential of the lower gate electrode.

Next, an example of a specific circuit configuration of the pulse output circuit illustrated in FIG. 13B will be described with reference to FIG. 13D.

Figure 13D:
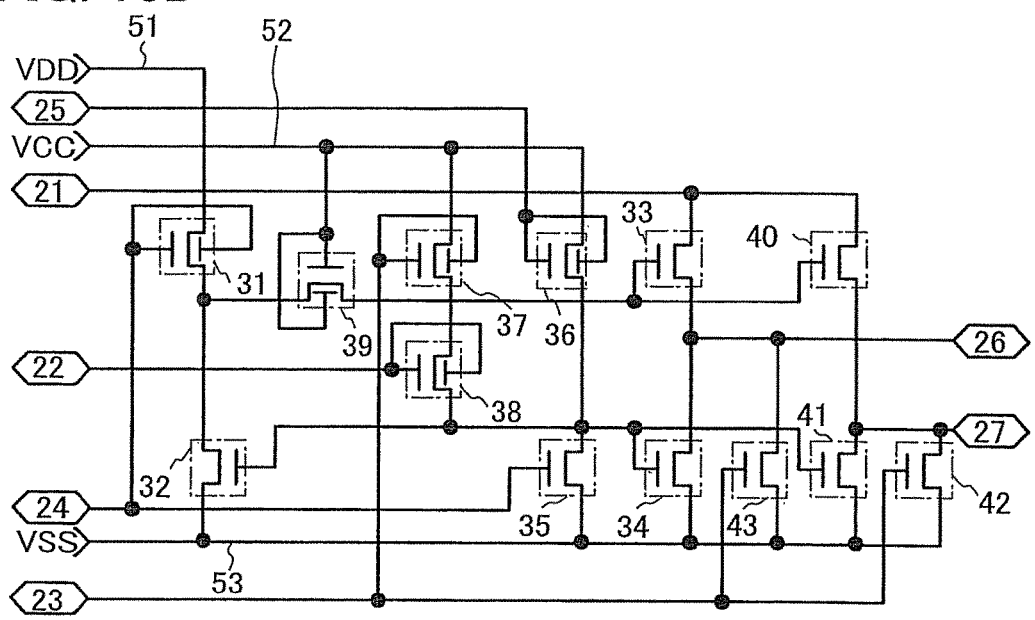

The first pulse output circuit 10_1 illustrated in FIG. 13D includes a first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 13D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that as illustrated in FIG. 13D, the thin film transistor 28 having four terminals illustrated in FIG. 13C is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 having four terminals illustrated in FIG. 13C, the threshold voltage can be controlled, and a malfunction of the pulse output circuit can be further reduced. Note that although the first control signal G1 and the second control signal G2 are the same control signals in FIG. 13D, the first control signal G1 and the second control signal G2 may be different control signals.

In FIG. 13D, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a first gate electrode and a second gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 13D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 14A).

Figure 14A:
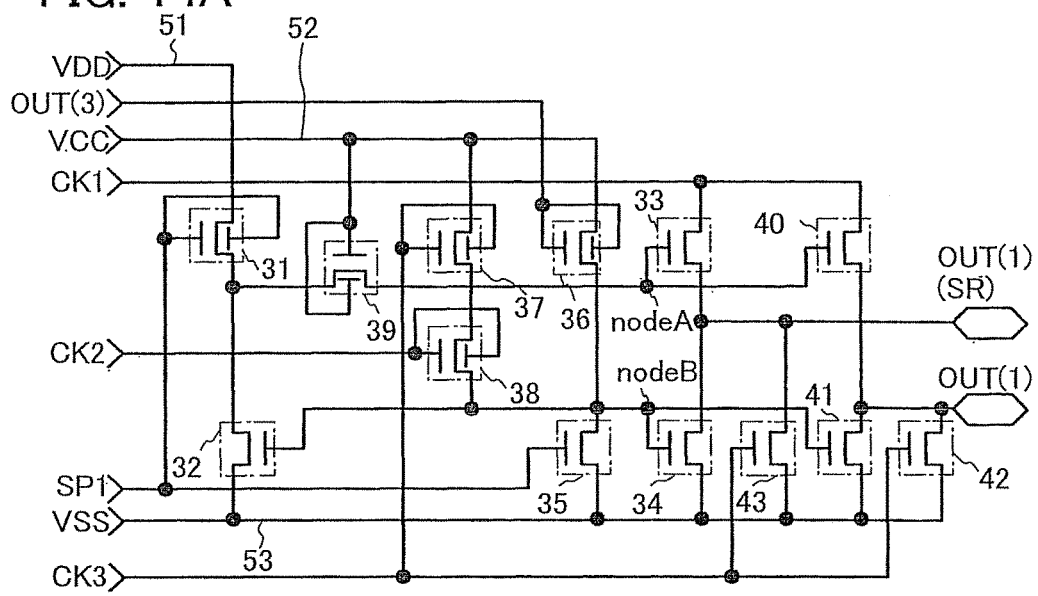
FIG. 14A is a circuit diagram showing a configuration of a shift register.

FIG. 14A illustrates signals that are input to or output from the first to fifth input terminals 21 to 25 and the first and second output terminals 26 and 27 in the case where the pulse output circuit illustrated in FIG. 13D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 13D and FIG. 14A, a capacitor for performing bootstrap operation by bringing the node A into a floating state may be additionally provided. Furthermore, a capacitor having one electrode electrically connected to the node B may be additionally provided in order to hold a potential of the node B.

Figure 14B:
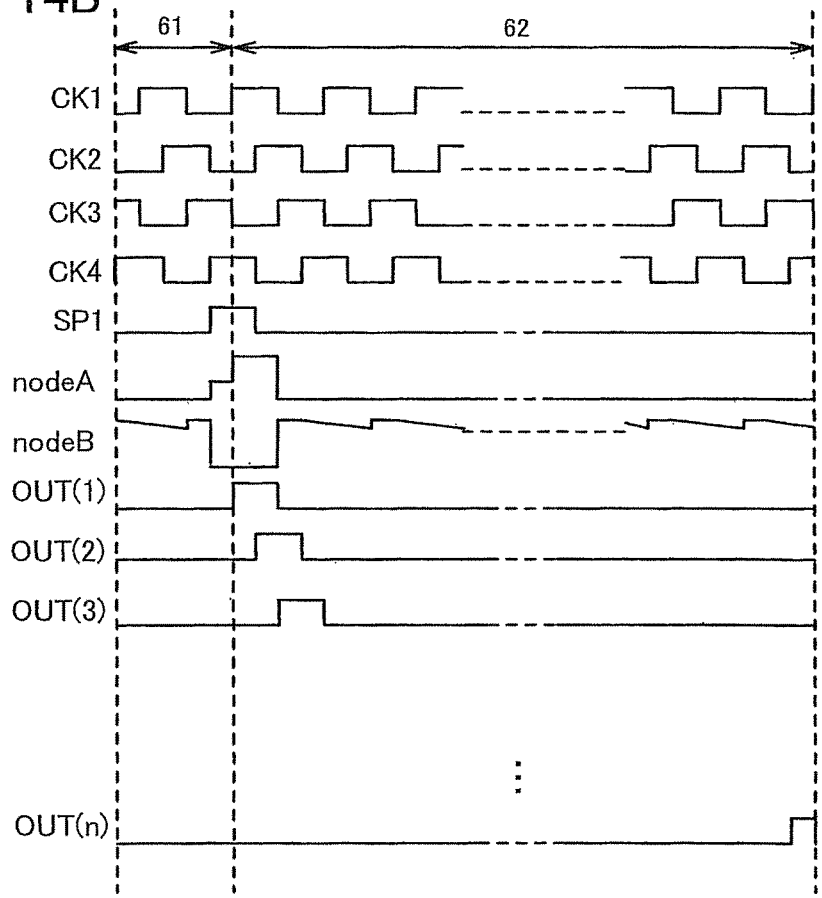
FIG. 14B shows a timing chart of operation of the shift register.

FIG. 14B is a timing chart of a shift register including a plurality of pulse output circuits illustrated in FIG. 14A. Note that when the shift register is included in a scan line driver circuit, a period 61 in FIG. 14B corresponds to a vertical retrace period and a period 62 corresponds to a gate selection period.

Note that by providing the ninth transistor 39 in which the second power supply potential VCC is applied to the gate as illustrated in FIG. 14A, the following advantages before and after the bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, high voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, provision of the ninth transistor 39 can lower the level of negative voltage applied between the gate and the source of the first transistor 31. Thus, the circuit configuration in this embodiment can reduce negative voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode, as compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 may be supplied from the second input terminal 22 and the third input terminal 23, respectively. In the shift register illustrated in FIG. 14A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the shift register illustrated in FIG. 14A, in the case where a state of the seventh transistor 37 and the eighth transistor 38 is changed so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B, which is caused by fall in potentials of the second input terminal 22 and the third input terminal 23, is caused only once by fall in potential of the gate electrode of the eighth transistor 38. Therefore, such a connection relation that the clock signal CK3 is supplied from the third input terminal 23 to the gate electrodes (the first gate electrode and the second gate electrode) of the seventh transistor 37 and the clock signal CK2 is supplied from the second input terminal 22 to the gate electrodes (the first gate electrode and the second gate electrode) of the eighth transistor 38, is preferable. That is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

In the case where a thin film transistor in the above-described driver circuit is manufactured using a manufacturing method of a thin film transistor described in Embodiment 1, the channel length can be shortened without causing minus shift of the threshold voltage, whereby high speed operation and lower power consumption of the thin film transistor in the driver circuit portion can be achieved.

This embodiment can be implemented in appropriate combination with any of the structures described in the other embodiments.

Embodiment 5

By manufacturing thin film transistors and using the thin film transistors for a pixel portion and driver circuits, a semiconductor device having a display function (also referred to as a display device) can be manufactured. Moreover, some or all of the driver circuits which include the thin film transistors can be formed over a substrate where the pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 7A1, 7A2, and 7B. FIGS. 7A1 and 7A2 are plan views of panels in which thin film transistors 4010 and 4011 and a liquid crystal element 4013 are sealed between a first substrate 4001 and a second substrate 4006 with a sealant 4005. FIG. 7B is a cross-sectional view taken along M-N in FIGS. 7A1 and 7A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 7A1 illustrates an example in which the signal line driver circuit 4003 is mounted by a COG method. FIG. 7A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 7B illustrates the thin film transistor 4010 included in the pixel portion 4002 and the thin film transistor 4011 included in the scan line driver circuit 4004, as an example. Insulating layers 4020, 4041, and 4021 are provided over the thin film transistors 4010 and 4011.

As the thin film transistors 4010 and 4011, the highly reliable thin film transistor including the oxide semiconductor layer, which is described in Embodiment 1, can be employed. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an oxide insulating layer 4032 and an oxide insulating layer 4033 functioning as alignment films, respectively, and the liquid crystal layer 4008 is sandwiched between the electrode layers with the oxide insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

A spacer 4035 is a columnar spacer obtained by selective etching of an insulating film and provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although a polarizing plate is provided on the outer surface of the substrate (on the viewer side) and a coloring layer (a color filter) and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process.

In the thin film transistor 4011, the insulating layer 4041 is formed in contact with the semiconductor layer including a channel formation region, as a protective insulating film. The insulating layer 4041 can be formed using a material and a method similar to those of the protective insulating layer 407 described in Embodiment 1, for example. Here, a silicon oxide film is formed by a sputtering method as the insulating layer 4041, in a manner similar to that of Embodiment 1.

Further, the protective insulating layer 4020 is formed over the insulating layer 4041. The protective insulating layer 4020 can be formed using a material and a method similar to those of the protective insulating layer 407 described in Embodiment 1. Here, a silicon nitride film is formed by a PCVD method as the insulating layer 4020.

The insulating layer 4021 functioning as a planarization insulating film is formed over the insulating layer 4020 in order to reduce surface unevenness of the thin film transistors. The insulating layer 4021 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the insulating layer 4021 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the planarization insulating layer 4021 can be formed with a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called $\pi$-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed and the scan line driver circuit 4004 or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 via an anisotropic conductive film 4019.

Note that FIGS. 7A1, 7A2, and 7B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 16:
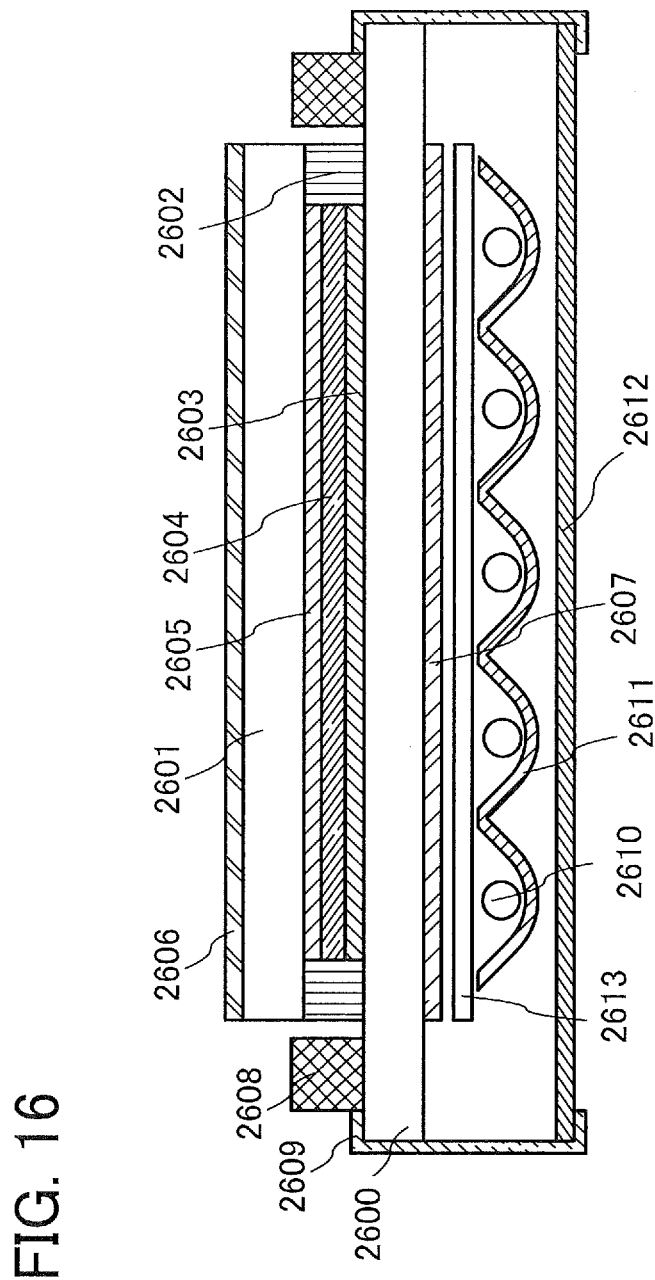
FIG. 16 illustrates a semiconductor device.

FIG. 16 illustrates an example of a liquid crystal display module which is formed as a semiconductor device using a TFT substrate 2600 manufactured in accordance with the manufacturing method disclosed in this specification.

FIG. 16 illustrates an example of the liquid crystal display module, in which the TFT substrate 2600 and a counter substrate 2601 are bonded to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above process, a highly reliable liquid crystal display panel as a semiconductor device can be manufactured.

In the case where a thin film transistor in a pixel portion of the above-described liquid crystal display device is manufactured using the manufacturing method of a thin film transistor described in Embodiment 1, display unevenness due to variations in the threshold voltage of thin film transistors of respective pixels can be suppressed.

Further, in the case where a thin film transistor in a driver circuit of a liquid crystal display device is manufactured using the manufacturing method of a thin film transistor described in Embodiment 1, the channel length can be shortened without causing minus shift of the threshold voltage, whereby high speed operation and lower power consumption of the thin film transistor in the driver circuit portion can be achieved.

This embodiment can be implemented in appropriate combination with any of the structures described in the other embodiments.

Embodiment 6

An example of electronic paper will be described as a semiconductor device.

The thin film transistor described in Embodiment 1 can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

An electrophoretic display is thus a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. For example, the active matrix substrate obtained using the thin film transistor described in Embodiment 1 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

Figure 15:
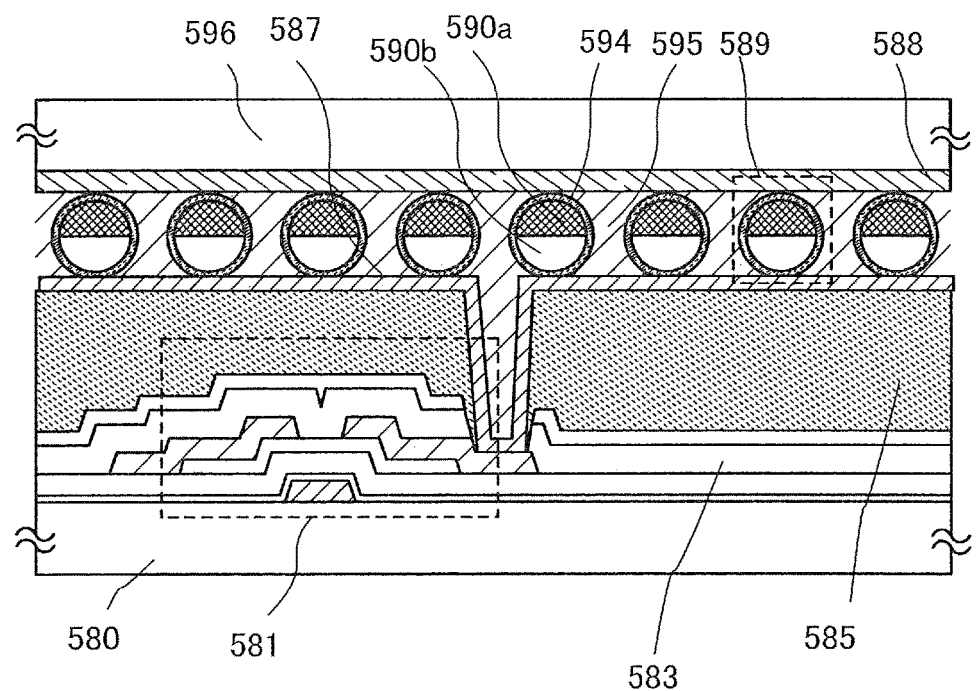
FIG. 15 illustrates a semiconductor device.

FIG. 15 illustrates active matrix electronic paper as an example of the semiconductor device. A thin film transistor 581 used for the semiconductor device can be manufactured in a manner similar to that of the thin film transistor described in Embodiment 1 and is a highly reliable thin film transistor including an oxide semiconductor layer.

The electronic paper in FIG. 15 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor having a bottom-gate structure and is covered with an insulating film 583 that is in contact with the semiconductor layer. A source or drain electrode layer of the thin film transistor 581 is in contact with a first electrode layer 587 through an opening formed in the insulating layer 585, whereby the thin film transistor 581 is electrically connected to the first electrode layer 587. Between the first electrode layer 587 and a second electrode layer 588 formed on a substrate 596, spherical particles 589 each having a black region 590*a*, a white region 590*b*, and a cavity 594 which is filled with liquid around the black region 590*a* and the white region 590*b* are provided. A space around the spherical particles 589 is filled with a filler 595 such as a resin (see FIG. 15). The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through above-described process, highly reliable electronic paper as a semiconductor device can be manufactured.

This embodiment can be implemented in appropriate combination with any of the structures described in the other embodiments.

In the case where a thin film transistor in a pixel portion of the above electronic paper is manufactured using any of the manufacturing methods described in Embodiments 1 to 3, display unevenness due to variations in the threshold voltage of thin film transistors of respective pixels can be suppressed.

Embodiment 7

An example of a light-emitting display device will be described as the semiconductor device. As a display element included in the display device, a light-emitting element utilizing electroluminescence is described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 9:
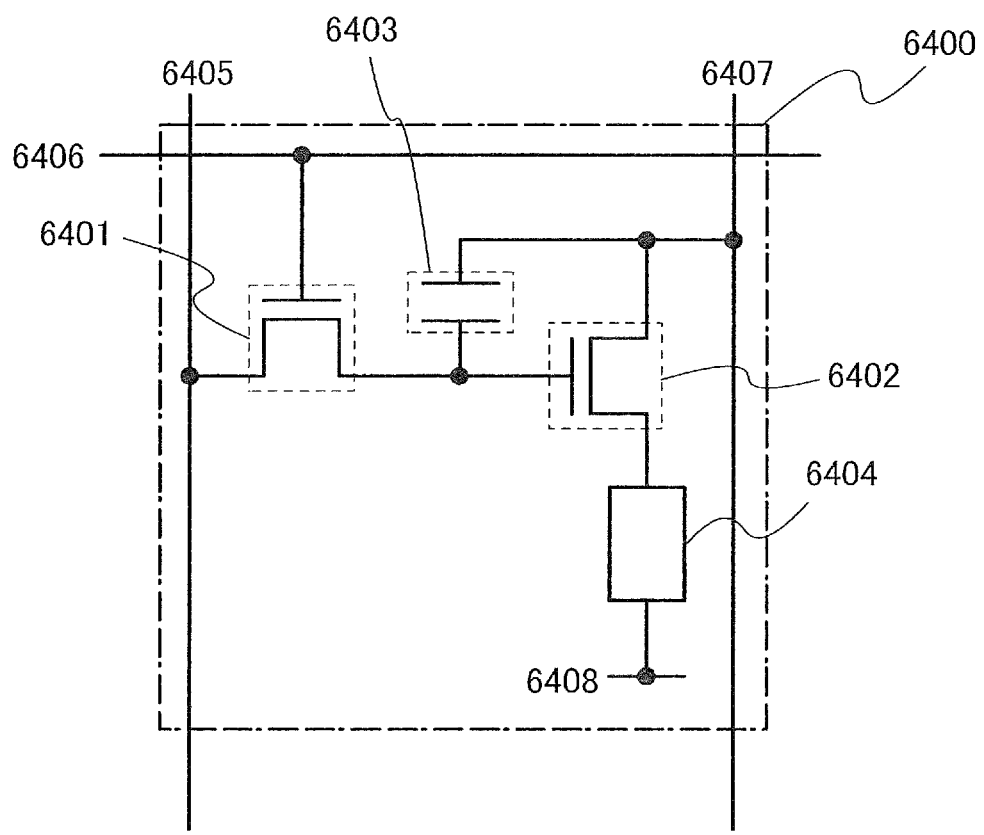
FIG. 9 shows a pixel equivalent circuit of a semiconductor device.

FIG. 9 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential <a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is inputted to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as FIG. 9 can be employed by inputting signals in a different way.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 9. For example, the pixel illustrated in FIG. 9 may further include a switch, a resistor, a capacitor, a transistor, a logic circuit, or the like.

Next, structures of the light-emitting element will be described with reference to FIGS. 10A to 10C. A cross-sectional structure of a pixel will be described by taking an n-channel driving TFT as an example. Driving TFTs 7001, 7011, and 7021 used for semiconductor devices illustrated in FIGS. 10A, 10B, and 10C, respectively, can be manufactured in a manner similar to that of the thin film transistor described in Embodiment 1 and are highly reliable thin film transistors each including an oxide semiconductor layer.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a bottom emission structure will be described with reference to FIG. 10A.

Figure 10A:
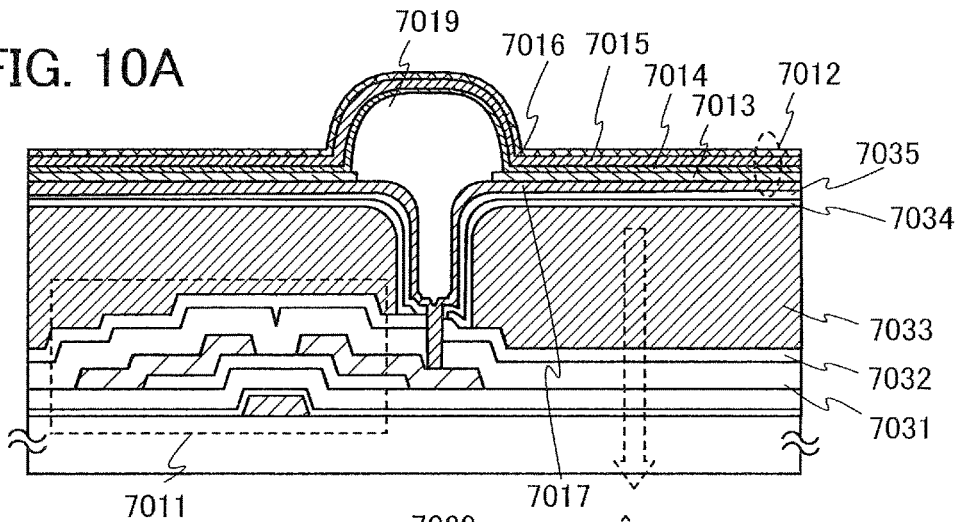
FIGS. 10A to 10C each illustrate a semiconductor device.

FIG. 10A is a cross-sectional view of a pixel in the case where the driving TFT 7011 is of an n-type and light is emitted from a light-emitting element 7012 to a cathode 7013 side. In FIG. 10A, the cathode 7013 of the light-emitting element 7012 is formed over a light-transmitting conductive film 7017 which is electrically connected to the driving TFT 7011, and an EL layer 7014 and an anode 7015 are stacked in that order over the cathode 7013. Note that the light-transmitting conductive film 7017 is electrically connected to a drain electrode layer of the driving TFT 7011 through a contact hole formed in an oxide insulating layer 7031.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

The cathode 7013 can be formed using various materials, and it is preferable that a material having a low work function, for example, an alkali metal such as Li or Cs, an alkaline-earth metal such as Mg, Ca, or Sr, an alloy containing any of these (Mg:Ag, Al:Li, or the like), a rare-earth metal such as Yb or Er, or the like be used. In FIG. 10A, the thickness of the cathode 7013 is approximately the thickness that transmits light (preferably, approximately 5 nm to 30 nm). For example, an aluminum film having a thickness of 20 nm is used for the cathode 7013.

Note that the light-transmitting conductive film and the aluminum film may be stacked and selectively etched to form the light-transmitting conductive film 7017 and the cathode 7013; in this case, the light-transmitting conductive film 7017 and the cathode 7013 can be etched with the use of the same mask.

The peripheral portion of the cathode 7013 is covered with a partition 7019. The partition 7019 is formed using an organic resin film such as polyimide, acrylic, polyamide, or epoxy, an inorganic insulating film, or organic polysiloxane. It is particularly preferable that the partition 7019 be formed using a photosensitive resin material to have an opening over the cathode 7013 so that a sidewall of the opening is formed as an inclined surface with continuous curvature. In the case where a photosensitive resin material is used for the partition 7019, a step of forming a resist mask can be omitted.

The EL layer 7014 formed over the cathode 7013 and the partition 7019 may be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in that order over the cathode 7013. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7013. However, when power consumption is compared, an electron-injection layer, an electron-transport layer, a light-emitting layer, a hole-transport layer, and a hole-injection layer are preferably stacked in that order over the cathode 7013 because of lower power consumption.

As the anode 7015 formed over the EL layer 7014, various materials can be employed, and a material having a high work function such as titanium nitride, ZrN, Ti, W, Ni, Pt, or Cr; or a light-transmitting conductive material such as ITO, IZO (indium oxide zinc oxide), or ZnO is preferably used for example. As a light-blocking film 7016 over the anode 7015, for example, a metal which blocks light, a metal which reflects light, or the like is used. In this embodiment, an ITO film is used for the anode 7015, and a Ti film is used for the light-blocking film 7016.

The light-emitting element 7012 corresponds to a region where the EL layer 7014 is sandwiched between the cathode 7013 and the anode 7015. In the case of the element structure illustrated in FIG. 10A, light is emitted from the light-emitting element 7012 to the cathode 7013 side as indicated by an arrow.

Note that an example in which a light-transmitting conductive film is used as a gate electrode layer is illustrated in FIG. 10A, light emitted from the light-emitting element 7012 passes through a color filter layer 7033 and gate and source electrode layers of the driving TFT 7011, and the light is emitted. A light-transmitting conductive film is used as the gate and source electrode layers of the driving TFT 7011; thus, an aperture ratio can be improved.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Note that the overcoat layer 7034 with a thin thickness is illustrated in FIG. 10A; however, the overcoat layer 7034 has a function to planarize a surface with unevenness due to the color filter layer 7033.

A contact hole which is formed in the insulating layer 7032 and the protective insulating layer 7035 and which reaches the drain electrode layer is provided in a portion which overlaps with the partition 7019. In FIG. 10A, the contact hole which reaches the drain electrode layer 7030 and the partition 7019 overlap with each other, whereby an aperture ratio can be improved.

Next, a light-emitting element having a dual emission structure will be described with reference to FIG. 10B.

Figure 10B:
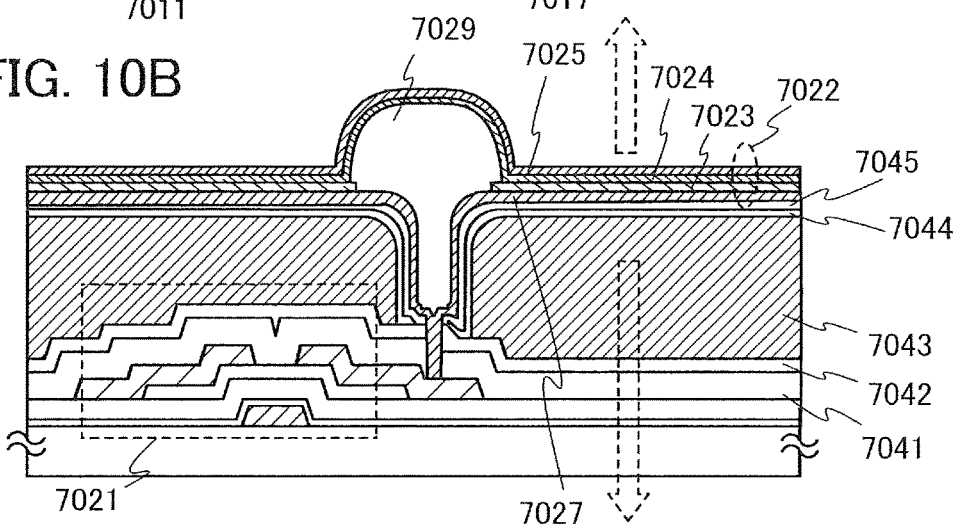

In FIG. 10B, a cathode 7023 of a light-emitting element 7022 is formed over a light-transmitting conductive film 7027 which is electrically connected to the driving TFT 7021, and an EL layer 7024 and an anode 7025 are stacked in that order over the cathode 7023. Note that the light-transmitting conductive film 7027 is electrically connected to a drain electrode layer of the driving TFT 7021 through a contact hole formed in an oxide insulating layer 7041.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

The cathode 7023 can be made of a variety of conductive materials as long as they have a low work function. For example, an alkali metal such as Li or Cs; an alkaline-earth metal such as Mg, Ca, or Sr; an alloy containing any of these (Mg:Ag, Al:Li, or the like); a rare-earth metal such as Yb or Er; or the like are preferable. In this embodiment, the thickness of the cathode 7023 is formed to a thickness that can transmit light (preferably, approximately 5 nm to 30 nm). For example, a 20-nm-thick aluminum film is used as the cathode 7023.

Note that the light-transmitting conductive film and the aluminum film may be stacked and then selectively etched, whereby the light-transmitting conductive film 7027 and the cathode 7023 may be formed. In this case, etching can be performed with the use of the same mask, which is preferable.

The periphery of the cathode 7023 is covered with a partition 7029. The partition 7029 is formed using an organic resin film such as polyimide, acrylic, polyamide, or epoxy; an inorganic insulating film; or organic polysiloxane. It is particularly preferable that the partition 7029 be formed using a photosensitive resin material to have an opening over the cathode 7023 so that a sidewall of the opening is formed as an inclined surface with continuous curvature. In the case where a photosensitive resin material is used for the partition 7029, a step of forming a resist mask can be omitted.

The EL layer 7024 formed over the cathode 7023 and the partition 7029 may be formed using either a single layer or a plurality of layers stacked. When the EL layer 7024 is formed using a plurality of layers, the EL layer 7024 is formed by stacking an electron-injection layer, an electron-transport layer, a light-emitting layer, a hole-transport layer, and a hole-injection layer in that order over the cathode 7023. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7023. However, when power consumption is compared, an electron-injection layer, an electron-transport layer, a light-emitting layer, a hole-transport layer, and a hole-injection layer are preferably stacked in that order over the cathode 7023 because of lower power consumption.

As the anode 7025 formed over the EL layer 7024, various materials can be used, and a material having a high work function, for example, a light-transmitting conductive material of ITO, IZO, ZnO, or the like is preferable. In this embodiment, an ITO film containing silicon oxide is used for the anode 7025.

The light-emitting element 7022 corresponds to a region where the EL layer 7024 is sandwiched between the cathode 7023 and the anode 7025. In the case of the element structure illustrated in FIG. 10B, light is emitted from the light-emitting element 7022 to both the anode 7025 side and the cathode 7023 side as indicated by arrows.

Note that an example in which the light-transmitting conductive film is used as the gate electrode layer is illustrated in FIG. 10B, and light emitted from the light-emitting element 7022 to the cathode 7023 side passes through a color filter layer 7043 and the gate and source electrode layers of the driving TFT 7021, and the light is emitted. When a light-transmitting conductive film is used for the gate electrode layer and the source electrode layer of the driving TFT 7021, the aperture ratio on the anode 7025 side can be approximately the same as the aperture ratio on the cathode 7023 side.

The color filter layer 7043 is formed by a droplet discharge method such as an inkjet method, a printing method, an etching method with the use of a photolithography technique, or the like.

The color filter layer 7043 is covered with an overcoat layer 7044, and also covered with a protective insulating layer 7045.

A contact hole which is formed in the insulating layer 7042 and the protective insulating layer 7045 and which reaches the drain electrode layer is provided in a portion which overlaps with the partition 7029. The contact hole which reaches the drain electrode layer and the partition 7029 overlap with each other, whereby the aperture ratio on the anode 7025 side can be approximately the same as the aperture ratio on the cathode 7023 side.

A contact hole which is formed in the protective insulating layer 7045 and the insulating layer 7042 and which reaches the light-transmitting conductive film 7027 is provided in a portion which overlaps with the partition 7029.

Note that when a light-emitting element having a dual emission structure is used and full color display is performed on both display surfaces, light from the anode 7025 side does not pass through the color filter layer 7043; therefore, a sealing substrate provided with another color filter layer is preferably provided on the anode 7025.

Next, a light-emitting element having a top emission structure is described with reference to FIG. 10C.

Figure 10C:
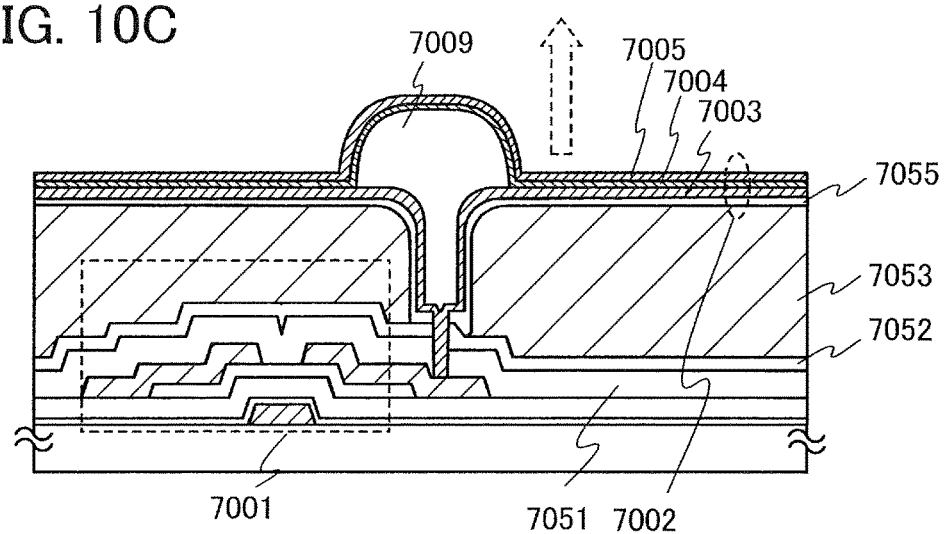

FIG. 10C is a cross-sectional view of a pixel in the case where the driving TFT 7001 is of n-type and light is emitted from a light-emitting element 7002 to an anode 7005 side. In FIG. 10C, a cathode 7003 of the light-emitting element 7002 which is electrically connected to the driving TFT 7001 through a connection electrode layer 7050 is formed, and an EL layer 7004 and the anode 7005 are stacked in that order over the cathode 7003.

The cathode 7003 can be made of a variety of materials. A material having a low work function, specifically, an alkali metal such as Li or Cs; an alkaline-earth metal such as Mg, Ca, or Sr; an alloy containing any of these (Mg:Ag, Al:Li, or the like); a rare-earth metal such as Yb or Er; or the like for example, is preferable.

The periphery of the cathode 7003 is covered with a partition 7009. The partition 7009 is formed using an organic resin film such as polyimide, acrylic, polyamide, or epoxy; an inorganic insulating film; or organic polysiloxane. It is particularly preferable that the partition 7009 be formed using a photosensitive resin material to have an opening over the cathode 7003 so that a sidewall of the opening is inclined with continuous curvature. In the case where a photosensitive resin material is used for the partition 7009, a step of forming a resist mask can be omitted.

The EL layer 7004 formed over the cathode 7003 and the partition 7009 may be formed using either a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the cathode 7003. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the cathode 7003. In the case where these layers are stacked in that order, the cathode 7003 functions as an anode.

In FIG. 10C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, when power consumption is compared, an electron-injection layer, an electron-transport layer, a light-emitting layer, a hole-transport layer, and a hole-injection layer are preferably stacked in that order over the cathode 7003 because of lower power consumption.

The anode 7005 is formed using a light-transmitting conductive material through which light can pass, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 is sandwiched between the cathode 7003 and the anode 7005. In the case of the pixel illustrated in FIG. 10C, light is emitted from the light-emitting element 7002 to the anode 7005 side as indicated by an arrow.

In FIG. 10C, an example in which the thin film transistor 461 is used as the driving TFT 7001 is illustrated; however, there is no particular limitation, and the thin film transistor 460 or the thin film transistor 481 can be used as well.

In FIG. 10C, the drain electrode layer of the driving TFT 7001 is electrically connected to the connection electrode layer 7050 with an oxide insulating layer 7051 interposed therebetween. The connection electrode layer is electrically connected to the cathode 7003 with a protective insulating layer 7052 and an insulating layer 7055 interposed therebetween. A planarization insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating films formed of these materials. There is no particular limitation on the method for forming the planarization insulating layer 7053, and the planarization insulating layer 7053 can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

In the structure of FIG. 10C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 10C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white can be formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (driving TFT) which controls the driving of a light-emitting element is electrically connected to the light-emitting element; however, a structure may be employed in which a TFT for current control is connected between the driving TFT and the light-emitting element.

When a structure is not provided with a light-emitting element and a partition, an embodiment of the present invention can be applied to a liquid crystal display device.

Figure 35:
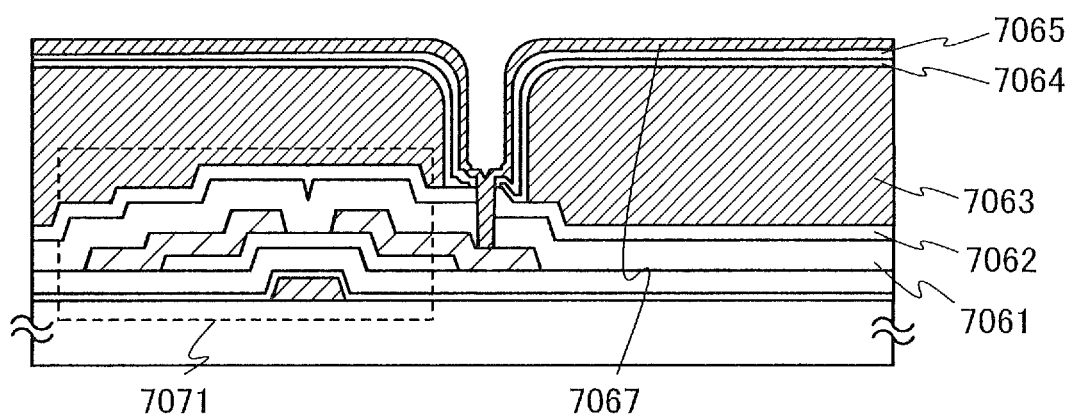
FIG. 35 illustrates a semiconductor device.

The case of a liquid crystal display device is illustrated in FIG. 35.

The case where a driving TFT 7071 is of an n-type is described. In FIG. 35, a light-transmitting conductive film 7067 which is electrically connected to the driving TFT 7071 is provided, and the light-transmitting conductive film 7067 is electrically connected to a drain electrode layer of the driving TFT 7071 through a contact hole formed in an oxide insulating layer 7061 and a protective insulating layer 7062.

As the light-transmitting conductive film 7067, a light-transmitting conductive film such as a film of indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added can be used, for example.

Note that an example using a light-transmitting conductive film as a gate electrode layer is illustrated in FIG. 35, and light emitted from a backlight or the like passes through a color filter layer 7063, and the light is emitted. Accordingly, a light-transmitting conductive film is used as the gate and source electrode layers of the driving TFT 7071, and an aperture ratio can be improved.

The color filter layer 7063 is formed by a droplet discharge method such as an inkjet method, a printing method, an etching method with the use of a photolithography technique, or the like.

The color filter layer 7063 is covered with an overcoat layer 7064, and also covered with a protective insulating layer 7065. Note that the overcoat layer 7064 with a small thickness is illustrated in FIG. 35; however, the overcoat layer 7064 has a function to planarize a surface with unevenness due to the color filter layer 7063.

A structure in which a liquid crystal layer is provided over the light-transmitting conductive film 7067 can be applied to a liquid crystal display device.

Figure 8A:
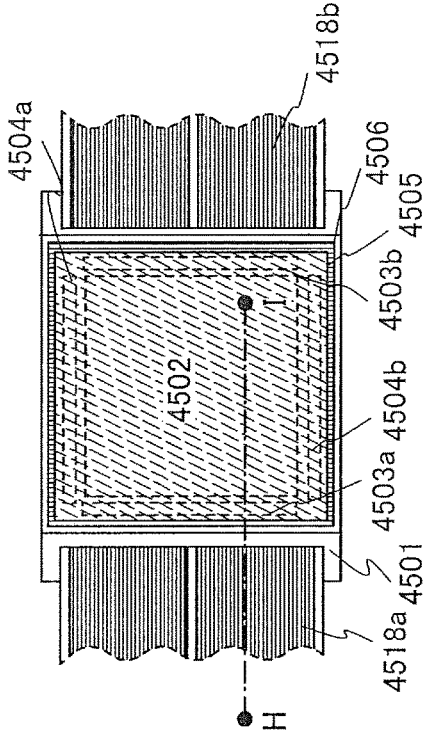
FIGS. 8A and 8B illustrate a semiconductor device.
Figure 8B:
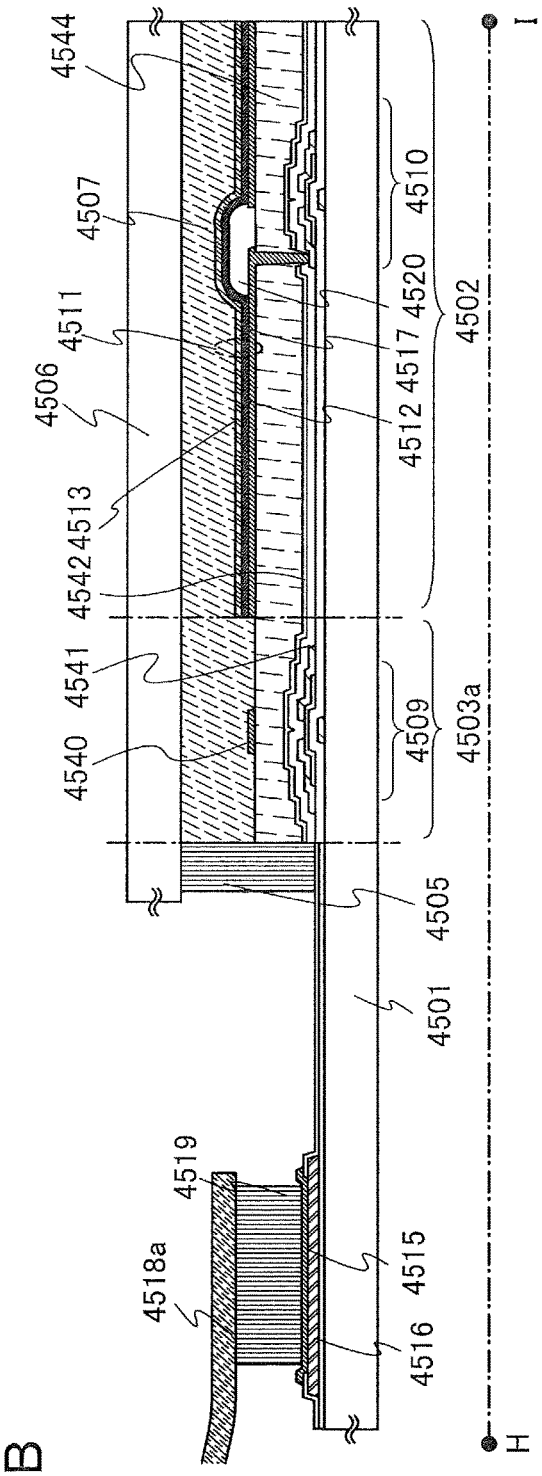

Next, the appearance and a cross section of a light-emitting display panel (also referred to as a light-emitting panel), which is one embodiment of the semiconductor device, will be described with reference to FIGS. 8A and 8B. FIG. 8A is a plan view of a panel in which a thin film transistor and a light-emitting element are sealed between a first substrate and a second substrate with a sealant. FIG. 8B is a cross-sectional view taken along line H-I of FIG. 8A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 8B.

As the thin film transistors 4509 and 4510, the highly reliable thin film transistor including an oxide semiconductor layer which is described in Embodiment 1 can be employed. In this embodiment, the thin film transistors 4509 and 4510 are n-channel thin film transistors.

A conductive layer 4540 is provided in a portion which overlaps with a channel formation region of the oxide semiconductor layer of the thin film transistor 4509 for a driver circuit over an insulating layer 4544. When the conductive layer 4540 is provided in a portion which overlaps with the channel formation region of the oxide semiconductor layer, the amount of shift in the threshold voltage of the thin film transistor 4509 between before and after a BT test can be reduced. The conductive layer 4540 may have a potential which is the same as or different from that of the gate electrode layer of the thin film transistor 4509, and can function as a second gate electrode layer. The potential of the conductive layer 4540 may be GND, 0 V or in a floating state.

In the thin film transistor 4509, an insulating layer 4541 is formed as a protective insulating film so as to be in contact with a semiconductor layer including a channel formation region. The insulating layer 4541 may be formed using a material and a method similar to those of the protective insulating layer 407 described in Embodiment 1. In addition, in order to reduce the surface roughness of the thin film transistors, the thin film transistors are covered with the insulating layer 4544 functioning as a planarization insulating film. Here, a silicon oxide film is formed as the insulating layer 4541 by a sputtering method with the use of the protective insulating layer 407 described in Embodiment 1.

A protective insulating layer 4543 is formed over the insulating layer 4541. The protective insulating layer 4543 may be formed using a material and a method similar to those of the protective insulating layer 407 described in Embodiment 1. Here, a silicon nitride film is formed as the protective insulating layer 4543 by a PCVD method.

Further, the insulating layer 4544 is formed as the planarization insulating film. The insulating layer 4544 may be formed using a material and a method similar to those of the insulating layer 4021 described in Embodiment 5. Here, an acrylic resin is used for the planarization insulating layer 4544.

Reference numeral 4511 denotes a light-emitting element, and a first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stack structure, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used as the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 8A and 8B.

Through the above process, a highly reliable light-emitting display device (display panel) as a semiconductor device can be manufactured.

In the case where a thin film transistor in a pixel portion of the above-described light-emitting display device is manufactured using the manufacturing method of a thin film transistor described in any of Embodiments 1 to 3, display unevenness due to variations in the threshold voltage of thin film transistors of respective pixels can be suppressed.

Further, in the case where a thin film transistor in a driver circuit of a light-emitting display device is manufactured using the manufacturing method of a thin film transistor described in any of Embodiments 1 to 3, the channel length can be shortened without causing minus shift of the threshold voltage, whereby high speed operation and lower power consumption of the thin film transistor in the driver circuit portion can be achieved.

This embodiment can be implemented in appropriate combination with any of the structures described in the other embodiments.

Embodiment 8

A semiconductor device disclosed in this specification can be applied to electronic paper. Electronic paper can be used for electronic appliances of a variety of fields as long as they can display data. For example, electronic paper can be applied to display portions of an e-book (electronic book) reader, a poster, an advertisement in a vehicle such as a train, various cards such as a credit card, and the like. An example of the electronic appliances is illustrated in FIG. 17.

Figure 17:
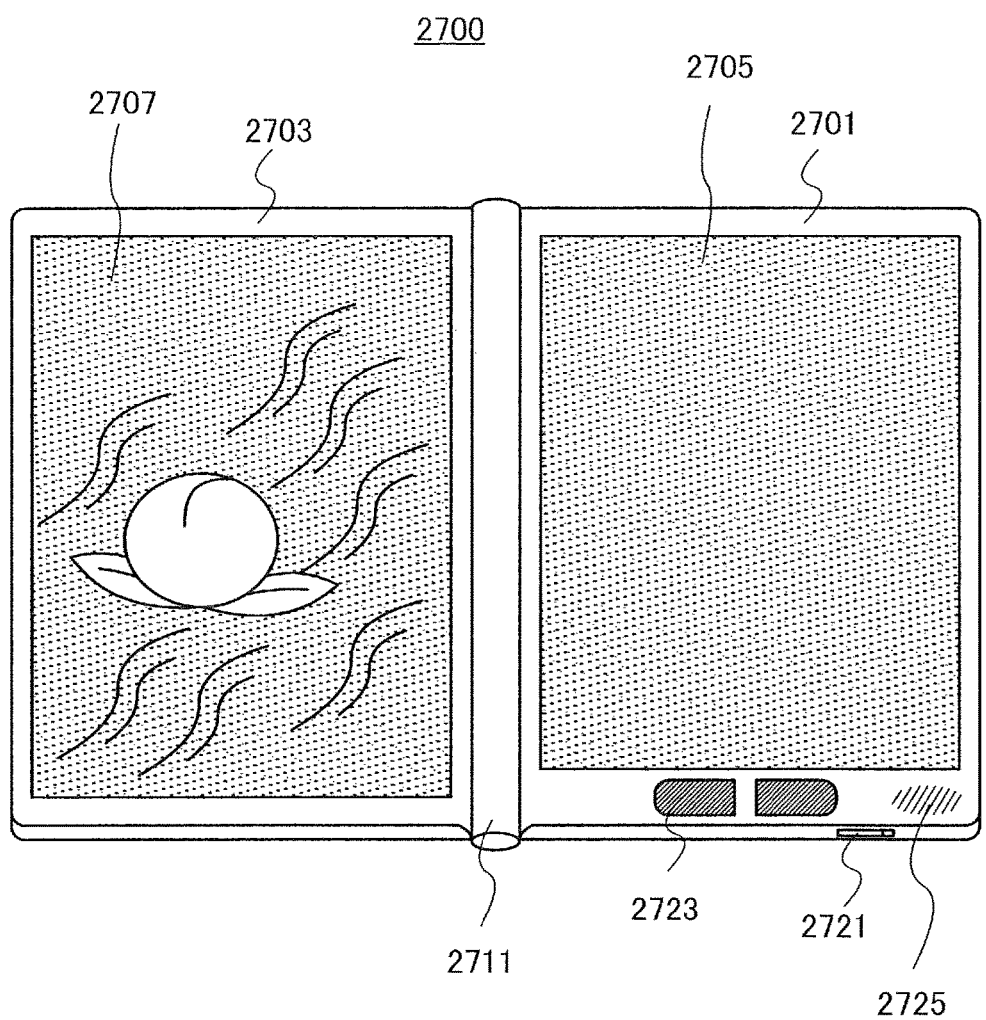
FIG. 17 is an external view of an example of an e-book reader.

FIG. 17 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 17) and images can be displayed on a display portion on the left side (the display portion 2707 in FIG. 17).

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

Embodiment 9

A semiconductor device disclosed in this specification can be applied to a variety of electronic appliances (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 18A:
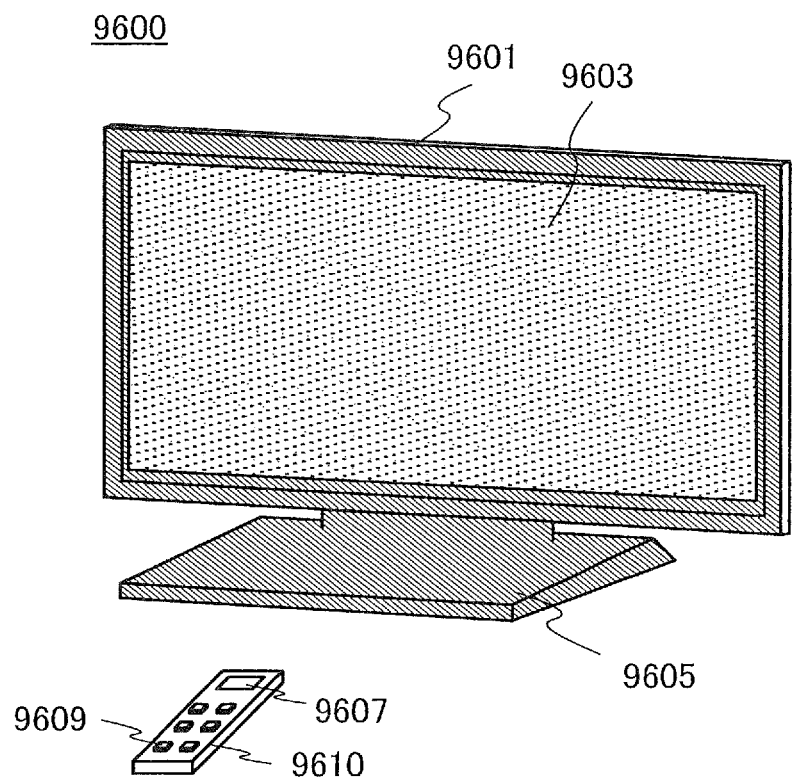
FIGS. 18A and 18B are external views of an example of a television set and an example of a digital photo frame, respectively.

FIG. 18A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 which displays data outputted from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 18B:
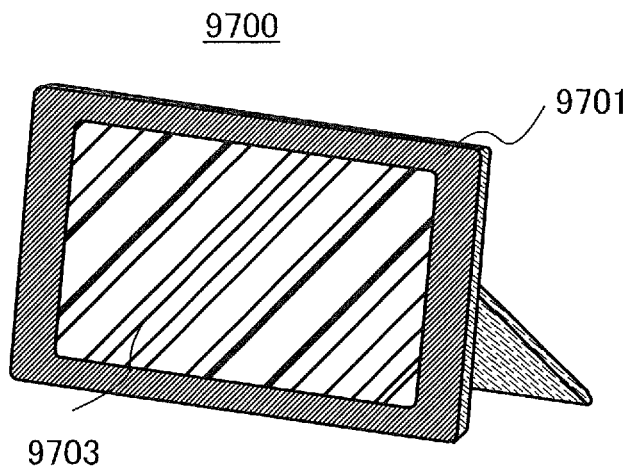

FIG. 18B illustrates an example of a digital photo frame. For example, in a digital photo frame 9700, a display portion 9703 is incorporated in a housing 9701. Various images can be displayed on the display portion 9703. For example, the display portion 9703 can display image data taken with a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion 9703, it is preferable to provide them on the side surface or the back surface because the design thereof is improved. For example, a memory in which image data taken with a digital camera is stored is inserted in the recording medium insertion portion of the digital photo frame 9700, whereby the image data can be displayed on the display portion 9703.

The digital photo frame 9700 may send and receive information wirelessly. Through wireless communication, desired image data can be downloaded to be displayed.

Figure 19A:
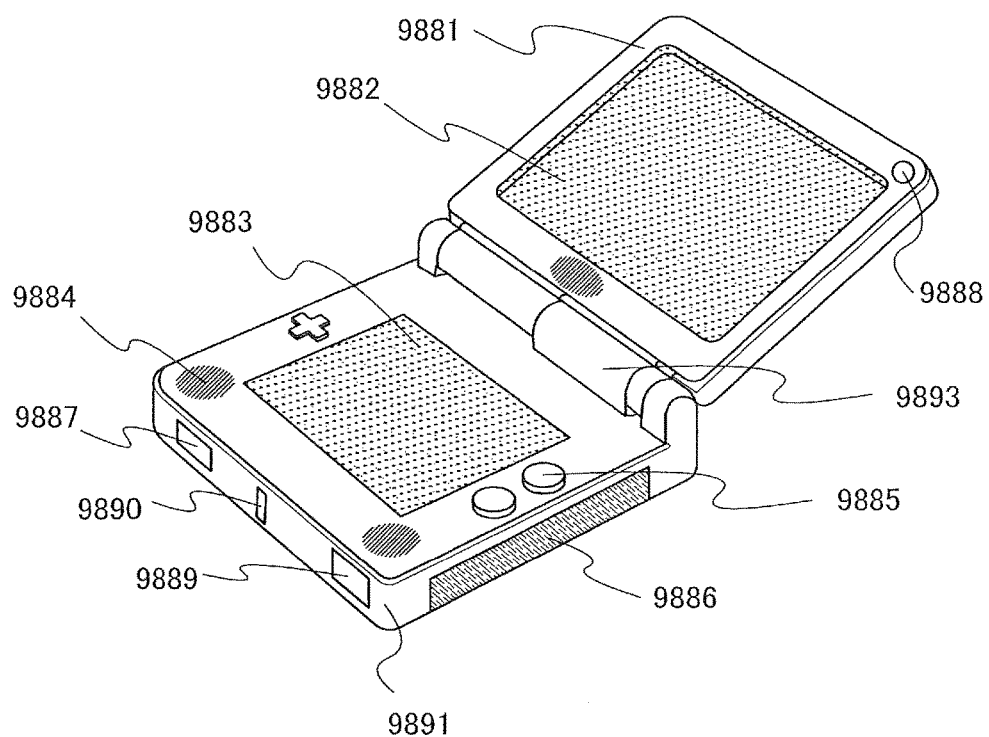
FIGS. 19A and 19B are external views of examples of game machines.

FIG. 19A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 19A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above, and other structures provided with at least a semiconductor device disclosed in this specification may be employed. The portable amusement machine may include other accessory equipment as appropriate. The portable amusement machine illustrated in FIG. 19A has a function of reading a program or data stored in a recording medium to display it on the display portion, and a function of sharing information with another portable amusement machine by wireless communication. The portable amusement machine illustrated in FIG. 19A can have various functions without limitation to the above.

Figure 19B:
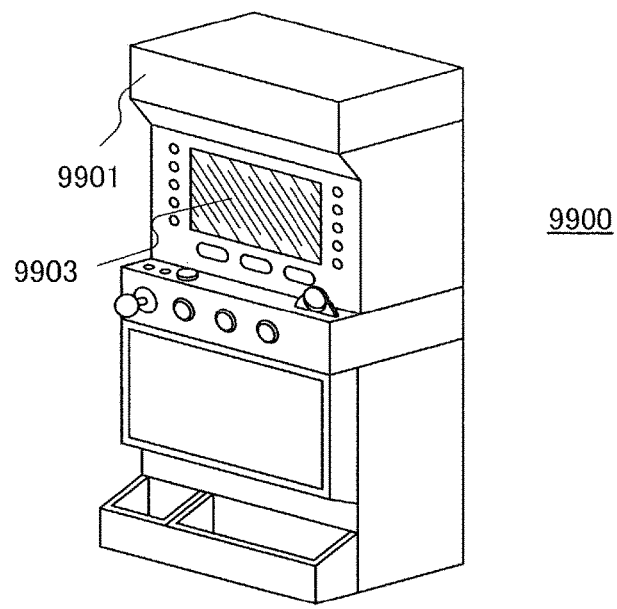

FIG. 19B illustrates an example of a slot machine which is a large-sized amusement machine. In a slot machine 9900, a display portion 9903 is incorporated in a housing 9901. In addition, the slot machine 9900 includes an operation unit such as a start lever or a stop switch, a coin slot, a speaker, and the like. It is needless to say that the structure of the slot machine 9900 is not limited to the above, and other structures provided with at least a semiconductor device disclosed in this specification may be employed. The slot machine 9900 may include other accessory equipment as appropriate.

Figure 20A:
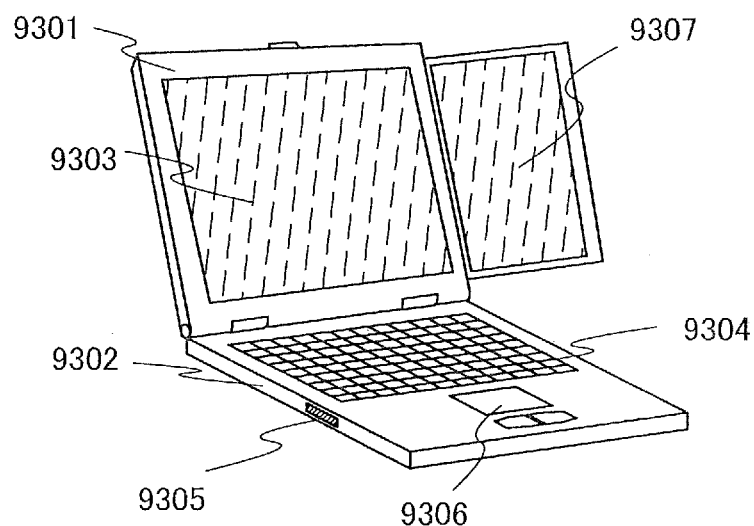
FIGS. 20A and 20B are external views of an example of a portable computer and an example of a cellular phone, respectively.

FIG. 20A is a perspective view illustrating an example of a portable computer.

In the portable computer in FIG. 20A, a top housing 9301 having a display portion 9303 and a bottom housing 9302 having a keyboard 9304 can overlap with each other by closing a hinge unit which connects the top housing 9301 and the bottom housing 9302. The portable computer in FIG. 20A can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer in FIG. 20A, which can be provided with a receiver and the like, can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Figure 20B:
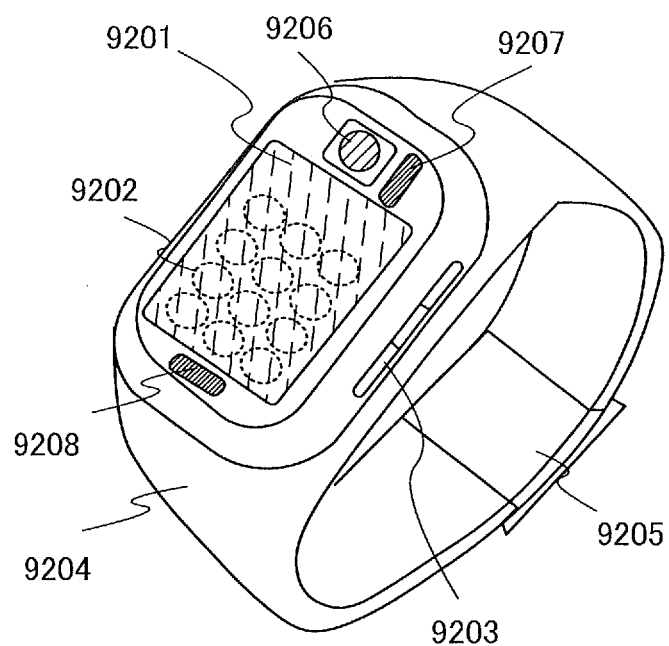

FIG. 20B is a perspective view illustrating an example of a cellular phone that the user can wear on the wrist like a wristwatch.

This cellular phone includes a main body which includes a battery and a communication device having at least a telephone function; a band portion 9204 which enables the main body to be worn on the wrist; an adjusting portion 9205 which adjusts the band portion 9204 to fit the wrist; a display portion 9201; a speaker 9207; and a microphone 9208.

In addition, the main body includes operation switches 9203. The operation switches 9203 serve, for example, as a switch for starting a program for the Internet when the switch is pushed, in addition to serving as a switch for turning on a power source, a switch for shifting a display, a switch for instructing to start taking images, or the like, and can be configured to have respective functions.

Input to this cellular phone is operated by touching the display portion 9201 with a finger, an input pen, or the like, by operating the operation switches 9203, or by inputting voice into the microphone 9208. Note that displayed buttons 9202 which are displayed on the display portion 9201 are illustrated in FIG. 20B. Input can be performed by touching the displayed buttons 9202 with a finger or the like.

Further, the main body includes a camera portion 9206 including an image pick-up unit having a function of converting an image of an object, which is formed through a camera lens, to an electronic image signal. Note that the camera portion is not necessarily provided.

The cellular phone illustrated in FIG. 20B, which can be provided with a receiver of a television broadcast and the like, can display an image on the display portion 9201 by receiving a television broadcast. In addition, the cellular phone illustrated in FIG. 20B may be provided with a storage device and the like such as a memory, and thus can record a television broadcast in the memory. The cellular phone illustrated in FIG. 20B may have a function of collecting location information, such as the GPS.

The display portion 9201 is formed using an image display device of a liquid crystal display panel, a light-emitting display panel such as an organic light-emitting element or an inorganic light-emitting element, or the like. The cellular phone illustrated in FIG. 20B is compact and lightweight and thus has limited battery capacity. Therefore, a panel which can be driven with low power consumption is preferably used as a display device for the display portion 9201.

Note that FIG. 20B illustrates the electronic appliance which is worn on the wrist; however, this embodiment is not limited thereto as long as a portable shape is employed.

Embodiment 10

Figure 4:
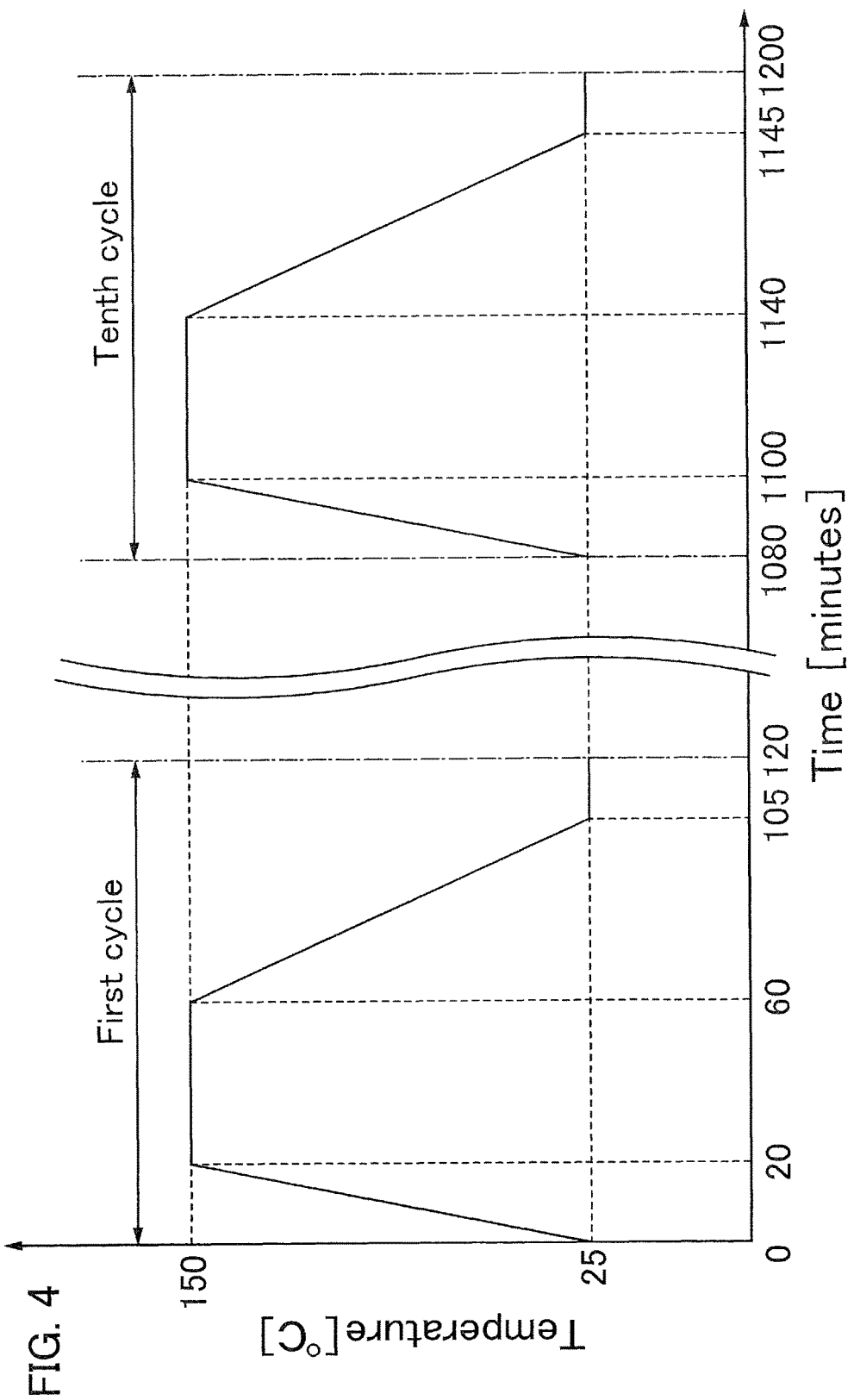
FIG. 4 is a graph showing a relationship between time and temperature of second heat treatment in Example 1.

In this embodiment, an example of a display device including the thin film transistor described in Embodiment 1 will be described as an embodiment of a semiconductor device with reference to FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, and FIG. 34. In this embodiment, an example of a liquid crystal display device including a liquid crystal element as a display element will be described with reference to FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, and FIG. 34. As TFTs 628 and 629 used for the liquid crystal display devices in FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, and FIG. 34, the thin film transistor described in Embodiment 1 can be employed. The TFTs 628 and 629 are thin film transistors having high electric characteristics and reliability, which can be manufactured in a process similar to that described in Embodiment 1. The TFTs 628 and 629 each include an oxide semiconductor layer as a channel formation region. In FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, and FIG. 34, a case where the thin film transistor illustrated in FIG. 4 is used as an example of thin film transistor will be described; however, the present invention is not limited thereto.

First, a vertical alignment (VA) liquid crystal display device is described. The VA liquid crystal display device employs a method of controlling alignment of liquid crystal molecules of a liquid crystal display panel. In the VA method, liquid crystal molecules are aligned in a vertical direction with respect to a panel surface when no voltage is applied. In this embodiment, in particular, a pixel is divided into several regions (subpixels), and molecules are tilted in different directions in their respective regions. This is referred to as multi-domain or multi-domain design. A liquid crystal display device of multi-domain design is described below.

Figure 21:
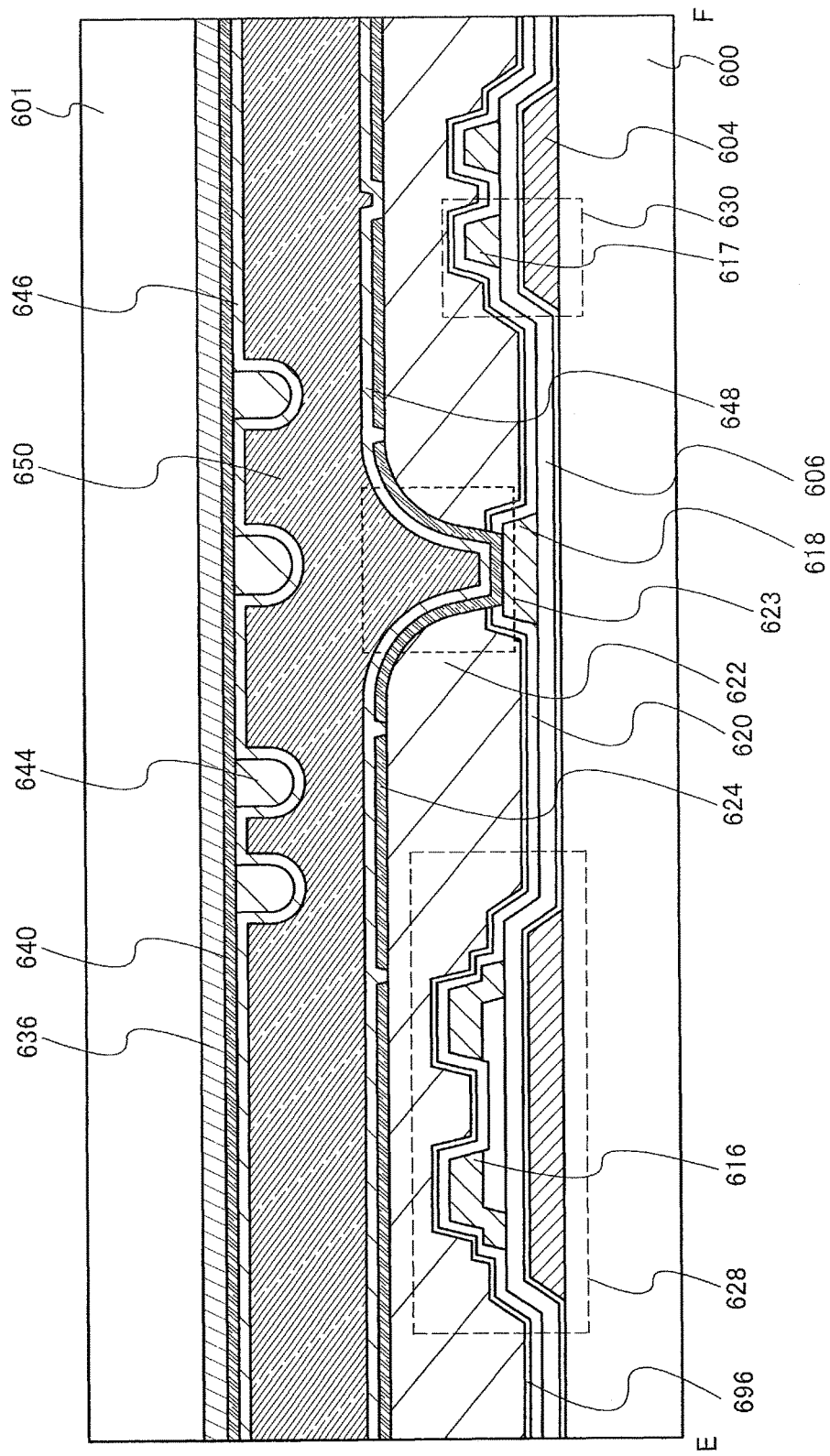
FIG. 21 illustrates a semiconductor device.
Figure 22:
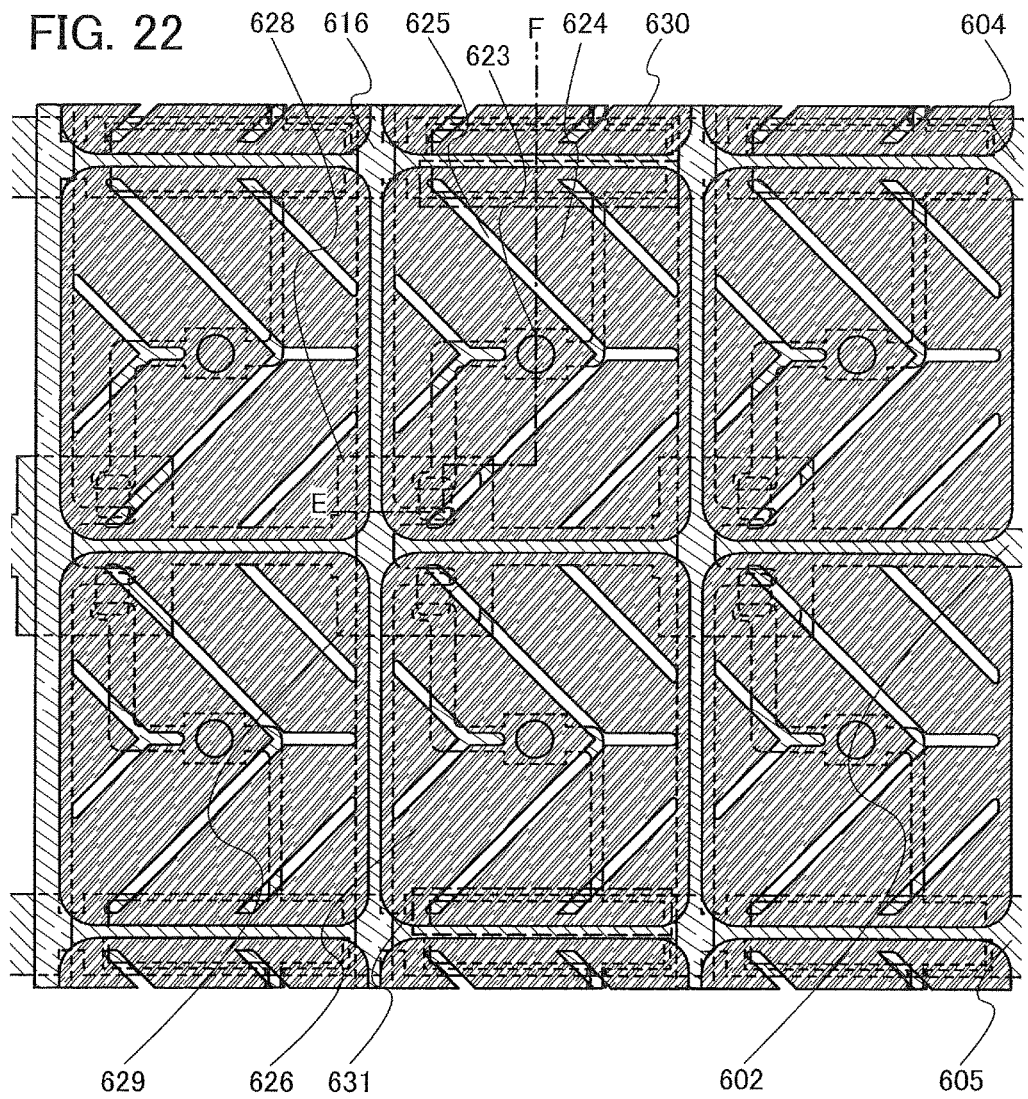
FIG. 22 illustrates a semiconductor device.
Figure 23:
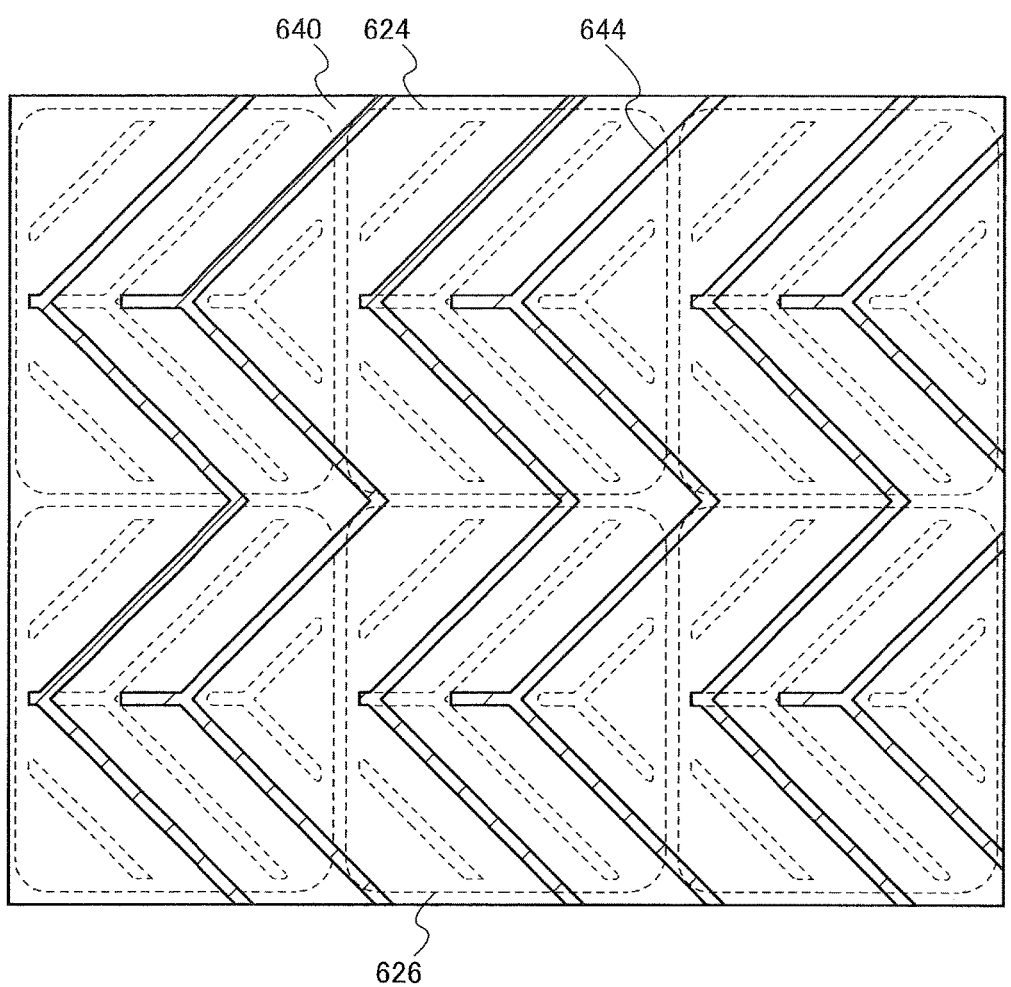
FIG. 23 illustrates a semiconductor device.

FIG. 22 and FIG. 23 illustrate a pixel electrode layer and a counter electrode layer, respectively. FIG. 22 is a plan view on a substrate side over which the pixel electrode layer is formed. A cross-sectional structure taken along line E-F of FIG. 22 is illustrated in FIG. 21. FIG. 23 is a plan view on a substrate side on which the counter electrode layer is formed. Hereinafter, description is made with reference to these drawings.

In FIG. 21, a substrate 600 over which a TFT 628, a pixel electrode layer 624 connected to the TFT 628, and a storage capacitor portion 630 are formed and a counter substrate 601 on which a counter electrode layer 640 and the like are formed overlap with each other, and liquid crystal is injected between the substrates.

A first coloring film, a second coloring film, a third coloring film (not illustrated), and the counter electrode layer 640 are provided in a position where the counter substrate 601 is provided with a spacer (not illustrated). This structure makes the height of projections 644 for controlling alignment of liquid crystal different from that of the spacer. An alignment film 648 is formed over the pixel electrode layer 624. Similarly, the counter electrode layer 640 is provided with an alignment film 646. A liquid crystal layer 650 is formed between the substrate 600 and the counter substrate 601.

Although a columnar spacer is used for the spacer here, bead spacers may be dispersed. Further, the spacer may be formed over the pixel electrode layer 624 provided over the substrate 600.

The TFT 628, the pixel electrode layer 624 connected to the TFT 628, and the storage capacitor portion 630 are formed over the substrate 600. The pixel electrode layer 624 is connected to a wiring 618 in a contact hole 623 that is formed in an insulating film 620 covering the TFT 628, a wiring 616, and the storage capacitor portion 630, an insulating film 696 covering the insulating film 620, and a third insulating film 622 covering the insulating film 696. The thin film transistor described in Embodiments 1 can be used as appropriate as the TFT 628. Further, the storage capacitor portion 630 includes a capacitor wiring 604 that is a first capacitor wiring formed at the same time as a gate wiring 602 of the TFT 628; a gate insulating film 606; and a capacitor wiring 617 that is a second capacitor wiring formed at the same time as the wirings 616 and 618.

The pixel electrode layer 624, the liquid crystal layer 650, and the counter electrode layer 640 overlap with each other, so that a liquid crystal element is formed.

FIG. 22 is a plan view of a structure over the substrate 600. The pixel electrode layer 624 is formed using a material described in Embodiment 1. Slits 625 are formed in the pixel electrode layer 624. The slits 625 are formed to control alignment of the liquid crystal.

A TFT 629, a pixel electrode layer 626 connected to the TFT 629, and a storage capacitor portion 631, which are illustrated in FIG. 22, can be formed in a similar manner to that of the TFT 628, the pixel electrode layer 624, and the storage capacitor portion 630, respectively. Both of the TFTs 628 and 629 are connected to the wiring 616. A pixel of this liquid crystal display panel includes the pixel electrode layers 624 and 626. The pixel electrode layers 624 and 626 are subpixels.

FIG. 23 illustrates a structure on the counter substrate side. The counter electrode layer 640 is preferably formed using a material similar to that of the pixel electrode layer 624. The projections 644 that controls alignment of liquid crystal are formed over the counter electrode layer 640. Note that in FIG. 23, the dashed line indicates the pixel electrode layers 624 and 626 which are formed over the substrate 600, and the counter electrode layer 640 is provided to overlap with the pixel electrode layers 624 and 626.

Figure 24:
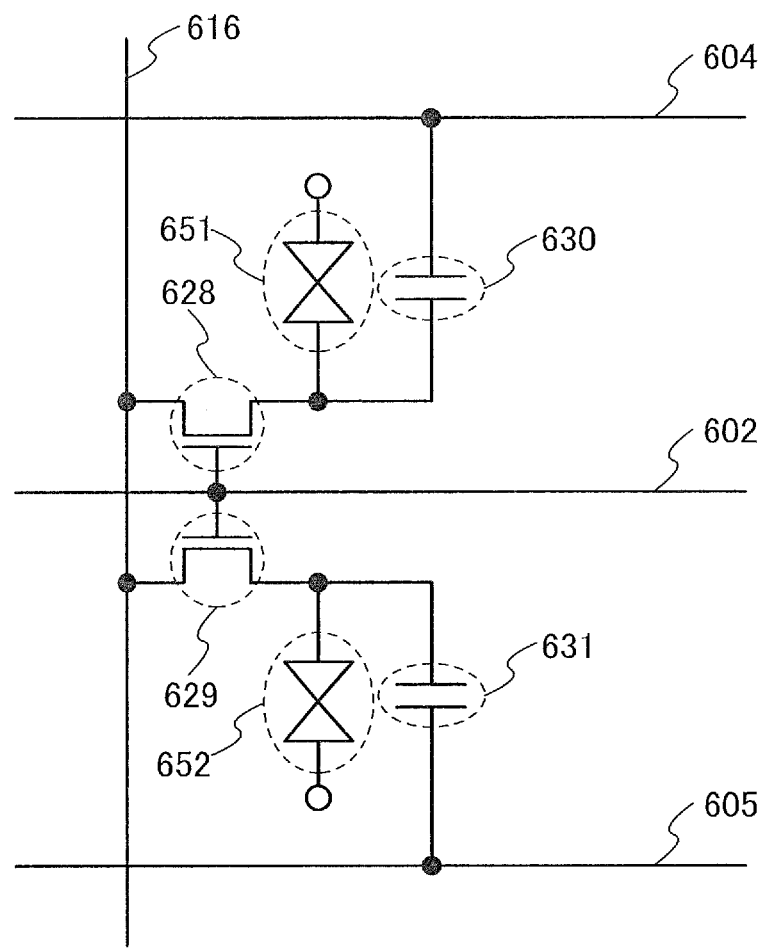
FIG. 24 shows a semiconductor device.

FIG. 24 illustrates an equivalent circuit of this pixel structure. Both of the TFTs 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. That is, potentials of the capacitor wirings 604 and 605 are controlled individually, whereby alignment of liquid crystal is precisely controlled and the viewing angle is increased.

When voltage is applied to the pixel electrode layer 624 provided with the slits 625, a distorted electric field (an oblique electric field) is generated in the vicinity of the slits 625. The slits 625 and the projections 644 on the counter substrate 601 side are disposed so as not to overlap with each other, whereby the oblique electric field is effectively generated to control alignment of the liquid crystal, and thus the direction in which liquid crystal is aligned is different depending on the location. That is, the viewing angle of a liquid crystal display panel is increased by employing multi-domain.

Next, a VA liquid crystal display device different from the above is described with reference to FIG. 25, FIG. 26, FIG. 27, and FIG. 28.

Figure 25:
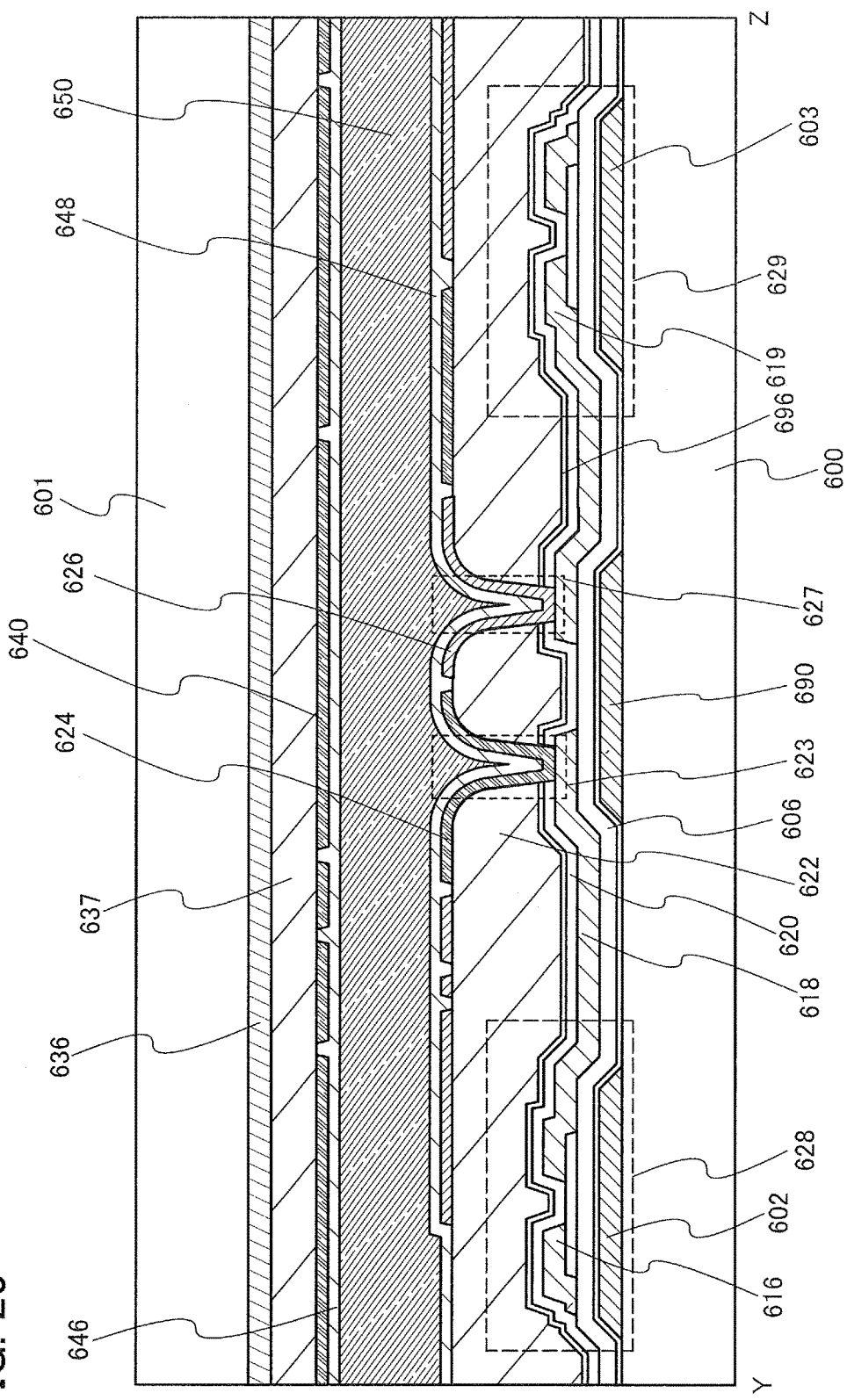
FIG. 25 illustrates a semiconductor device.
Figure 26:
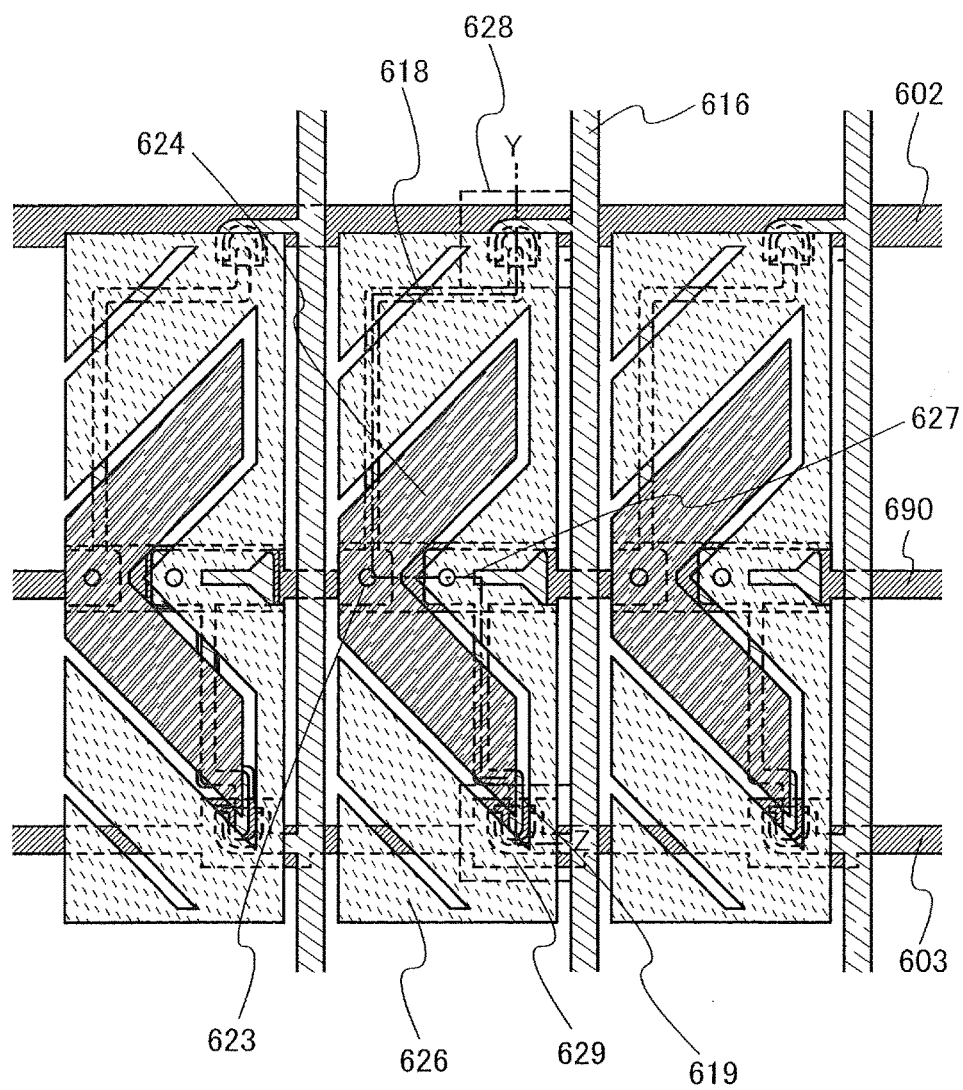
FIG. 26 illustrates a semiconductor device.

FIG. 25 and FIG. 26 illustrate a pixel structure of a VA liquid crystal display panel. FIG. 26 is a plan view over the substrate 600. A cross-sectional structure taken along line Y-Z of FIG. 26 is illustrated in FIG. 25. Description below will be given with reference to both the drawings.

In this pixel structure, one pixel has a plurality of pixel electrodes, and a TFT is connected to each of the pixel electrodes. Each TFT is driven with a gate signal different from each other. Specifically, in the pixel of multi-domain design, a signal applied to each pixel electrode is controlled independently.

The pixel electrode layer 624 is connected to the TFT 628 in the contact hole 623 which penetrates the insulating film 620, the insulating film 696, and the insulating film 622, through the wiring 618. In addition, the pixel electrode layer 626 is connected to the TFT 629 in a contact hole 627 which penetrates the insulating film 620, the insulating film 696, and the insulating film 622, through a wiring 619. The gate wiring 602 of the TFT 628 is separated from a gate wiring 603 of the TFT 629 so that different gate signals can be supplied. On the other hand, the wiring 616 functioning as a data line is shared by the TFTs 628 and 629. The thin film transistors described in Embodiment 1 can be used as appropriate as the TFTs 628 and 629. In addition, a capacitor wiring 690 is provided. Note that the gate insulating film 606 is formed over the gate wiring 602, the gate wiring 603, and the capacitor wiring 690.

Figure 28:
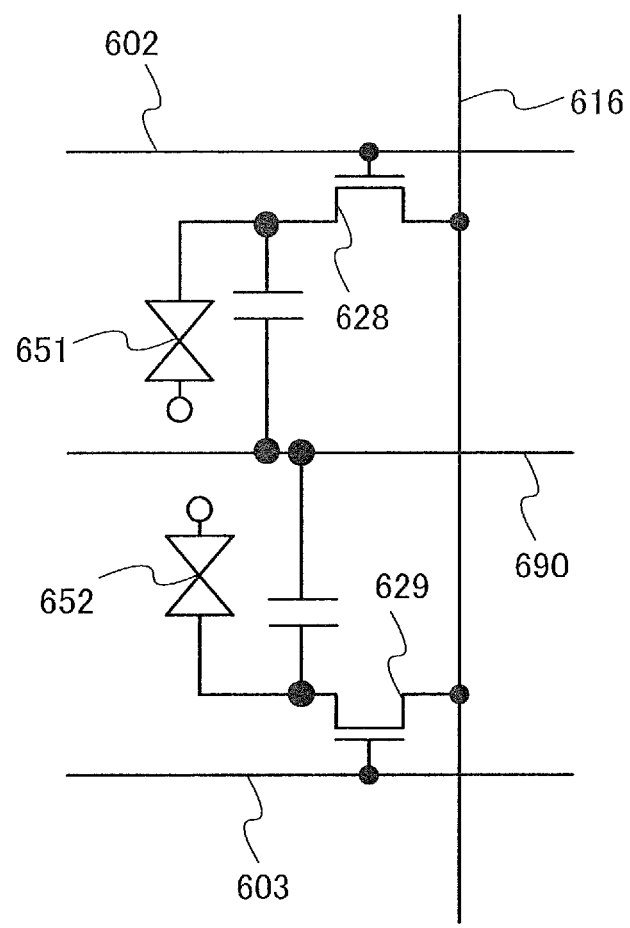
FIG. 28 shows a semiconductor device.

The shape of the pixel electrode layer 624 is different from that of the pixel electrode layer 626, and the pixel electrode layers are separated by slits 625. The pixel electrode layer 626 surrounds the pixel electrode layer 624, which has a V-shape. The TFTs 628 and 629 make the timing of applying voltage to the pixel electrode layers 624 and 626 different from each other, thereby controlling alignment of liquid crystal. FIG. 28 illustrates an equivalent circuit of this pixel structure. The TFT 628 is connected to the gate wiring 602, and the TFT 629 is connected to the gate wiring 603. Further, the TFTs 628 and 629 are both connected to the wiring 616. By supplying different gate signals to the gate wiring 602 and the gate wiring 603, operation of the liquid crystal element 651 can be different from that of the liquid crystal element 652. That is, operations of the TFTs 628 and 629 are controlled individually, whereby alignment of liquid crystal in the liquid crystal elements 651 and 652 can be precisely controlled and the viewing angle can be increased.

Figure 27:
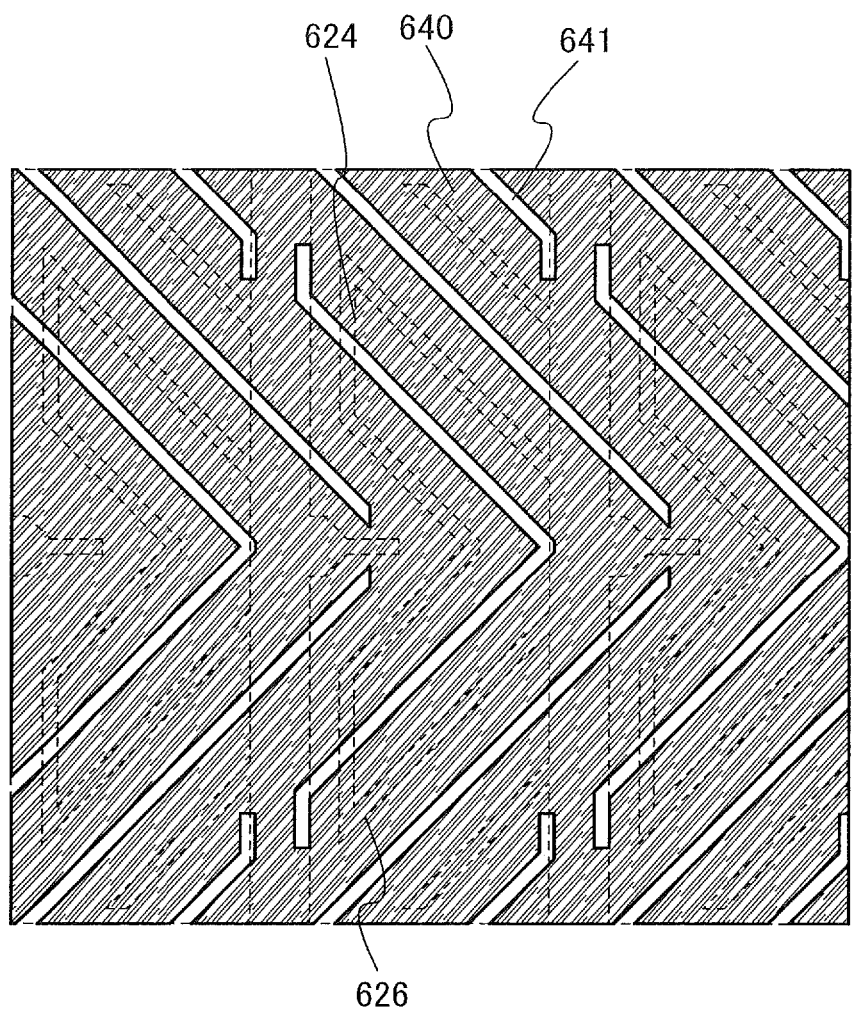
FIG. 27 illustrates a semiconductor device.

The counter substrate 601 is provided with the coloring film 636 and the counter electrode layer 640. In addition, a planarization film 637 is formed between the coloring film 636 and the counter electrode layer 640, thereby preventing alignment disorder of liquid crystal. FIG. 27 illustrates a structure of the counter substrate side. The counter electrode layer 640 is shared by plural pixels, and slits 641 are formed in the counter electrode layer 640. The slits 641 and the slits 625 on the pixel electrode layers 624 and 626 side are disposed so as not to overlap with each other, whereby an oblique electric field is effectively generated and alignment of liquid crystal is controlled. Accordingly, the direction in which liquid crystal is aligned can be different depending on the location, and thus the viewing angle is increased. Note that in FIG. 27, the dashed line indicates the pixel electrode layers 624 and 626 which are formed over the substrate 600, and the counter electrode layer 640 is provided to overlap with the pixel electrode layers 624 and 626.

The alignment film 648 is formed over the pixel electrode layers 624 and 626, and the alignment film 646 is formed on the counter electrode layer in a similar manner. The liquid crystal layer 650 is formed between the substrate 600 and the counter substrate 601. Further, the pixel electrode layer 624, the liquid crystal layer 650, and the counter electrode layer 640 overlap with each other, so that a first liquid crystal element is formed. The pixel electrode layer 626, the liquid crystal layer 650, and the counter electrode layer 640 overlap with each other, so that a second liquid crystal element is formed. Furthermore, the pixel structure of the display panel illustrated in FIG. 25, FIG. 26, FIG. 27, and FIG. 28 is a multi-domain structure in which the first liquid crystal element and the second liquid crystal element are provided in one pixel.

Next, a liquid crystal display device of a horizontal electric field mode is described. In a horizontal electric field mode, an electric field is applied in a horizontal direction with respect to liquid crystal molecules in a cell, whereby liquid crystal is driven to express gray scales. In accordance with this method, the viewing angle can be expanded to approximately 180°. Hereinafter, a liquid crystal display device of the horizontal electric field mode is described.

Figure 29:
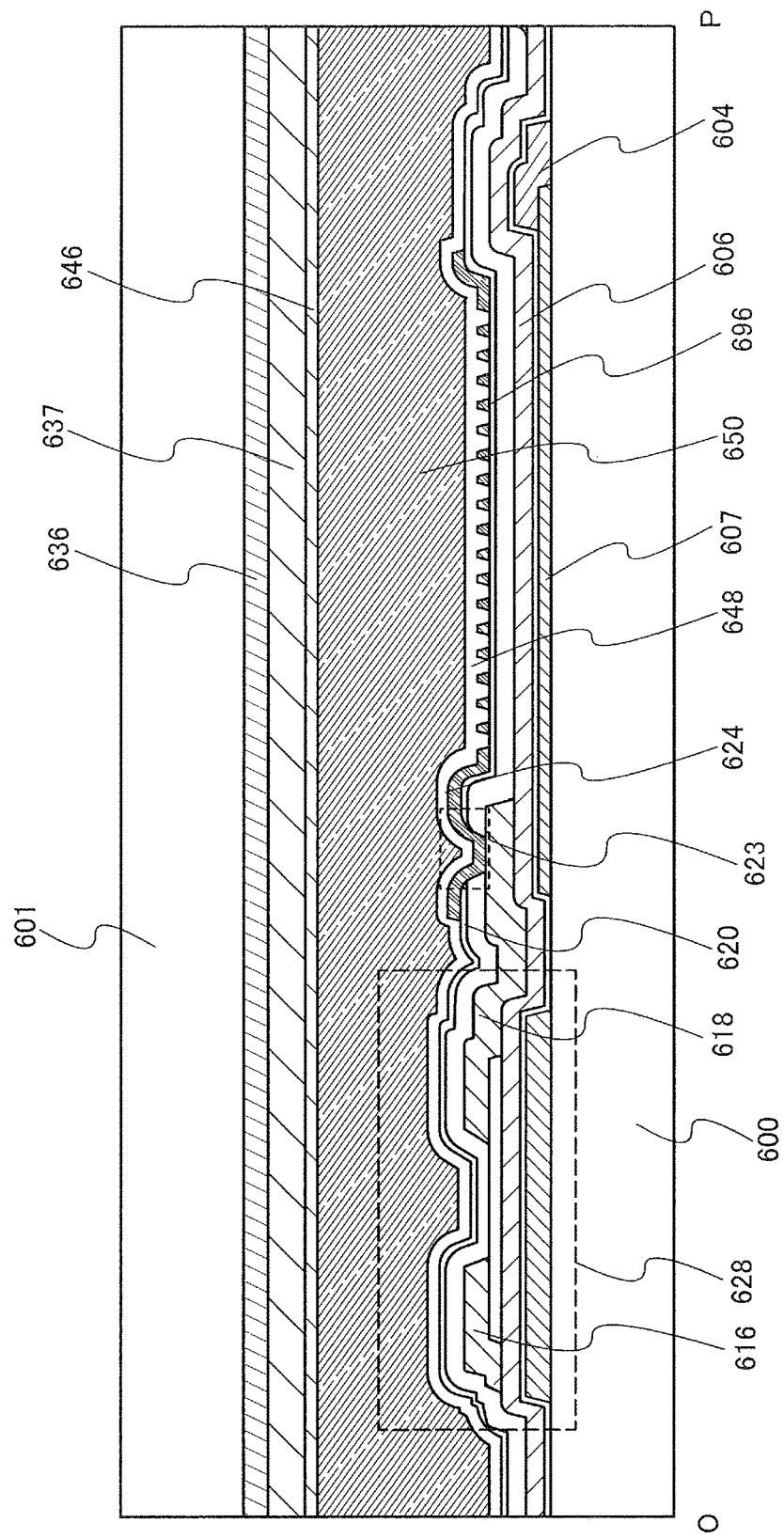
FIG. 29 illustrates a semiconductor device.

In FIG. 29, the counter substrate 601 is superposed on the substrate 600 over which the TFT 628 and the pixel electrode layer 624 connected to the TFT 628 are formed, and liquid crystal is injected therebetween. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601 with the alignment film 646 and the alignment film 648 interposed therebetween.

The pixel electrode layer 607 that is a first pixel electrode, the capacitor wiring 604 connected to the pixel electrode layer 607, and the TFT 628 described in Embodiment 1 are formed over the substrate 600. The pixel electrode layer 607 is formed in a shape which is compartmentalized roughly in a pixel shape. The gate insulating film 606 is formed over the pixel electrode layer 607 and the capacitor wiring 604.

The wirings 616 and 618 of the TFT 628 are formed over the gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624 that serves as a second pixel electrode.

The insulating film 620 is formed over the wirings 616 and 618. The insulating film 696 is formed over the insulating film 620. Over the insulating film 696, the pixel electrode layer 624 connected to the wiring 618 in the contact hole formed in the insulating films 620 and 696 is formed. The pixel electrode layer 624 is formed using a material similar to that of the pixel electrode layer 4030 described in Embodiment 5.

In this manner, the TFT 628 and the pixel electrode layer 624 connected thereto are formed over the substrate 600. A storage capacitor is formed between the pixel electrode layer 607 that is a first pixel electrode and the pixel electrode layer 624 that is a second pixel electrode.

Figure 30:
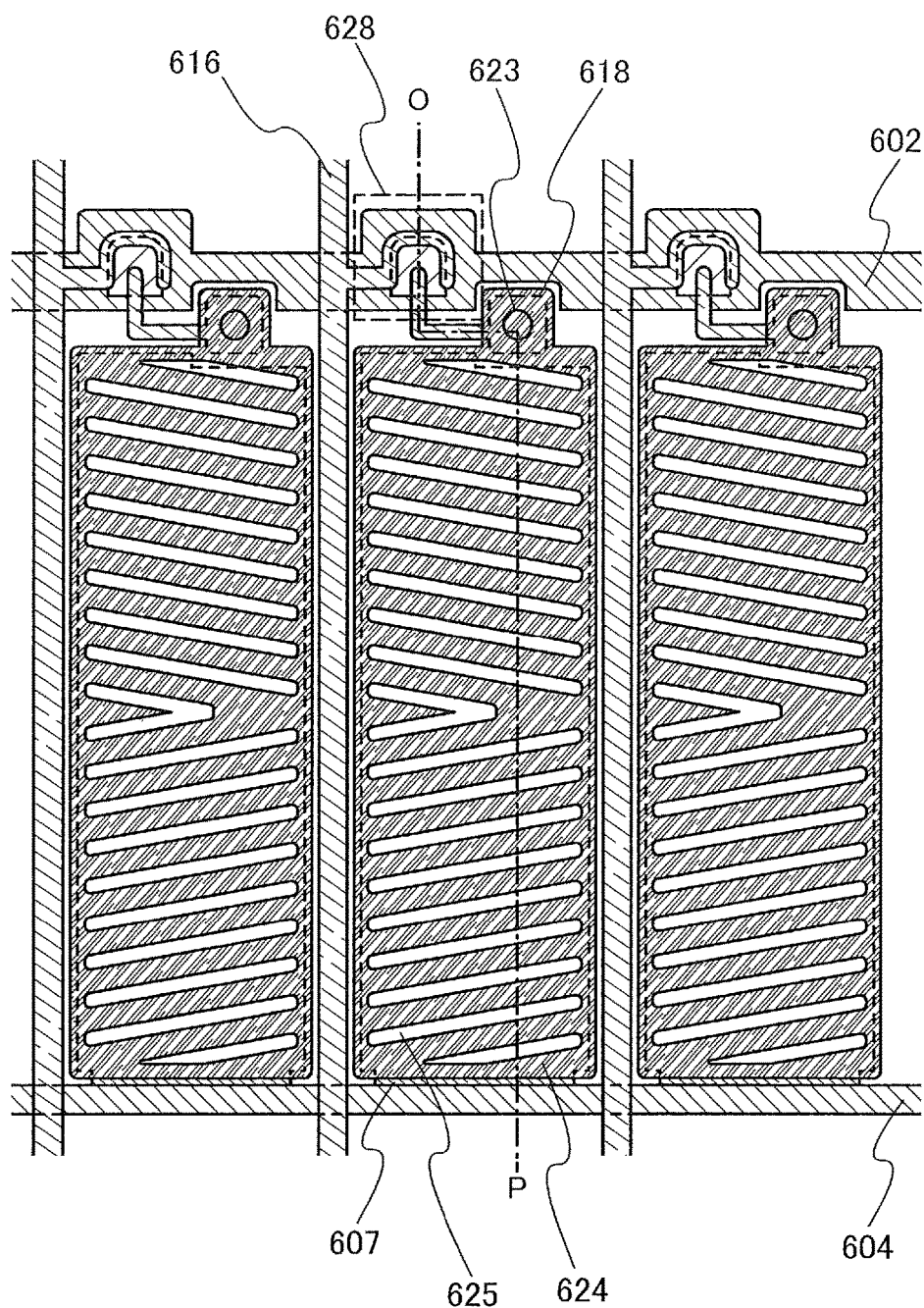
FIG. 30 illustrates a semiconductor device.

FIG. 30 is a plan view illustrating a structure of the pixel electrode. A cross-sectional structure taken along line O-P of FIG. 30 is illustrated in FIG. 29. The pixel electrode layer 624 is provided with the slits 625. The slits 625 are provided to control alignment of liquid crystal. In this case, an electric field is generated between the pixel electrode layer 607 and the pixel electrode layer 624. The gate insulating film 606 is formed between the pixel electrode layer 607 and the pixel electrode layer 624, and the gate insulating film 606 has a thickness of 50 nm to 200 nm inclusive, which is thin enough as compared to that of the liquid crystal layer having a thickness of 2 μm to 10 μm inclusive. Therefore, an electric field is generated in a direction which is substantially parallel to the substrate 600 (a horizontal direction). The alignment of the liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased. In addition, the aperture ratio can be improved because both the first pixel electrode 607 and the pixel electrode layer 624 are light-transmitting electrodes.

Next, another example of a liquid crystal display device of a horizontal electric field mode is described.

Figure 31:
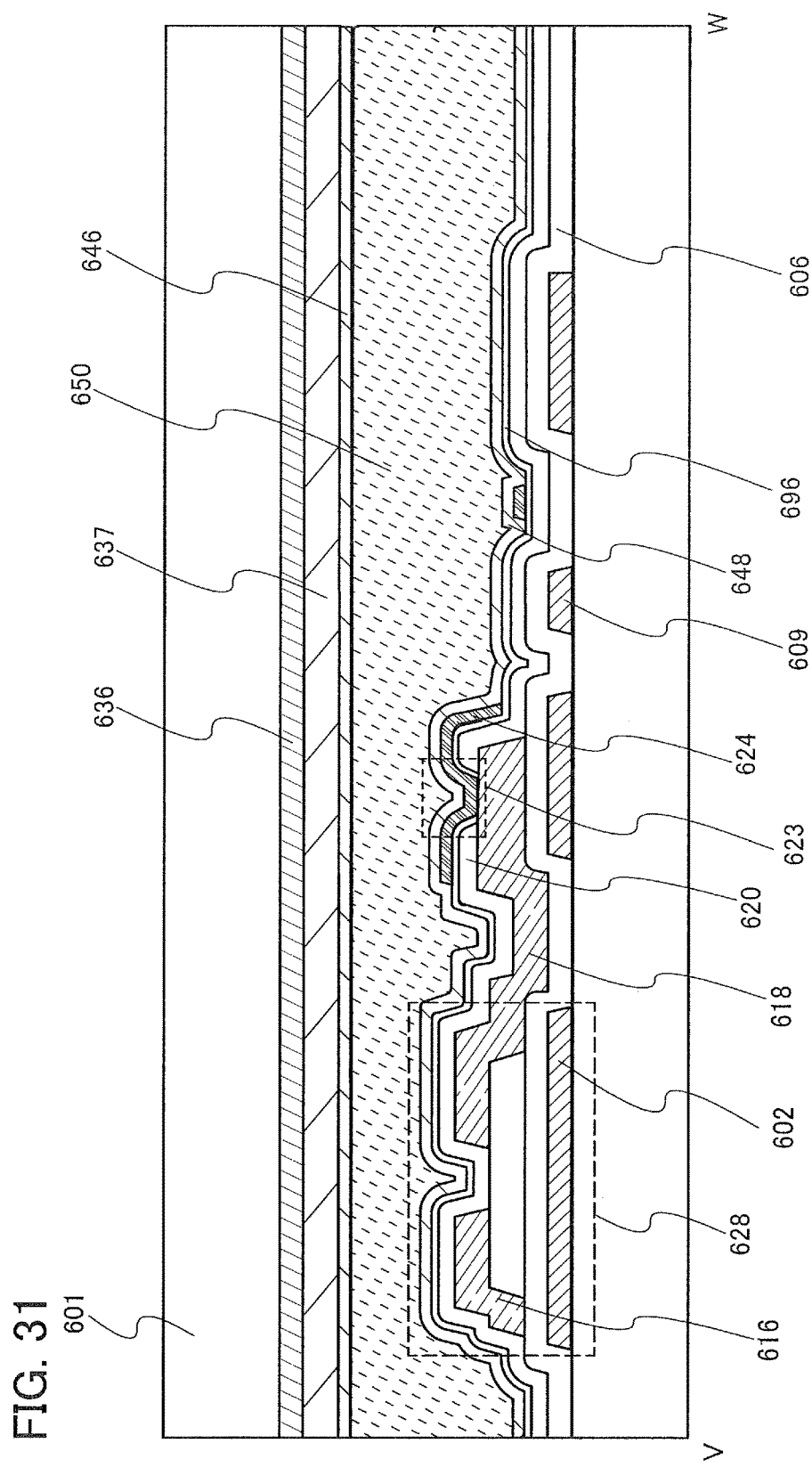
FIG. 31 illustrates a semiconductor device.
Figure 32:
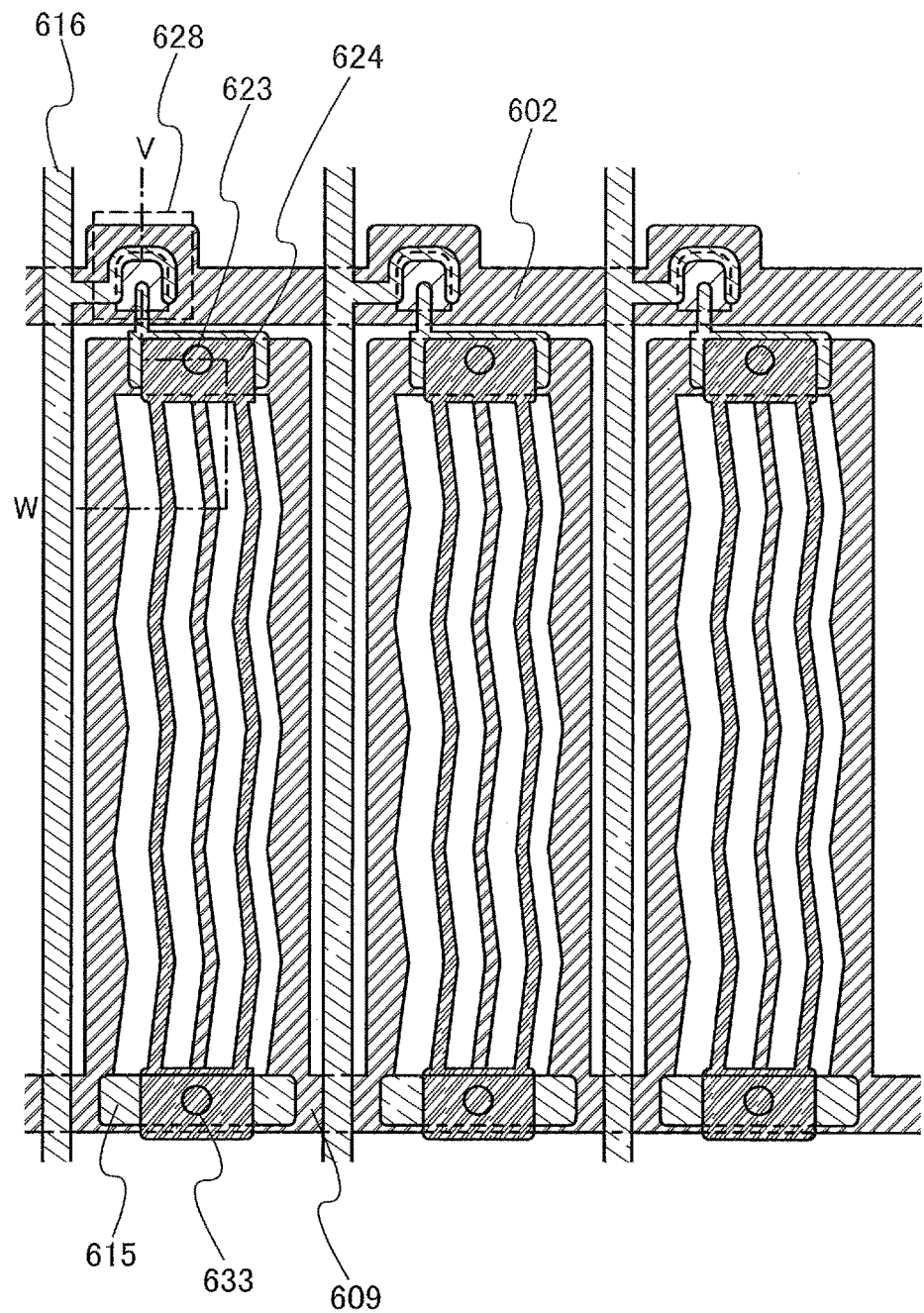
FIG. 32 illustrates a semiconductor device.

FIG. 31 and FIG. 32 illustrate a pixel structure of a liquid crystal display device of an IPS mode. FIG. 32 is a plan view, and a cross-sectional structure taken along line V-W of FIG. 32 is illustrated in FIG. 31. Description below will be given with reference to both the drawings.

In FIG. 31, the counter substrate 601 is superposed on the substrate 600 over which the TFT 628 and the pixel electrode layer 624 connected thereto are formed, and liquid crystal is injected between the substrates. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601 with the alignment films 646 and 648 interposed therebetween.

A common potential line 609 and the TFT 628 described in Embodiment 1 are formed over the substrate 600. The common potential line 609 can be formed at the same time as the gate wiring 602 of the TFT 628. The pixel electrode layer 607 that is a first pixel electrode is formed in a shape which is compartmentalized roughly in a pixel shape.

The wirings 616 and 618 of the TFT 628 are formed over a gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624 that is a second pixel electrode.

The insulating film 620 is formed over the wirings 616 and 618, and the insulating film 696 is formed over the insulating film 620. The pixel electrode layer 624 that is connected to the wiring 618 in the contact hole 623 formed in the insulating film 620 and the insulating film 696 is formed over the insulating film 696. The pixel electrode layer 624 is formed using a material similar to that of the pixel electrode layer 4030 described in Embodiment 5. As illustrated in FIG. 32, the pixel electrode layer 624 is formed so that the pixel electrode layer 624 and a comb-like electrode that is formed at the same time as the common potential line 609 can generate a horizontal electric field. Further, a comb-like portion of the pixel electrode layer 624 and the comb-like electrode that is formed at the same time as the common potential line 609 are formed so as not to overlap with each other.

When an electric field is generated between the potential applied to the pixel electrode layer 624 and that applied to the common potential line 609, the alignment of liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased.

In this manner, the TFT 628 and the pixel electrode layer 624 connected thereto are formed over the substrate 600. A storage capacitor is formed by providing the gate insulating film 606 between the common potential line 609 and a capacitor electrode 615. The capacitor electrode 615 is connected to the pixel electrode layer 624 through a contact hole 633.

Next, a mode of a liquid crystal display device in a TN mode will be described.

Figure 33:
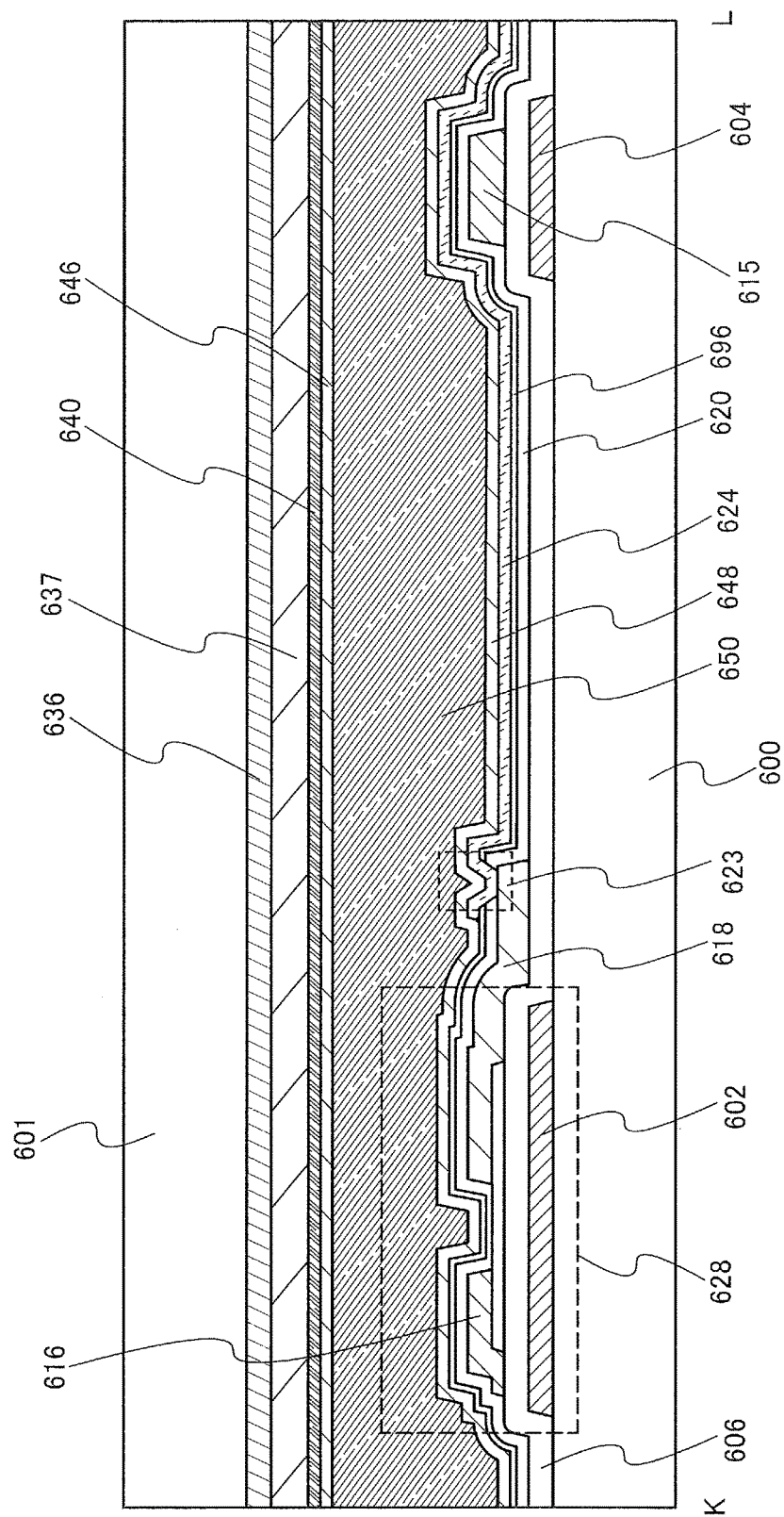
FIG. 33 illustrates a semiconductor device.
Figure 34:
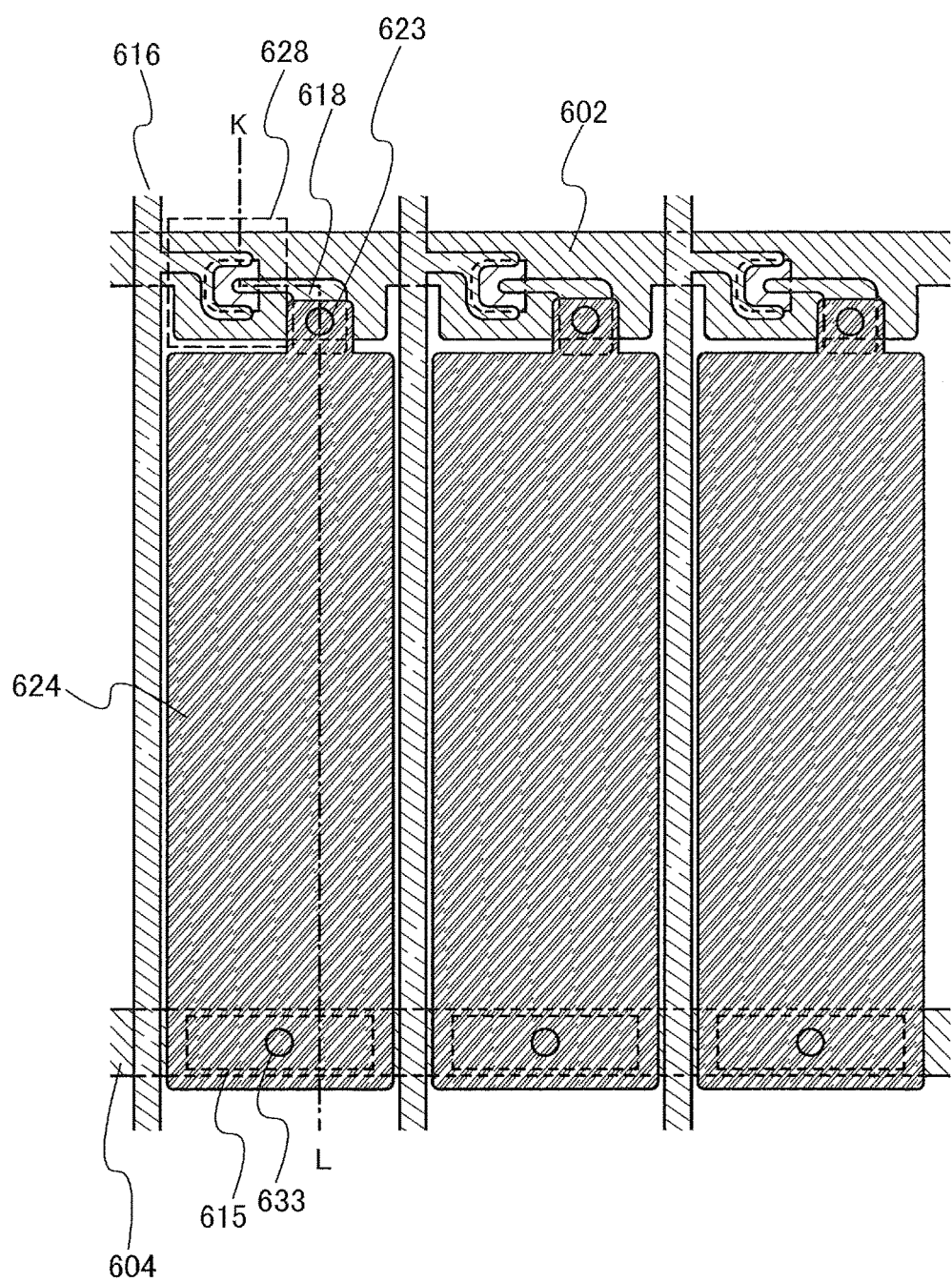
FIG. 34 illustrates a semiconductor device.

FIG. 33 and FIG. 34 illustrate a pixel structure of a liquid crystal display device in a TN mode. FIG. 34 is a plan view. A cross-sectional structure taken along line K-L of FIG. 34 is illustrated in FIG. 33. Description below will be given with reference to both the drawings.

The pixel electrode layer 624 is connected to the TFT 628 via a wiring 618 and through the contact hole 623. The wiring 616 serving as a data line is connected to the TFT 628. The TFT described in Embodiment 1 can be used as the TFT 628.

The pixel electrode layer 624 is formed using a similar material to that of the pixel electrode layer 427 described in Embodiment 1. The capacitor wiring 604 can be formed at the same time as the gate wiring 602 of the TFT 628. The gate insulating film 606 is formed over the gate wiring 602 and the capacitor wiring 604. A storage capacitor is formed from the capacitor wiring 604, a capacitor electrode 615, and the gate insulating film 606 therebetween. The capacitor electrode 615 and the pixel electrode layer 624 are connected to each other through the contact hole 623.

The counter substrate 601 is provided with the coloring film 636 and the counter electrode layer 640. The planarization film 637 is formed between the coloring film 636 and the counter electrode layer 640 to prevent alignment disorder of liquid crystal. The liquid crystal layer 650 is formed between the pixel electrode layer 624 and the counter electrode layer 640, and the alignment films 646 and 648 are provided between the liquid crystal layer 650 and the pixel electrode layer 624 and the counter electrode layer 640.

The pixel electrode layer 624, the liquid crystal layer 650, and the counter electrode layer 640 overlap with each other, whereby a liquid crystal element is formed.

Further, the substrate 600 or the counter substrate 601 may be provided with a color filter or the like. A polarizing plate is attached to a surface of the substrate 600, which is opposite to the surface provided with the thin film transistor, and a polarizing plate is attached to a surface of the counter substrate 601, which is opposite to the surface provided with the counter electrode layer 640.

Through the above process, a liquid crystal display device can be manufactured as a display device. The liquid crystal display devices in this embodiment each have a high aperture ratio.

In the case where a thin film transistor in a pixel portion of the above-described liquid crystal display device is manufactured using the manufacturing method of a thin film transistor described in any of Embodiments 1 to 3, display unevenness due to variations in the threshold voltage of thin film transistors of respective pixels can be suppressed.

Further, in the case where a thin film transistor in a driver circuit of a liquid crystal display device is manufactured using the manufacturing method of a thin film transistor described in any of Embodiments 1 to 3, the channel length can be shortened without causing minus shift of the threshold voltage, whereby high speed operation and lower power consumption of the thin film transistor in the driver circuit portion can be achieved.

Example 1

In this example, thin film transistors were manufactured using a manufacturing method of a thin film transistor described as an embodiment of the present invention, and evaluation results of the change in dependence of the threshold voltage on the channel length and the change in field effect mobility of the thin film transistors due to the second heat treatment, in which the increase and decrease in temperature are repeated, will be described.

In this example, thin film transistors having channel lengths L of 3 μm, 4 μm, 5 μm, 6 μm, 10 μm, 15 μm, 20 μm, 30 μm, 40 μm, and 50 μm were manufactured over the same substrate, and the change in dependence of the threshold voltage on the channel length and the change in field effect mobility of the thin film transistors due to the second heat treatment, in which the increase and decrease in temperature are repeated, were evaluated. First, the manufacturing method of the thin film transistors is described.

First, as a base film, a silicon oxynitride film having a thickness of 100 nm was formed by a CVD method over a glass substrate. As a gate electrode layer, a tungsten film having a thickness of 150 nm was formed by a sputtering method over the silicon oxynitride film. As a gate insulating layer, a silicon oxynitride film having a thickness of 100 nm was formed by a CVD method over the gate electrode layer.

Next, an oxide semiconductor layer having a thickness of 50 nm was formed over the gate insulating layer using an In—Ga—Zn—O-based oxide semiconductor target for film formation ($In_2O_3:Ga_2O_3:ZnO=1:1:1$) in an atmosphere containing argon and oxygen (argon:oxygen=30 sccm:15 sccm) under the following conditions: the distance between the substrate and the target was 60 mm, the pressure was 0.4 Pa, and the direct current (DC) power supply was 0.5 kW.

Next, first heat treatment was performed on the oxide semiconductor layer at 450° C. in a nitrogen atmosphere for 1 hour.

In order to form source and drain electrode layers, stacked layers of a titanium film (with a thickness of 50 nm), an aluminum film (with a thickness of 200 nm), and a titanium film (with a thickness of 50 nm) were formed over the oxide semiconductor layer by a sputtering method. Then, the electrode layers were etched to form the source and drain electrode layers. The channel lengths L of the thin film transistors were set to be 3 μm, 4 μm, 5 μm, 6 μm, 8 μm, 10 μm, 15 μm, 20 μm, 30 μm, 40 μm, and 50 μm, and the channel widths W thereof were each set to be 20 μm.

Next, a silicon oxide film having a thickness of 300 nm was formed by a sputtering method as a protective insulating layer so as to be in contact with the oxide semiconductor layer. Further, as a wiring layer, an indium oxide-tin oxide alloy (ITO) film containing silicon at 5 wt. % and having a thickness of 110 nm was formed over the protective insulating layer by a sputtering method. Then, the oxide semiconductor layer was subjected to heat treatment at 250° C. in a nitrogen atmosphere for 1 hour.

Next, second heat treatment, in which the increase and decrease in temperature are repeated, was performed in an air atmosphere. The second heat treatment step is shown in the graph of FIG. 4, where the vertical axis indicates temperature [° C.] and the horizontal axis indicates time [minute]. As shown in FIG. 4, in the second heat treatment, a cycle consisting of a temperature increasing period for 20 minutes in which the temperature is increased from 25° C. to 150° C.; a high temperature maintenance period for 40 minutes after the temperature increasing period, in which the temperature is maintained at 150° C.; a temperature decreasing period for 45 minutes after the high temperature maintenance period, in which the temperature is decreased from 150° C. to 25° C.; and a low temperature maintenance period for 15 minutes after the temperature decreasing period, in which the temperature is maintained at 25° C. is repeated ten times.

Through the above-described process, the thin film transistors having a channel width W of 20 μm and channel lengths L of 3 μm, 4 μm, 5 μm, 6 μm, 8 μm, 10 μm, 15 μm, 20 μm, 30 μm, 40 μm, and 50 μm were formed over the same substrate.

Current-voltage characteristics of each thin film transistor were measured before and after the second heat treatment; in this way, the change in dependence of the threshold voltage on the channel length and the change in field effect mobility of the thin film transistors due to the second heat treatment were evaluated.

Figure 5A:
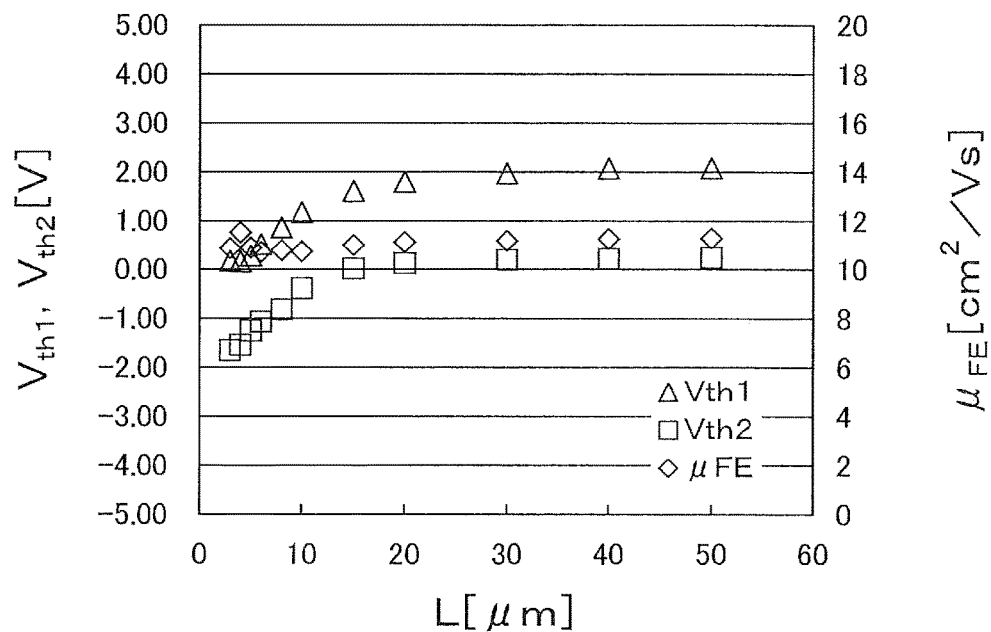
FIGS. 5A and 5B are graphs showing threshold voltage and mobility of thin film transistors in Example 1.
Figure 5B:
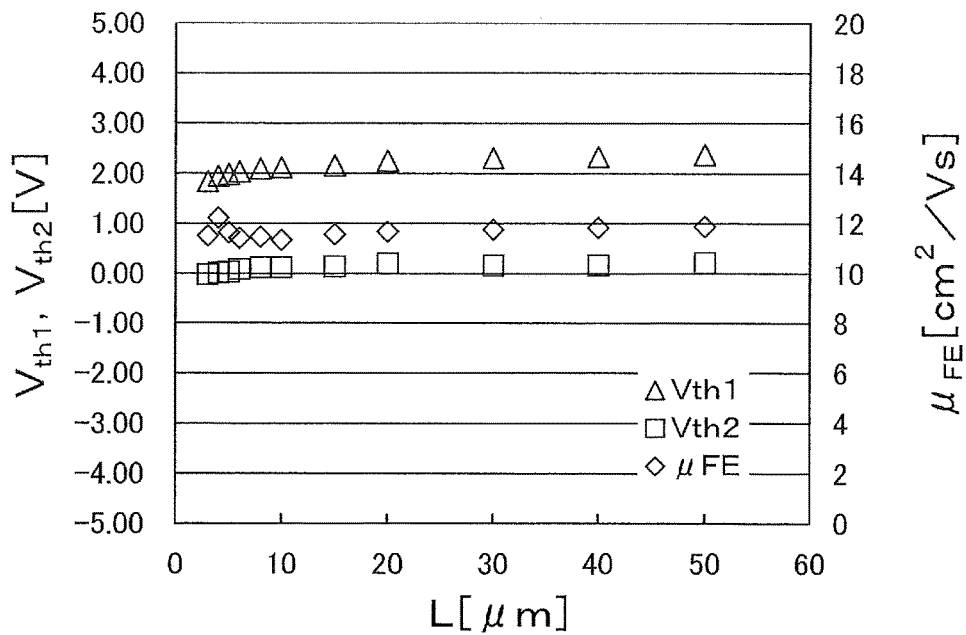

FIG. 5A shows threshold voltages and field effect mobilities of the thin film transistors before the second heat treatment, and FIG. 5B shows threshold voltages and field effect mobilities of the thin film transistors after the second heat treatment. In FIGS. 5A and 5B, the vertical axis indicates threshold voltage ($V_{th1}$ [V], $V_{th2}$ [V]) and field effect mobility ($\mu_{FE}$ [cm$^2$/Vs]), and the horizontal axis indicates channel length (L [μm]). Here, the threshold voltage $V_{th1}$ and the threshold voltage V are obtained using different evaluation methods.

The threshold voltage $V_{th1}$ is defined, in a graph where the horizontal axis and the vertical axis indicate the gate voltage (Vg [V]) and the square root of drain current ($Id^{1/2}$) respectively, as a point of intersection of the Vg axis and the extrapolated tangent line of $Id^{1/2}$ having the highest inclination. The threshold voltage V is defined, in a graph where the horizontal axis and the vertical axis indicate the gate voltage (Vg [V]) and the logarithm of drain current respectively, as a point of intersection of the extrapolated tangent line of Id having the highest inclination and the axis Id ($Id=1.0\times10^{-12}$ [A]).

In FIG. 5A, the threshold voltages $V_{th1}$ and $V_{th2}$ are decreased when the channel length L is shorter, and such a tendency is prominent when the channel length L is 20 μm or shorter. In particular, the threshold voltage $V_{th2}$ is minus when the channel length L is 10 μm or shorter. In contrast, in FIG. 5B, although the threshold voltages $V_{th1}$ and $V_{th2}$ tend to be decreased when the channel length L is decreased, the decrease amount in FIG. 5B is small as compared to that in FIG. 5A. Particularly in the region where the channel length L is 20 µm or shorter, the decrease in the threshold voltages $V_{th1}$ and $V_{th2}$ of FIG. 5B is suppressed as compared to that of FIG. 5A, and even in the case of the shortest channel length L of 3 µm, the threshold voltages $V_{th1}$ and $V_{th2}$ are higher than 0, which means the transistors have normally off characteristics.

Therefore, it is found that minus shift of the threshold voltage caused by shortening of the channel length L can be suppressed by the second heat treatment.

Further, the field effect mobility $\mu_{FE}$ is approximately 10.7 cm$^2$/Vs to 11.5 cm$^2$/Vs in FIG. 5A, while the field effect mobility $\mu_{FE}$ is increased to approximately 11.3 cm$^2$/Vs to 12.2 cm$^2$/Vs in FIG. 5B. Thus, the field effect mobility $\mu_{FE}$ is increased by the second heat treatment.

From the above, it is found that minus shift of the threshold voltage caused by shortening of the channel length L can be suppressed when a protective insulating layer is formed to cover a thin film transistor including an oxide semiconductor layer that is dehydrated or dehydrogenated by first heat treatment and second heat treatment in which the increase and decrease in temperature are repeated plural times is performed. In addition, it is also found that the field effect mobility $\mu_{FE}$ of the thin film transistor can be increased by the second heat treatment.

Example 2

In this example, thin film transistors were manufactured using a manufacturing method of a thin film transistor described as an embodiment of the present invention, and evaluation results of the change in variation of the threshold voltage of the thin film transistors over the same substrate due to the second heat treatment, in which the increase and decrease in temperature are repeated, will be described.

In this example, a plurality of thin film transistors having a channel length L of 3 µm and a channel width of 20 µm was formed over the same substrate, and the change in variation of the threshold voltage of the thin film transistors over the same substrate due to the second heat treatment, in which the increase and decrease in temperature are repeated, was evaluated. Example 1 can be referred to for the manufacturing method of the thin film transistors.

In a manner similar to that of Example 1, current-voltage characteristics of each thin film transistor were measured before and after the second heat treatment; in this way, variation of the threshold voltage of the thin film transistors over the same substrate due to the second heat treatment was evaluated.

Figure 6A:
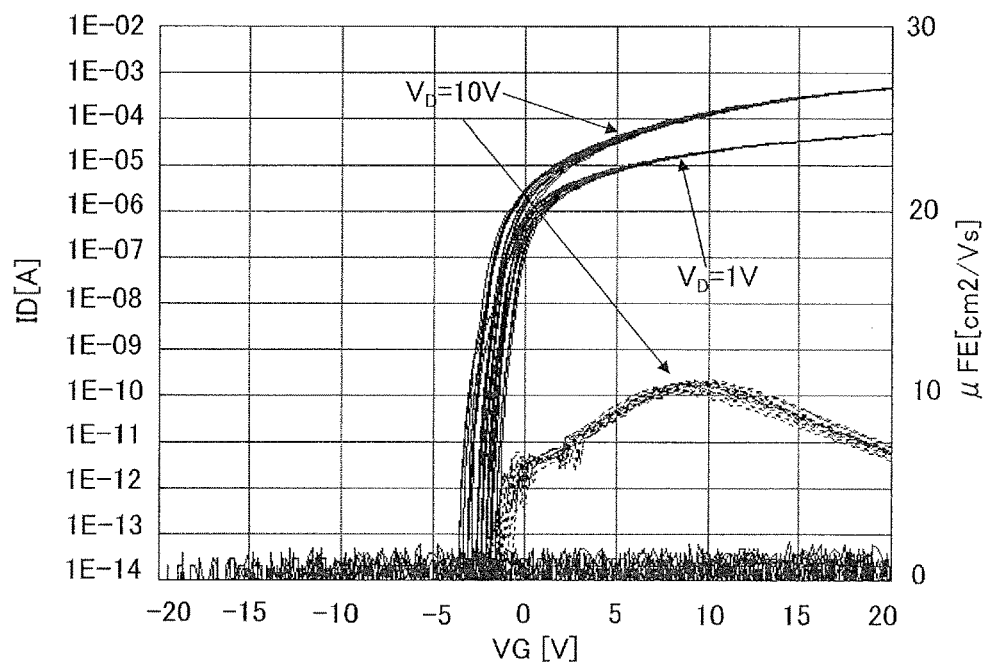
FIGS. 6A and 6B are graphs showing current-voltage characteristics of thin film transistors of Example 2.
Figure 6B:
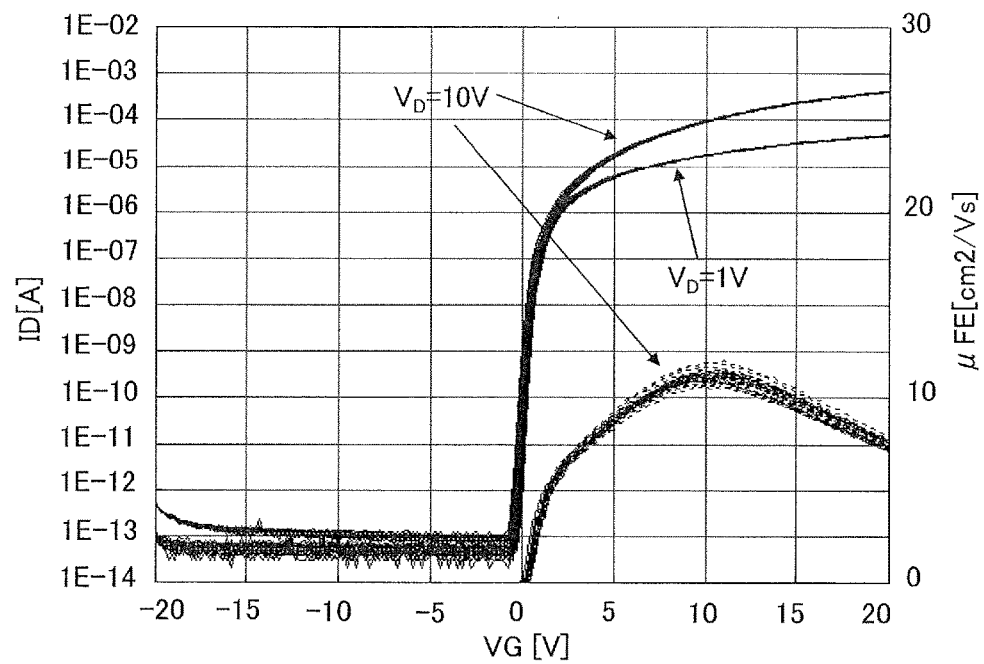

FIG. 6A shows current-voltage characteristics and field effect mobilities of the thin film transistors before the second heat treatment, and FIG. 6B shows current-voltage characteristics and field effect mobilities of the thin film transistors after the second heat treatment. In FIGS. 6A and 6B, the vertical axis indicates drain current ($I_D$ [A]) and field effect mobility ($\mu_{FE}$ [cm$^2$/Vs]), and the horizontal axis indicates gate voltage ($V_G$ [V]). Here, drain current $I_D$ measured when the drain voltage $V_D$ is 1V and 10 V and field effect mobility $\mu_{FE}$ measured when the drain voltage $V_D$ is 10 V are shown in FIGS. 6A and 6B.

In FIG. 6A, as for the thin film transistors before the second heat treatment, the threshold voltage is lower than 0 V regardless of whether the drain voltage $V_D$ is 1 V or 10 V and the threshold voltage varies over one substrate. In contrast, in FIG. 6B, the threshold voltage of the thin film transistors over one substrate is almost the same as 0 V regardless of the value of the drain voltage. Therefore, it was confirmed that variation in the threshold voltage of the thin film transistors over one substrate is suppressed by the second heat treatment.

In addition, from the comparison of field effect mobility $\mu_{FE}$ between FIG. 6A and FIG. 6B, it can be noticed that the field effect mobility $\mu_{FE}$ is increased by the second heat treatment, in a manner similar to that of Example 1.

From the above, it is found that variation in the threshold voltage of thin film transistors over one substrate can be suppressed and the threshold voltage can be a positive gate voltage near 0 V, when a protective insulating layer is formed to cover a thin film transistor including an oxide semiconductor layer that is dehydrated or dehydrogenated by first heat treatment and second heat treatment in which the increase and decrease in temperature are repeated plural times is performed. In addition, it is also found that the field effect mobility $\mu_{FE}$ of the thin film transistor can be increased by the second heat treatment.

Example 3

In this example, thin film transistors are manufactured through second heat treatment using a method different from that of Example 1, and evaluation results of the change in dependence of the threshold voltage on the channel length and the change in field effect mobility of the thin film transistors will be described.

As the second heat treatment of Example 1, the heat treatment at a temperature that is lower than that of the first heat treatment, in which the increase and decrease in temperature are repeated ten times, was performed. Meanwhile, in this example, as the second heat treatment, heat treatment was performed continuously for a time longer than that of the first heat treatment keeping a temperature that is lower than that of the first heat treatment. Since this example is similar to Example 1 except the second heat treatment, Example 1 can be referred to for the process before the second heat treatment.

As the second heat treatment, heat treatment was performed continuously for a time longer than that of the first heat treatment keeping a temperature that is lower than that of the first heat treatment. Specifically, as the second heat treatment, a temperature increasing period for 35 minutes in which the temperature is increased from 25° C. to 150° C., a high temperature maintenance period for 565 minutes in which the temperature is maintained at 150° C., and a temperature decreasing period for 45 minutes in which the temperature is decreased from 150° C. to 25° C. were performed.

Through the above-described process, the thin film transistors having a channel width W of 20 µm and channel lengths L of 3 µm, 4 µm, 5 µm, 6 µm, 8 µm, 10 µm, 15 µm, 20 µm, 30 µm, 40 µm, and 50 µm were formed over the same substrate.

In a manner similar to that of Example 1, current-voltage characteristics of each thin film transistor were measured before and after the second heat treatment; in this way, the change in dependence of the threshold voltage on the channel length and the change in field effect mobility of the thin film transistors due to the second heat treatment were evaluated.

Figure 37A:
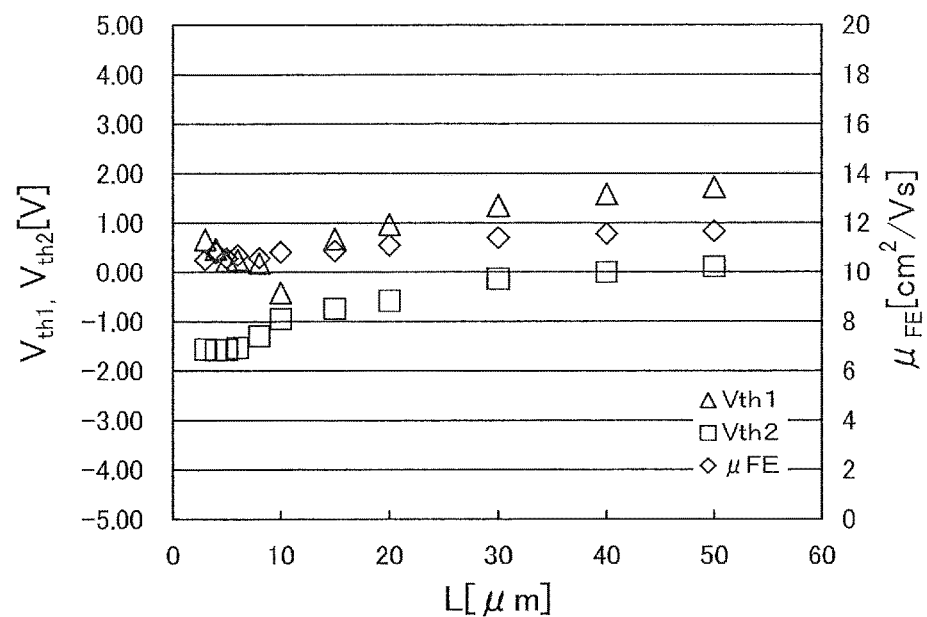
FIGS. 37A and 37B are each a graph showing threshold voltage and mobility of thin film transistors of Example 3.
Figure 37B:
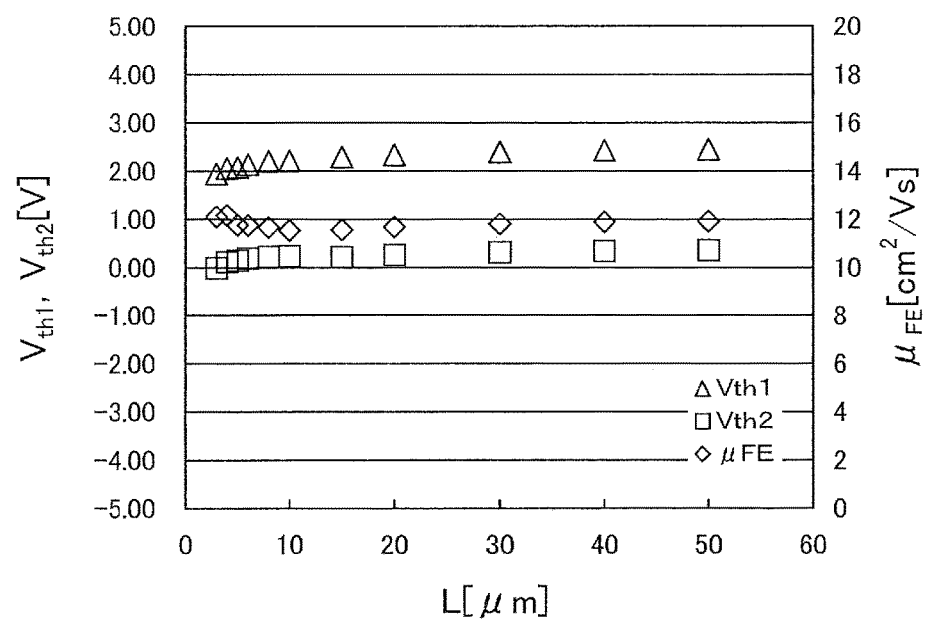

FIG. 37A shows threshold voltages and field effect mobilities of the thin film transistors before the second heat treatment, and FIG. 37B shows threshold voltages and field effect mobilities of the thin film transistors after the second heat treatment. In FIGS. 37A and 37B, the vertical axis indicates threshold voltage ($V_{th1}$ [V], V [V]) and field effect mobility ($\mu_{FE}$ [cm$^2$/Vs]), and the horizontal axis indicates channel length (L [μm]). Here, definitions of the threshold voltage $V_{th1}$ and the threshold voltage $V_{th2}$ are similar to those in Example 1.

In FIG. 37A, in a manner similar to that of Example 1, the threshold voltages $V_{th1}$ and $V_{th2}$ are decreased in accordance with the shortening of the channel length L. In contrast, in FIG. 37B, the tendency to decrease the threshold voltages $V_{th1}$ and $V_{th2}$ in accordance with the shortening of the channel length is reduced. Particularly in the region where the channel length L is 20 μm or shorter, the decrease in the threshold voltages $V_{th1}$ and $V_{th2}$ is suppressed as compared to that of FIG. 37A, and even in the case of the shortest channel length L of 3 μm, the threshold voltages $V_{th1}$ and $V_{th2}$ are higher than 0, which means the transistors have normally off characteristics.

Therefore, it is found that minus shift of the threshold voltage caused by shortening of the channel length L can be suppressed by the second heat treatment in which heat treatment is continuously performed for a time longer than that of the first heat treatment keeping a temperature that is lower than that of the first heat treatment, in a similar manner to Example 1.

In addition, from the comparison between FIG. 37A and FIG. 37B, it can be noticed that the field effect mobility $\mu_{FE}$ is increased by the second heat treatment.

From the above, it is found that minus shift of the threshold voltage caused by shortening of the channel length L can be suppressed when a protective insulating layer is formed to cover a thin film transistor including an oxide semiconductor layer that is dehydrated or dehydrogenated by first heat treatment and second heat treatment in which heat treatment is continuously performed for a time longer than that of the first heat treatment keeping a temperature that is lower than that of the first heat treatment is performed. In addition, it is also found that the field effect mobility $\mu_{FE}$ of the thin film transistor can be increased by the second heat treatment.

This application is based on Japanese Patent Application serial no. 2009-205328 filed with Japan Patent Office on Sep. 4, 2009 and Japanese Patent Application serial no. 2009-206490 filed with Japan Patent Office on Sep. 7, 2009, the entire contents of which are hereby incorporated by reference.

The invention claimed is:

1. A manufacturing method of a semiconductor device comprising the steps of:
    forming a first electrode layer over a substrate having an insulating surface;
    forming a first insulating layer over the first electrode layer;
    forming an oxide semiconductor layer over the first insulating layer;
    dehydrating or dehydrogenating the oxide semiconductor layer;
    forming a second electrode layer and a third electrode layer over the oxide semiconductor layer;
    forming a second insulating layer over the oxide semiconductor layer;
    forming a third insulating layer over the second insulating layer;
    forming a fourth insulating layer over the third insulating layer;
    forming a fourth electrode layer over the second insulating layer; and
    performing a heat treatment after forming the second insulating layer,
    wherein the second insulating layer contains silicon, oxygen and nitrogen,
    wherein the third insulating layer contains aluminum and oxygen,
    wherein the fourth insulating layer contains silicon and nitrogen,
    wherein a treatment temperature of the heat treatment is lower than a treatment temperature of the dehydrating or the dehydrogenating,
    wherein the dehydrating or the dehydrogenating is performed in a nitrogen atmosphere, and
    wherein the heat treatment is performed in an oxygen atmosphere.

2. The manufacturing method of a semiconductor device according to claim 1,
    wherein the heat treatment is performed after forming the fourth insulating layer.

3. The manufacturing method of a semiconductor device according to claim 1,
    wherein a temperature of the dehydrating or the dehydrogenating is higher than or equal to 350° C. and lower than or equal to 750° C.

4. The manufacturing method of a semiconductor device according to claim 1,
    wherein a temperature of the heat treatment is higher than or equal to 100° C. and lower than or equal to 300° C.

5. The manufacturing method of a semiconductor device according to claim 1,
    wherein the second insulating layer is a protective insulating layer.

6. A manufacturing method of a semiconductor device comprising the steps of:
    forming a first gate electrode layer over a substrate having an insulating surface;
    forming a first insulating layer over the first gate electrode layer;
    forming an oxide semiconductor layer over the first insulating layer;
    dehydrating or dehydrogenating the oxide semiconductor layer;
    forming a source electrode layer and a drain electrode layer over the oxide semiconductor layer;
    forming a second insulating layer over the oxide semiconductor layer;
    forming a third insulating layer over the second insulating layer;
    forming a fourth insulating layer over the third insulating layer;
    forming a second gate electrode layer over the second insulating layer; and
    performing a heat treatment, after forming the second insulating layer,
    wherein the second insulating layer contains silicon, oxygen and nitrogen,
    wherein the third insulating layer contains aluminum and oxygen,
    wherein the fourth insulating layer contains silicon and nitrogen, and
    wherein a thickness of the oxide semiconductor layer is greater than or equal to 5 nm and less than or equal to 200 nm,
    wherein a treatment temperature of the heat treatment is lower than a treatment temperature of the dehydrating or the dehydrogenating, wherein the dehydrating or the dehydrogenating is performed in a nitrogen atmosphere, and wherein the heat treatment is performed in an oxygen atmosphere.

7. The manufacturing method of a semiconductor device according to claim 6, wherein the heat treatment is performed after forming the fourth insulating layer.

8. The manufacturing method of a semiconductor device according to claim 6, wherein a temperature of the step of dehydrating or dehydrogenating the oxide semiconductor layer is higher than or equal to 350° C. and lower than or equal to 750° C.

9. The manufacturing method of a semiconductor device according to claim 6, wherein a temperature of the heat treatment is higher than or equal to 100° C. and lower than or equal to 300° C.

10. The manufacturing method of a semiconductor device according to claim 6, wherein the second insulating layer is a protective insulating layer.

11. A manufacturing method of a semiconductor device comprising the steps of:

forming a first gate electrode layer over a substrate having an insulating surface;

forming a first insulating layer over the first gate electrode layer;

forming an oxide semiconductor layer over the first insulating layer;

dehydrating or dehydrogenating the oxide semiconductor layer;

forming a source electrode layer and a drain electrode layer over the oxide semiconductor layer;

forming a second insulating layer over the oxide semiconductor layer;

forming a third insulating layer over the second insulating layer;

forming a fourth insulating layer over the third insulating layer;

forming a second gate electrode layer over the second insulating layer; and performing a heat treatment, after forming the second insulating layer, wherein the second insulating layer contains silicon, oxygen and nitrogen, wherein the third insulating layer contains aluminum and oxygen, wherein the fourth insulating layer contains silicon and nitrogen, wherein a thickness of the oxide semiconductor layer is greater than or equal to 5 nm and less than or equal to 200 nm, wherein a treatment temperature of the heat treatment is lower than a treatment temperature of the dehydrating or the dehydrogenating, wherein the oxide semiconductor layer contains indium, gallium and zinc, wherein the first insulating layer is a stacked-layer structure of a first layer containing silicon and nitrogen and a second layer containing silicon and oxygen, wherein the dehydrating or the dehydrogenating is performed in a nitrogen atmosphere, and wherein the heat treatment is performed in an oxygen atmosphere.

12. The manufacturing method of a semiconductor device according to claim 11, wherein the heat treatment is performed after forming the fourth insulating layer.

13. The manufacturing method of a semiconductor device according to claim 11, wherein a temperature of the dehydrating or the dehydrogenating the oxide semiconductor layer is higher than or equal to 350° C. and lower than or equal to 750° C.

14. The manufacturing method of a semiconductor device according to claim 11, wherein a temperature of the heat treatment is higher than or equal to 100° C. and lower than or equal to 300° C.

15. The manufacturing method of a semiconductor device according to claim 11, wherein the second insulating layer is a protective insulating layer.

* * * * *